US012548947B2

(12) United States Patent
Bdeir et al.

(10) Patent No.: US 12,548,947 B2
(45) Date of Patent: Feb. 10, 2026

(54) MODULAR ELECTRONIC BUILDING SYSTEMS AND METHODS OF USING THE SAME

(71) Applicant: SPHERO, INC., Boulder, CO (US)

(72) Inventors: Aya Bdeir, New York, NY (US);
Geoffrey Lipman, Brooklyn, NY (US);
Jordi Borras, Brooklyn, NY (US);
Antonio Hernandez, New York, NY (US);
Paul Rothman, Brooklyn, NY (US)

(73) Assignee: SPHERO, INC., Greenville, TX (US)

( * ) Notice: Subject to any disclaimer, the term of this patent is extended or adjusted under 35 U.S.C. 154(b) by 0 days.

(21) Appl. No.: 18/487,714

(22) Filed: Oct. 16, 2023

(65) Prior Publication Data

US 2024/0305041 A1    Sep. 12, 2024

Related U.S. Application Data

(63) Continuation of application No. 16/223,567, filed on Dec. 18, 2018, now Pat. No. 11,791,589.
(Continued)

(51) Int. Cl.
*H01R 13/62* (2006.01)
*A63H 33/04* (2006.01)
(Continued)

(52) U.S. Cl.
CPC ....... *H01R 13/6205* (2013.01); *A63H 33/042* (2013.01); *A63H 33/046* (2013.01);
(Continued)

(58) Field of Classification Search
CPC .. H01R 13/6205; H01R 11/30; H01R 12/718; H01R 12/724; H01R 12/714;
(Continued)

(56) References Cited

U.S. PATENT DOCUMENTS 4,616,893 A    10/1986  Feldman
5,183,405 A    2/1993   Elicker et al.
(Continued)

OTHER PUBLICATIONS

International Search Report and Written Opinion received for PCT Patent Application No. PCT/US2018/066186, mailed on Mar. 5, 2019, 15 pages.

*Primary Examiner* — Edwin A. Leon
(74) *Attorney, Agent, or Firm* — Faegre Drinker Biddle & Reath LLP

(57) ABSTRACT

In some embodiments, an apparatus includes a first connector including a first housing portion having top and bottom surfaces and a second connector including a second housing portion having top and bottom surfaces. The second housing portion has a form factor substantially corresponding to a form factor of the first housing portion. A circuit board having top and bottom surfaces is permanently coupled to the first housing portion and to the second housing portion such that a first portion of the bottom surface of the circuit board contacts at least a portion of the top surface of the first housing portion and a second portion of the bottom surface of the circuit board contacts at least a portion of the top surface of the second housing portion. A contact assembly is coupled to the first housing portion and electrically and directly engages a portion of the bottom surface of the circuit board.

18 Claims, 58 Drawing Sheets

Related U.S. Application Data

(60) Provisional application No. 62/733,306, filed on Sep. 19, 2018, provisional application No. 62/607,145, filed on Dec. 18, 2017.

(51) Int. Cl.
  *A63H 33/08* (2006.01)
  *H01R 11/30* (2006.01)
  *H01R 12/71* (2011.01)
  *H01R 12/72* (2011.01)
  *H01R 13/24* (2006.01)

(52) U.S. Cl.
  CPC ............. *A63H 33/08* (2013.01); *H01R 11/30* (2013.01); *H01R 12/718* (2013.01); *H01R 12/724* (2013.01); *H01R 12/714* (2013.01); *H01R 13/2442* (2013.01)

(58) Field of Classification Search
  CPC .............. H01R 13/2442; A63H 33/042; A63H 33/046; A63H 33/08
  See application file for complete search history.

(56) References Cited

U.S. PATENT DOCUMENTS

| | | |
|---|---|---|
| 5,199,884 A | 4/1993 | Kaufman et al. |
| 8,206,159 B2 | 6/2012 | Naito et al. |
| 9,019,718 B2 | 4/2015 | Bdeir |
| 9,419,378 B2 * | 8/2016 | Bdeir ................... H01R 11/30 |
| 9,597,607 B2 * | 3/2017 | Bdeir ................... H05K 1/0213 |
| 11,791,589 B2 | 10/2023 | Bdeir et al. |
| 2013/0273752 A1 | 10/2013 | Rudisill et al. |
| 2013/0343025 A1 | 12/2013 | Bdeir |
| 2016/0192492 A1 | 6/2016 | Huang et al. |
| 2016/0249478 A1 | 8/2016 | Wang et al. |
| 2017/0036132 A1 | 2/2017 | Yang et al. |
| 2017/0196086 A1 | 7/2017 | Bdeir |
| 2017/0291116 A1 | 10/2017 | Macdonald et al. |
| 2019/0190193 A1 | 6/2019 | Bdeir et al. |
| 2019/0190196 A1 | 6/2019 | Bdeir et al. |
| 2019/0289716 A1 | 9/2019 | Bdeir |
| 2020/0296167 A1 | 9/2020 | Bdeir et al. |

\* cited by examiner

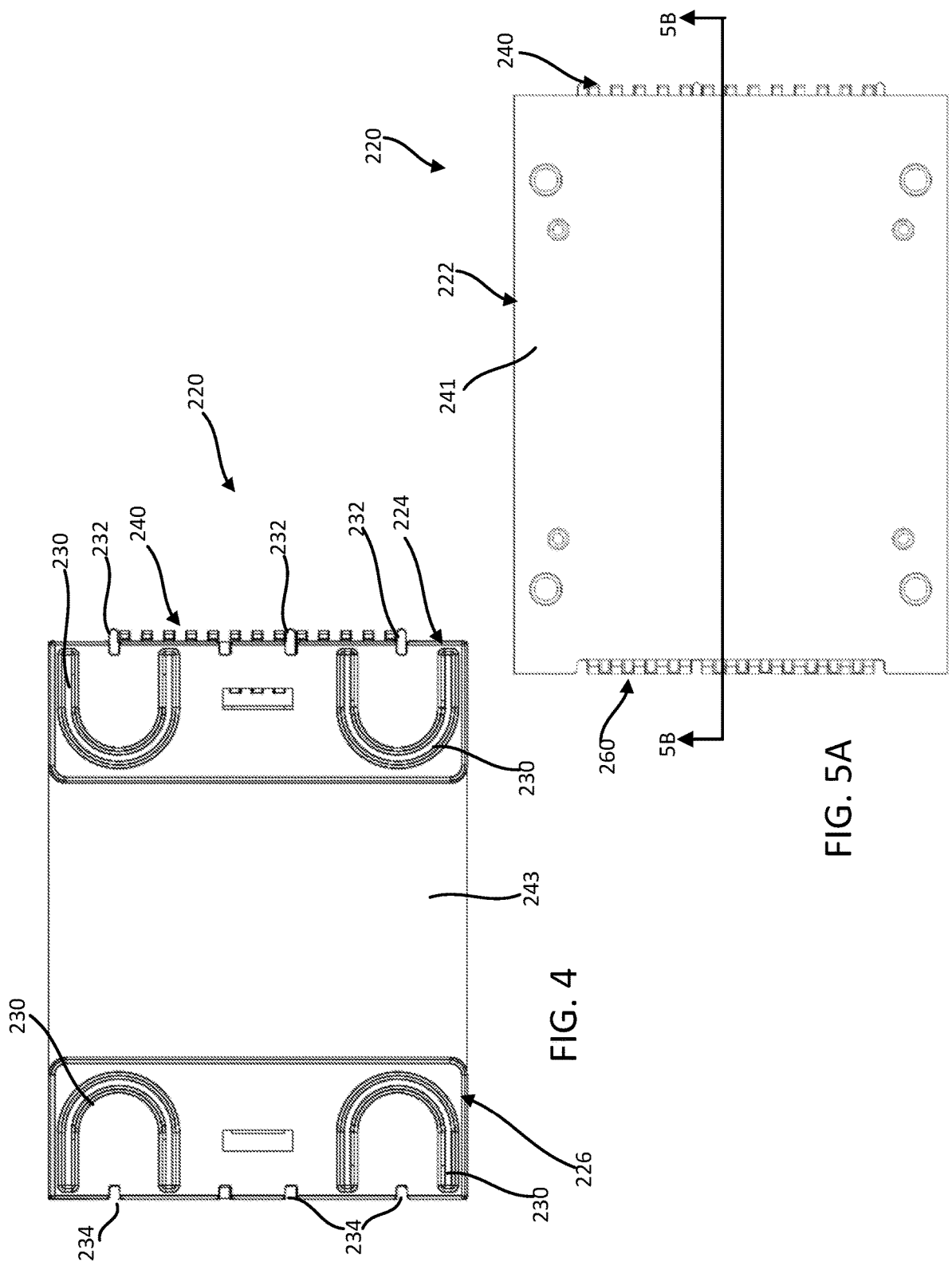

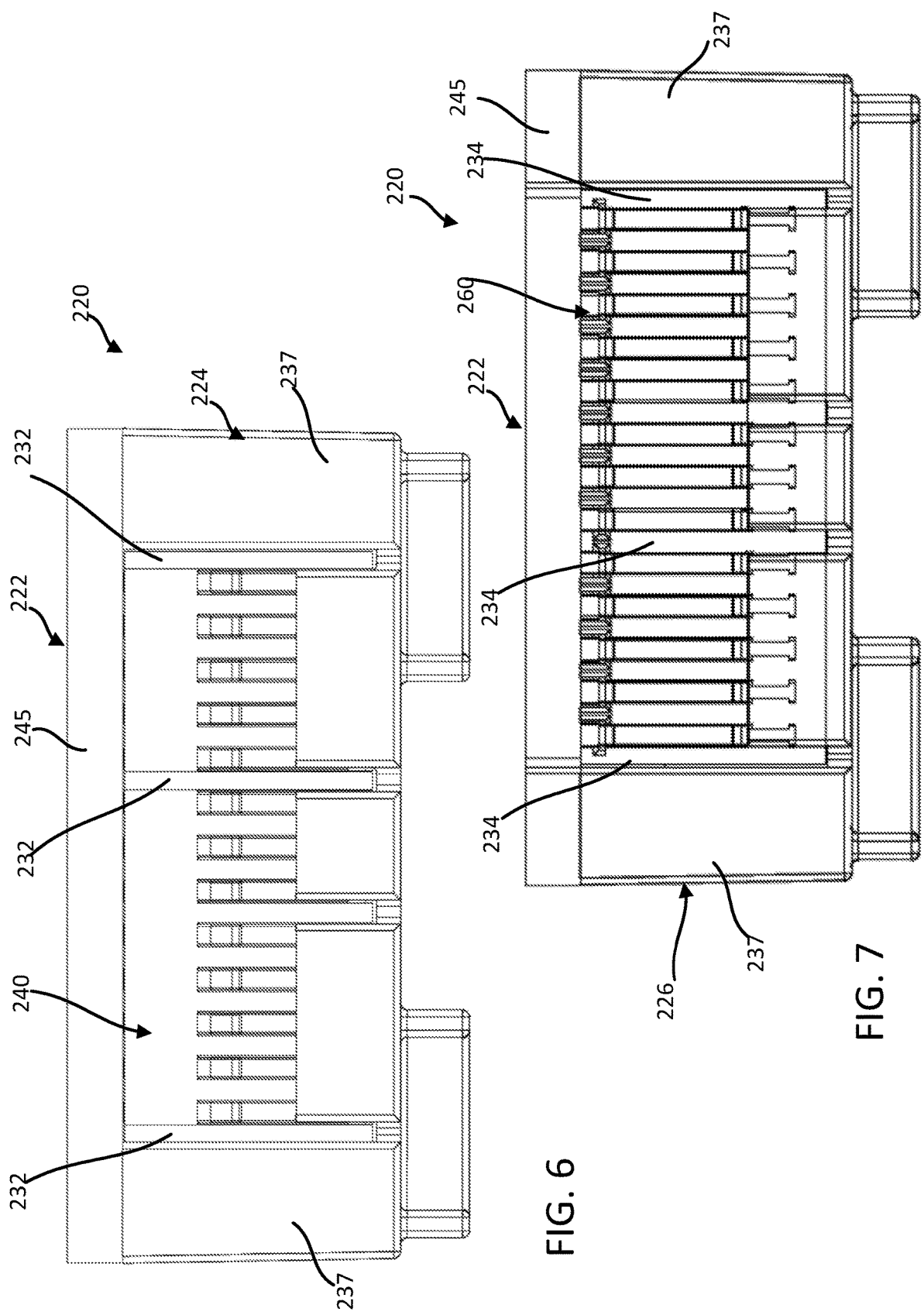

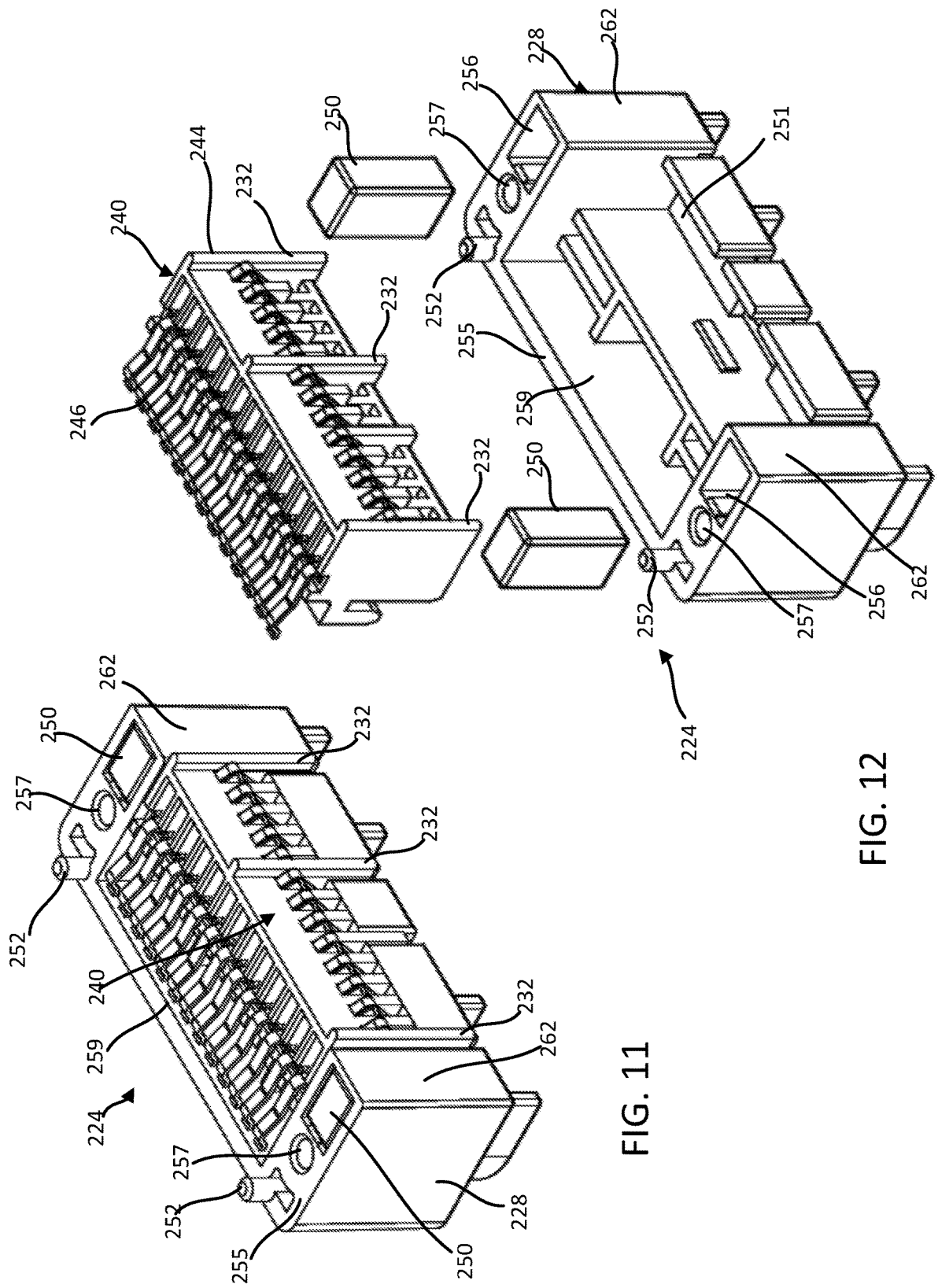

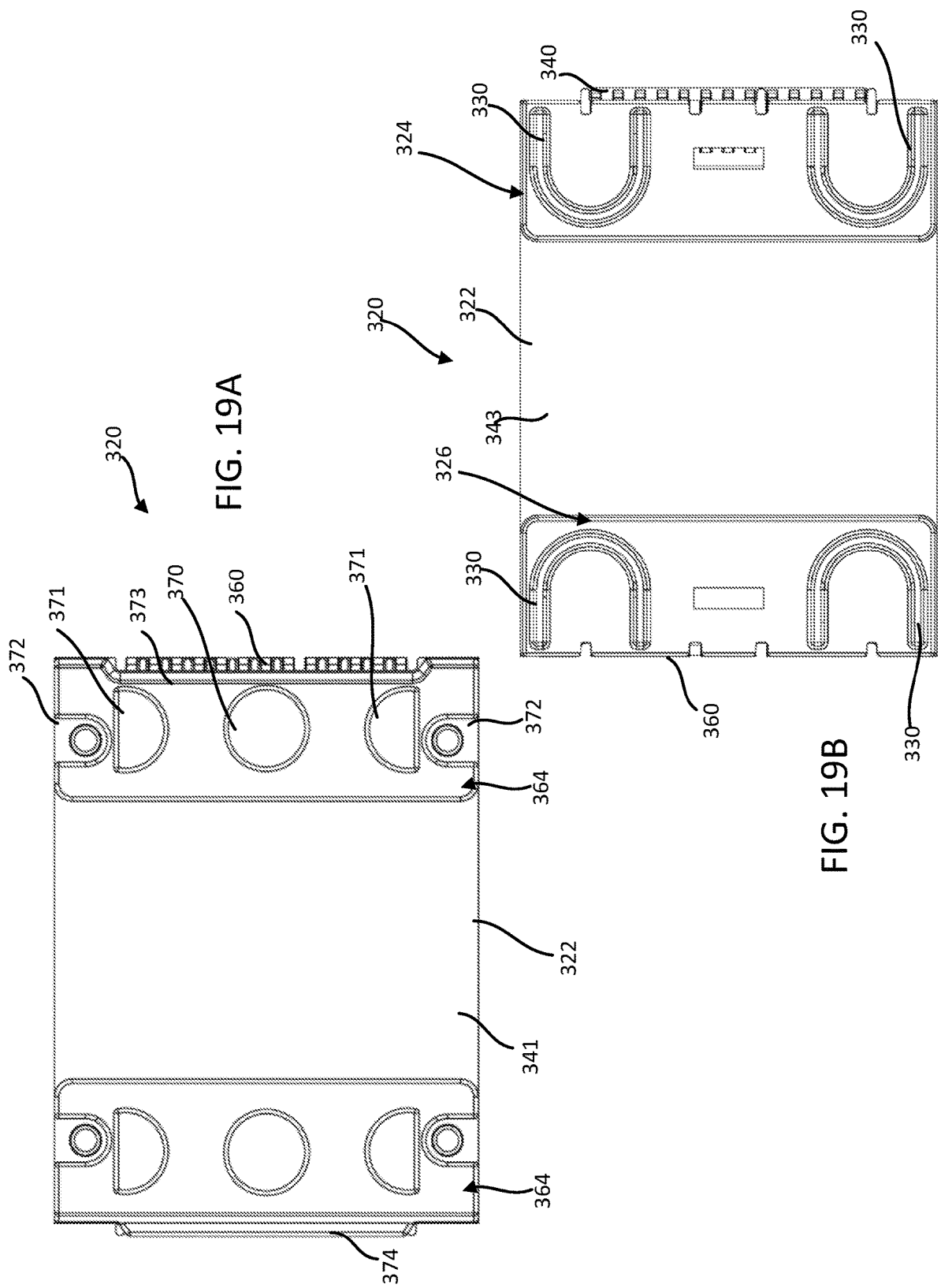

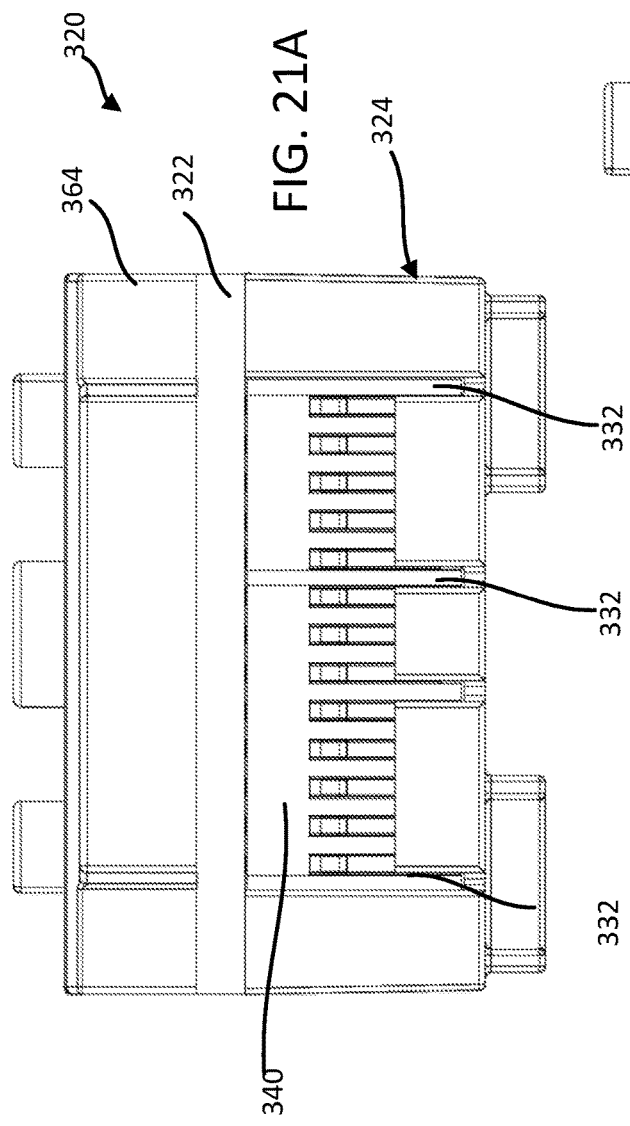
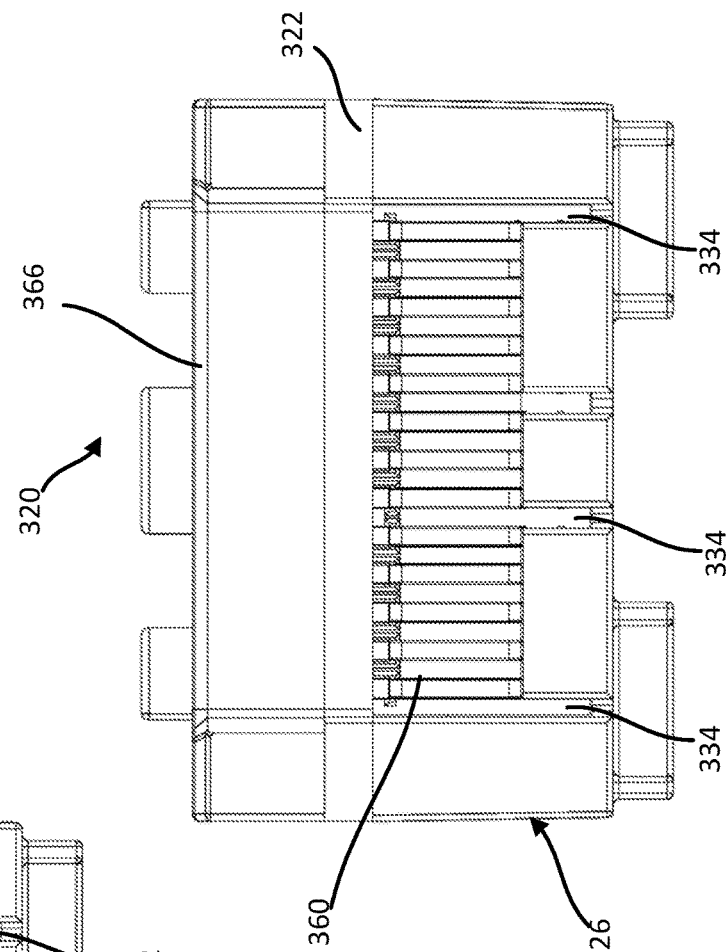
FIG. 21A
FIG. 21B

FIG. 27
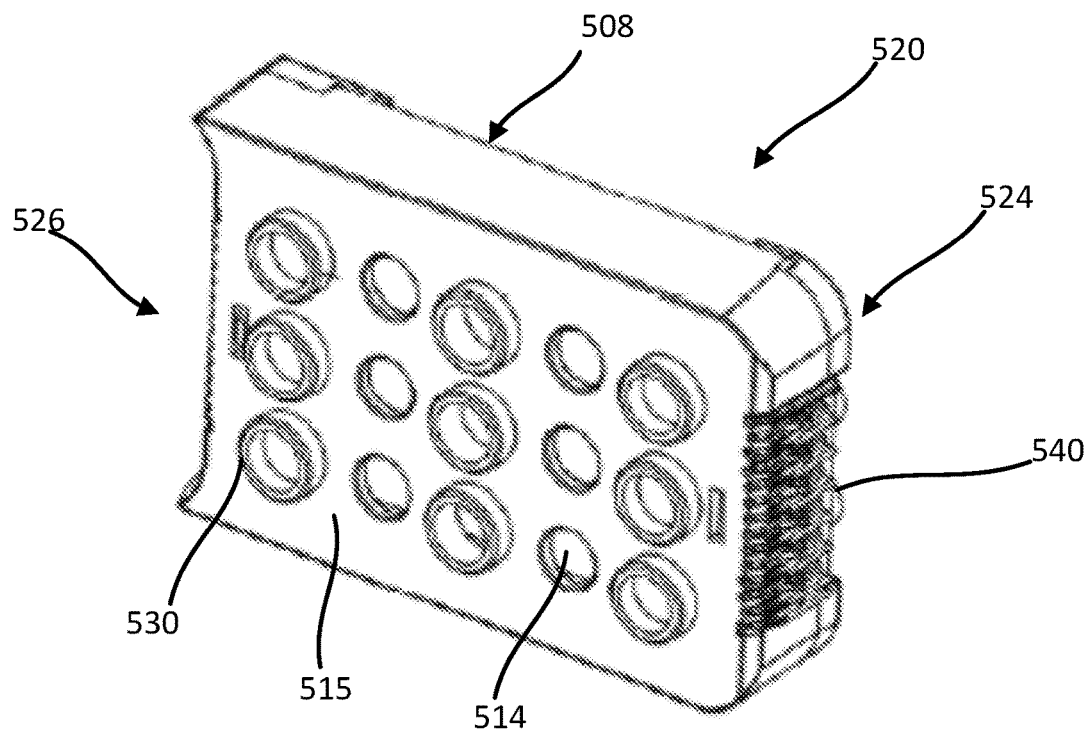
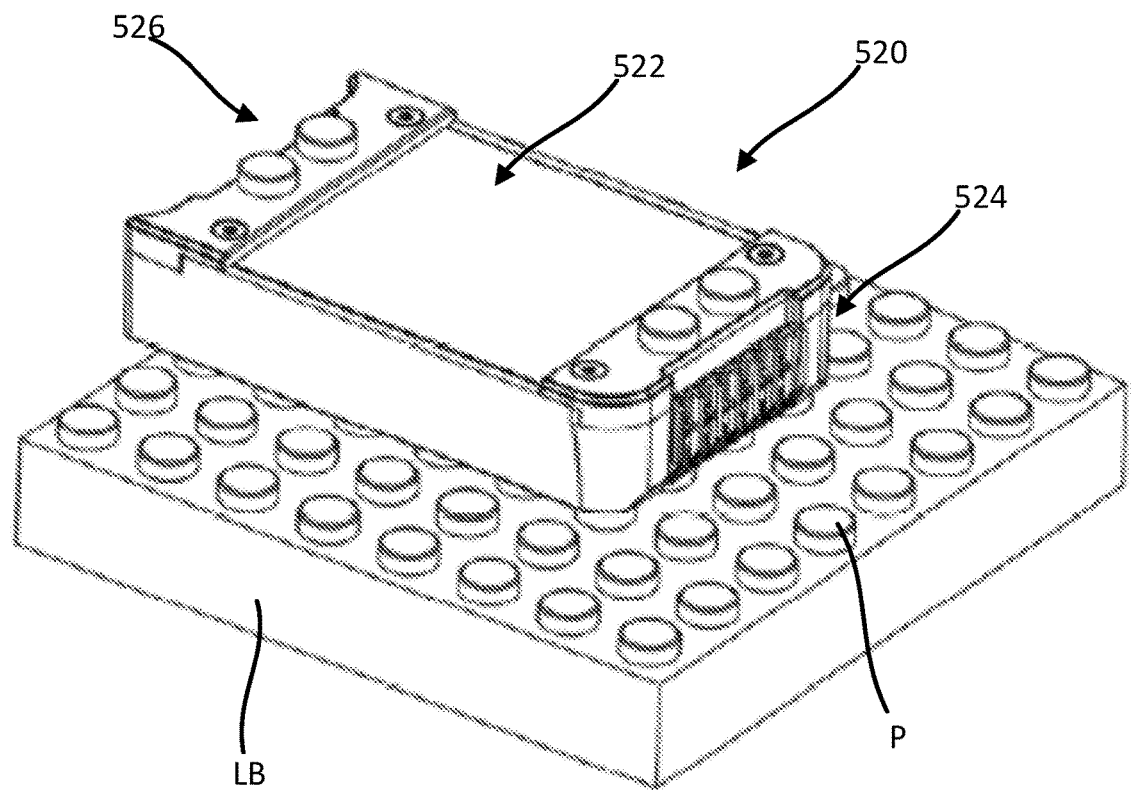
FIG. 28

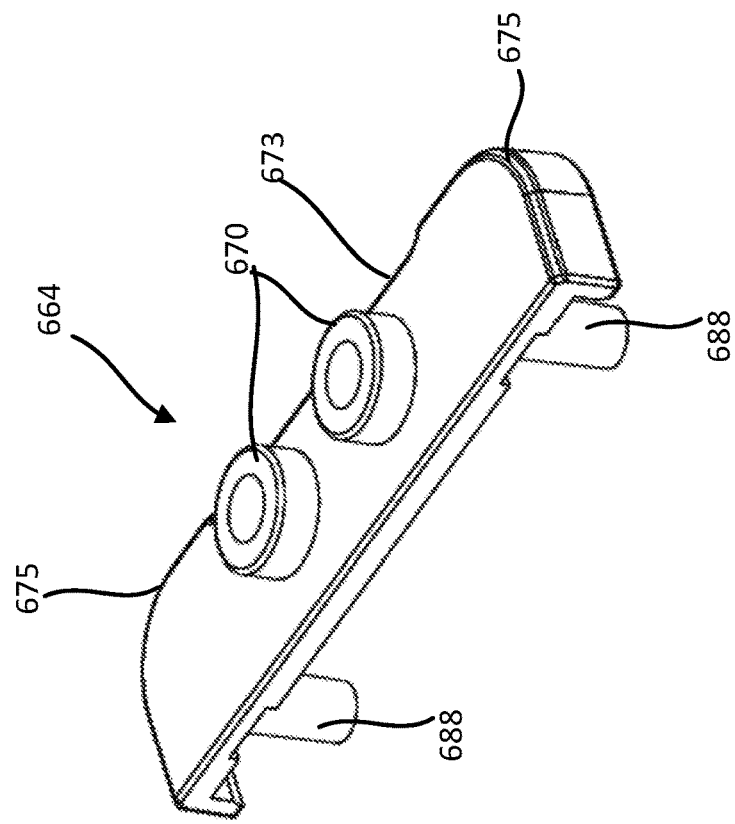
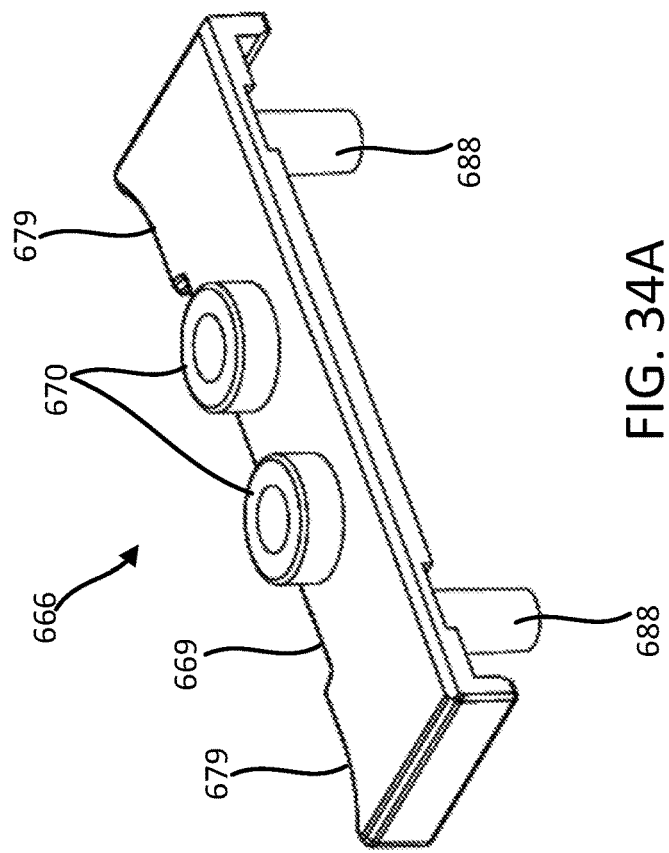
FIG. 34B
FIG. 34A

MODULAR ELECTRONIC BUILDING SYSTEMS AND METHODS OF USING THE SAME

CROSS-REFERENCE TO RELATED APPLICATIONS

This application claims priority to U.S. Provisional Patent Application No. 62/607,145 filed Dec. 18, 2017 and U.S. Provisional Patent Application No. 62/733,306, filed Sep. 19, 2018, each of the disclosures of which is incorporated herein by reference in its entirety.

This application is related to co-pending U.S. Nonprovisional patent application Ser. No. 15/845,730, filed on Dec. 18, 2017, each of the disclosures of which is incorporated herein by reference in its entirety.

This application is also related to U.S. patent application Ser. No. 13/975,923, entitled "Modular Electronic Building Systems with Magnetic Interconnections and Methods of Using the Same," filed Aug. 26, 2013, which claims priority to and the benefit of U.S. Provisional Patent Application No. 61/728,103, entitled "Modular Electronic Building Systems with Magnetic Interconnections and Methods of Using the Same," filed Nov. 19, 2012, and is a continuation-in-part of U.S. patent application Ser. No. 13/593,891, entitled "Modular Electronic Building Systems with Magnetic Interconnections and Methods of Using the Same," filed Aug. 24, 2012, which claims priority to U.S. Provisional Patent Application No. 61/527,860, filed Aug. 26, 2011, each of the disclosures of which is incorporated herein by reference in its entirety.

This application is also related to U.S. patent application Ser. No. 15/228,707, entitled "Modular Electronic Building Systems with Magnetic Interconnections and Methods of Using the Same," filed Aug. 4, 2016, which is a continuation of U.S. patent application Ser. No. 14/696,922, entitled "Modular Electronic Building Systems with Magnetic Interconnections and Methods of Using the Same," filed Apr. 27, 2015, which is a continuation of U.S. patent application Ser. No. 13/593,891, entitled "Modular Electronic Building Systems with Magnetic Interconnections and Methods of Using the Same," filed Aug. 24, 2012, which claims priority to and the benefit of U.S. Provisional Patent Application No. 61/527,860, filed Aug. 26, 2011, each of the disclosures of which is incorporated herein by reference in its entirety.

BACKGROUND

Embodiments are described herein that relate to devices and methods used in the field of electronics and, more particularly, to electronic building blocks and toy building sets.

Some known building block systems can include inter-connectable electronic components that can be used to create various projects, toys and electronic products. Some such systems can be intimidating, time consuming, and demand an expert skill set, as well as specialized hardware/software platforms. This makes building objects with lights, sounds, buttons and other electronic components very difficult and prohibitive to, for example, kids, young students, designers, non-engineers, and others lacking electronics experience. As advances in the miniaturization of technology increase, the need for electronics to be more accessible to non-experts in a cost effective manner continues to grow. Some electronic building systems exist that have been simplified to allow users to be able to design and assemble electronic products, objects, items, etc. without specialized skills; with the ever changing technology of electronics and the desire of people to experience new challenges, however, the need for improved electronic building systems continues to increase.

Thus, a need exists for a new and/or improved simple, easy to use, accessible electronic building block system that can enable the design and assembly of complex, interdependent systems. Such a system would enhance learning, enable experimentation and promote innovation. A need also exists for a building block system that can be used in conjunction with and be inter-connectable with other building block systems, and/or to be used or combined with other traditional materials such as paper, cardboard, screws, or other electronic components.

SUMMARY

In some embodiments, an apparatus includes a first connector including a first housing portion having a top surface and a bottom surface opposite the top surface, and a second connector including a second housing portion having a top surface and a bottom surface opposite the top surface. The second housing portion has a form factor that substantially corresponds to a form factor of the first housing portion. A circuit board having a top surface and a bottom surface opposite the top surface is permanently coupled to the first housing portion of the first connector and permanently coupled to the second housing portion of the second connector such that a first portion of the bottom surface of the circuit board contacts at least a portion of the top surface of the first housing portion of the first connector and such that a second portion of the bottom surface of the circuit board contacts at least a portion of the top surface of the second housing portion of the second connector. A contact assembly is coupled to the first housing of the first connector such that at least a portion of the contact assembly electrically and directly engages a portion of the bottom surface of the circuit board.

BRIEF DESCRIPTION OF THE FIGURES

FIG. 4 is a bottom view of the module shown in FIGS. 2 and 3.

FIG. 5A is a top view of the module of FIGS. 2 and 3.

FIG. 6 is an end view of the module of FIGS. 2 and 3.

FIG. 7 is an opposite end view than FIG. 6 of the module of FIGS. 2 and 3.

FIG. 11 is a perspective view of a first connector of the module of FIGS. 2 and 3.

FIG. 12 is a partial exploded perspective view of the connector of FIG. 11, showing the contact assembly and magnets detached from the connector.

FIG. 19A is a top view of the module of FIGS. 18A and 18B.

FIG. 19B is a bottom view of the module of FIGS. 18A and 18B.

FIG. 21A is an end view of the module of FIGS. 18A and 18B.

FIG. 21B is an end view opposite the end view of FIG. 21A of the module of FIGS. 18A and 18B.

FIG. 27 is a bottom perspective view of the module of the electronic building block system of FIG. 25.

FIG. 28 is a perspective view of the module of the electronic building block system of FIG. 25 shown coupled to a component of a different building block system.

FIG. 34A is a perspective view of a first adapter of the module of the electronic building block system of FIG. 30A.

FIG. 34B is a perspective view of a second adapter of the module of the electronic building system of FIG. 30A.

DETAILED DESCRIPTION

Figure 1A:
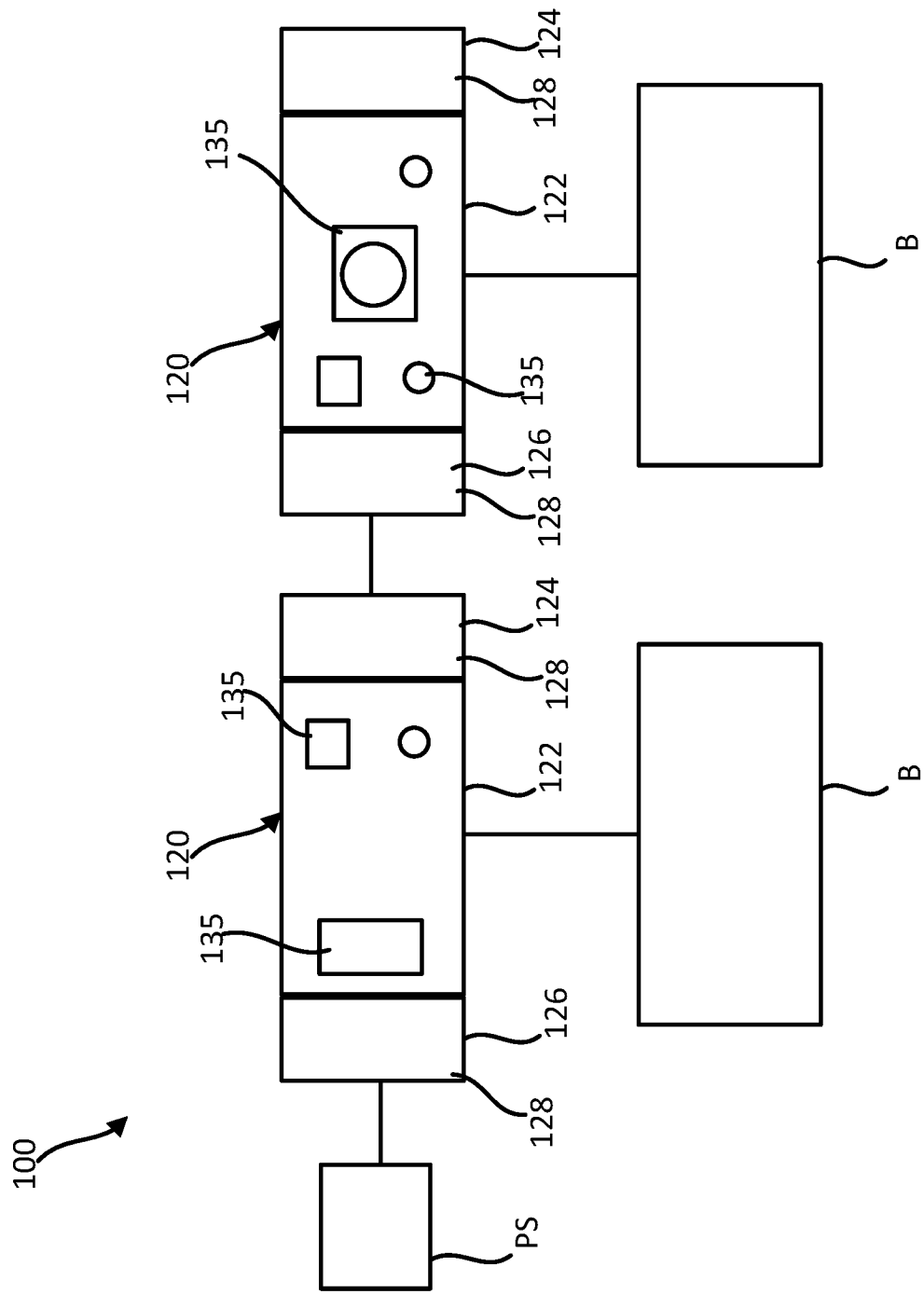
FIG. 1A is a schematic illustration of an electronic building system, according to an embodiment.

In some embodiments, an electronic educational toy or a modular electronic building block system is provided that can teach the logic of programming and circuit building without requiring expertise in either. In some embodiments, the modular electronic building block system (also referred to herein as "system" or "block system" or "electronic building system") includes modules that include pre-assembled printed circuit boards (PCB) and connectors coupled to the PCB. The connectors can be interconnected using, at least in part, small magnets. Each module (also referred to as a "block") can perform one or more discrete functions (e.g., an LED, a pushbutton, a light sensor with a threshold, etc.), and the modules can be combined to produce larger circuits. Some modules can respond to external events such as mechanical forces, touch, proximity, radio frequency signals, environmental conditions, etc. Some blocks can have pre-engineered functionalities and some blocks simply pass current like wire blocks. Yet other blocks can provide current, such as, for example, a power module.

In some embodiments, the modules described herein may be divided into categories corresponding to their function. Examples of categories can include, but are not limited to: power modules, input modules, output modules, wire modules, etc. Power modules, for example, can take current from a battery, an AC adapter (e.g., wall wart), or other power source, and convert it into current, feeding the other components of the system. In any working configuration of modules, there may be at least one power module. Input modules can include, but are not limited to: buttons, switches, sensors, etc. Output modules can include, but are not limited to: LEDs, displays, sound modules, motors, etc. In some embodiments, wire modules may not perform a particular function, but act as wire extensions, configuration changers, and in some cases logic and state modules.

In some embodiments, the general electrical operation of the system can include modules that can include a standard interface and communicate automatically when connected. In some embodiments, each module can include three or more electrical lines and such lines are interconnected between and throughout all modules. For example, the electrical lines can each be coupled to one or more conductors of a module. These lines can include, for example, data, power, signal and ground. In some embodiments, a module(s) can have at least three conductors, and includes three electrical lines including a power line, a signal line and a ground line. In some embodiments, power and signal lines of the power modules are at 5 Volts, the system is relatively low power, and the power and ground lines are shared among all the modules. In other exemplary embodiments, the power may be something other than 5 Volts such as, for example, 3V, 9V, 12V, 15V, alternating current (AC), etc. In some embodiments, a power line of a first module of a module system can provide power at a different voltage than a power line of another module of the module system. Input modules can take the incoming signal, manipulate it according to the module's function, and output the modified signal. In the case of a pressure sensor connected to a power module, for example, the sensor module takes 5 Volts into the signal line, and outputs a voltage between 0 and 5 Volts depending on the amount of pressure applied to the sensor. Output modules respond to the signal line by representing the voltage in light, sound, display, movement, or other forms. In some embodiments, the pressure sensor scales the input signal in proportion to the pressure at the sensor, and passes that scaled signal to the output. Output modules transform or transduce incoming signal information into perceivable actions, such as light, sound, motion, or other perceivable actions.

All modules are pre-assembled, pre-engineered, and contain the logic and circuitry used to make the module readily usable. For example, an LED module can contain a resistor corresponding to its current rating, an Operation Amplifier (OpAmp) as a buffer from the remainder of the circuit, or any other conceivable electronic circuitry. In another example, a coin cell battery module can incorporate a discharge protection circuit. In some exemplary embodiments, the system does not require any hardware or software platform. In other exemplary embodiments, the system may include a hardware and/or software platform. In some embodiments, the modules can be programmed. In some embodiments, the modules do not need to be programmed and do not require a central circuit controlling them. In such embodiments, the system can be standalone and does not need a computer or hub. In some embodiments, however, the system may be connected to a device such as a computer, hub, memory storage, or personal electronic mobile device, such as, for example, a cellular phone, smart phone, etc., to access or produce additional functionality or to retrieve information or power from the device.

In some embodiments, an electronic building system as described herein can include logic and state modules that can be used for programming. Such modules can enable a user to program certain behaviors of his/her designed system without needing to learn a programming language, to write code on a computer, or to program a microcontroller circuit. For example, programming can be done through using logic modules to produce decision trees. In some embodiments, microcontroller programming can be done on the system. Also, a module can include feature controls, such as, for example, switches, knobs and buttons that enable selection of modes of behavior. Some modules can allow for the selection of a mode or adjustment of their behavior. For instance, a proximity sensor module can contain a mode switch and a potentiometer. Through the manipulation of the embedded potentiometer, the threshold level can be set, determining the input signal level beyond which the module should output a high. Also, by, for example, flipping a switch, the module can go from normally-high to normally-low, in essence inverting its response to the desired threshold. In some embodiments, this functionality can be implemented in software as well.

In some embodiments, a system as described herein can provide and include multiple electrical modules selectively couplable together to transmit electrical current from one electrical module to another electrical module, each module having at least one functionality associated therewith and including a connector adapted to couple to a connector of another electrical module. When the modules are coupled together (e.g., via the connectors), a functionality of at least one of the electrical modules can be dependent upon at least another one of the electrical modules.

In some embodiments, a system can include one or more modules that can communicate with one another via a wireless communication protocol (e.g., Bluetooth radios). In other words, one or more modules can communicate with each other without being mechanically coupled together.

In some embodiments, a system as described herein can include at least four different categories of modules: power; input; output; and wire; although more types of modules are possible. Power modules provide electricity to the system. Input modules can interpret data or their surroundings and provide that input to the system. Output modules can make visual, physical, or audible changes to their surroundings based on input(s) to the system. Thus, the output modules can produce perceivable sensory or physical events. Wire modules can route power and/or communication between the modules in the system. Wire modules can also modify the electrical signals.

Many different types of modules are possible in each category, including but not limited to the following: (i) power modules, including for example, wall power modules, battery power modules, solar power modules, discharge protection circuits; (ii) input modules, including for example, pulse modules, pressure sensor modules, proximity modules, input recording modules, potentiometer modules, button modules, temperature modules, accelerometer modules, memory modules, timer modules; (iii) output modules, including, for example, motion modules, motor modules, vibration motor modules, fan modules, RGB LED modules, LED modules, bar graph modules, speaker modules, electroluminescent wire modules and display modules such as organic light emitting diodes (OLED) modules, or liquid crystal display (LCD) modules; and (iv) logic modules, including, for example, wire modules of various lengths, extender modules, splitter modules, programmable microcontroller unit (MCU) modules, and interface modules. Any known type of circuit or electronic component or combination of components may be used to create a module and thus form a portion of a system built using such components.

In some embodiments, when a first power module is connected to a second module, the power signal from the power module is transferred from the power module to the second module. Accordingly, the second module is powered by the first module. If, for example, a button module, sensor module, or other type of module is placed somewhere between the first power module and a second module, the signal or current may be affected by the action of the button module or the sensor module. For example, the signal or current may not pass (or, alternatively, may continuously pass) from the first module (power module) to the second module unless the button on the button module is depressed or the sensor on the sensor module is activated. Similarly, if a sensor module is only partially activated, then only partial current is transferred from the first module (power module) to the second module 34.

The modules described herein may be provided as individual modules or provided as part of a set or kit. A kit can include, for example, standard module components as well as specialized components such as sensor sets, mechanical sets, biological sets, sound sets, etc.

According to some embodiments, a kit that can include at least a portion of a building block system having multiple modules as well other supporting components, such as, for example, accessory components to allow a user to build a particular electronic device, such as, for example, a lamp, a toy vehicle, a light switch dimmer, etc. In some embodiments a kit may include one or more different category of modules (power, input, output, and/or wire), one or more different types of each category of modules, a container in which to store the modules, a mounting board or substrate upon which to place or couple modules, learning materials, accessories, instructions, or a variety of other components. For example, a kit may include multiple modules that may be connected in an almost unlimited number of combinations to perform numerous different input and output functions. In other exemplary embodiments, the kit may also include a limited number of modules that are intended to be assembled in a limited number of combinations, including a single combination, to perform a limited number of functions. For example, for a kit intended to be used to build a particular functional system, the kit can include as many as tens or hundreds or more modules, or it can include just two modules (a power module and an output module). In some embodiments, a kit may include modules and components intended to augment an existing module library or existing kit, in which case it may include just one type of module, such as, for example, a kit of only wire modules or only output modules. A kit may also be directed to a certain age group, with a kit for an elementary level including fewer and/or less complicated modules than a kit designed for a high school level, for example. In some embodiments, a kit may include instructions, videos, or other means, which inform the user as to one or more possible combinations of the modules. For example, the instructions may instruct the user how to assemble the modules into a battery-powered motion sensor that emits an audible alarm upon detection of movement.

In some embodiments, a system can be adapted to give access to sophisticated devices through, for example, analog or other interfaces. Example complex devices may include, but are not limited to, LCD displays, OLED screens, timers, accelerometers, logic gates, and many more. In some embodiments, this may be accomplished by pre-engineering one or more modules and providing "entry points" into the devices. The entry points can be, for example, knobs or switches that allow the user to adjust the intensity or frequency of pulsing, change modes of operation, set thresholds, make decisions, or remember a configuration, among many other operations. These may be considered "entry points" because they are based on similar devices that people know how to use from their everyday lives. The example modular systems described herein may take lessons and iconography from consumer electronics (such as, for example, blenders, DVD players, alarm clocks, game consoles) and apply them to these semi-raw electronic modules.

An example entry point module may include an OLED screen module, which includes an SD card slot in which users can insert an SD card preloaded with images and video. Images and videos may also be provided by a connected edge-router module and sent to another module via a digital communication protocol. The OLED screen module may also include a microcontroller on-board, which is pre-programmed with firmware to access and display the images. In some embodiments, also integrated in the OLED screen module may be a toggle switch and a knob, where the toggle switch selects between fixed images/video or looping and the knob adjusts the looping speed. In the above example, even though the circuit board and firmware itself may be complex, the end result will be an easy-to-use OLED screen module with appropriate iconography that may be accessible to children and novice users alike. The exemplary system may allow for and include the pre-engineering and design of numerous other complex modules similar to the OLED screen example.

In some embodiments, an apparatus includes a first connector portion including a first housing portion having a top surface and a bottom surface opposite the top surface, and a second connector portion including a second housing portion having a top surface and a bottom surface opposite the top surface. The second housing portion has a form factor that substantially corresponds to a form factor of the first housing portion. A circuit board having a top surface and a bottom surface opposite the top surface is permanently coupled to the first housing portion of the first connector portion and permanently coupled to the second housing portion of the second connector portion such that a first portion of the bottom surface of the circuit board contacts at least a portion of the top surface of the first housing portion of the first connector portion and such that a second portion of the bottom surface of the circuit board contacts at least a portion of the top surface of the second housing portion of the second connector portion. A contact assembly is coupled to the first housing of the first connector portion such that at least a portion of the contact assembly electrically and directly engages a portion of the bottom surface of the circuit board.

In some embodiments, an apparatus includes a first connector portion including a housing portion having a top surface, a bottom surface opposite the top surface, and a front surface facing in a direction that is substantially transverse to the bottom surface and the top surface. A contact assembly is coupled to the housing of the first connector portion and has at least one contact that extends outwardly from the front surface of the housing portion of the first connector portion. A circuit board having a top surface and a bottom surface opposite the top surface is permanently coupled to the first connector portion such that at least a portion of the bottom surface of the circuit board contacts at least a portion of the top surface of the housing portion of the first connector portion and at least a portion of the contact assembly electrically and directly engages a portion of the bottom surface of the circuit board. The first connector portion can be coupled to a second connector portion of another apparatus distinct from the apparatus such that a portion of the front surface of the housing portion of the first connector portion engages a portion of a front surface of a housing portion of the second connector portion and at least a portion of the contact assembly electrically engages at least a portion of a contact assembly coupled to the housing of the second connector portion.

In some embodiments, an apparatus includes a first connector portion including a first housing portion having a top surface and a bottom surface opposite the top surface and including a front surface. A second connector portion includes a second housing portion having a top surface and a bottom surface opposite the top surface and includes a front surface. A circuit board is permanently coupled to the first housing portion of the first connector portion and permanently coupled to the second housing portion of the second connector portion. A first contact assembly is coupled to the first housing portion of the first connector portion and includes multiple protrusions. A second contact assembly is coupled to the second housing portion of the second connector portion and defines multiple recesses. Each protrusion from the multiple protrusions of the first contact assembly are configured to be slidably received within a different recess from multiple recesses of a third contact assembly coupled to a third connector portion of a second apparatus distinct from the apparatus when the first connector portion is removably coupled to the third connector. Each recess from the multiple recesses of the second contact assembly are configured to slidably receive a different protrusion from multiple protrusions of a fourth contact assembly coupled to a fourth connector portion of a third apparatus distinct from the apparatus and distinct from the second apparatus when the second connector portion is removably coupled to the fourth connector portion.

In some embodiments, an apparatus includes a first connector portion that includes a first housing portion having a top surface, a bottom surface opposite the top surface, and a front surface facing in a direction substantially traverse to the bottom surface and the top surface of the first housing portion. A second connector portion includes a second housing portion having a top surface, a bottom surface opposite the top surface, and a front surface facing in a direction substantially traverse to the bottom surface and the top surface of the second housing portion. A contact assembly is coupled to the first housing portion of the first connector portion and has at least one contact. The second connector portion includes a receiving pocket configured to receive a contact assembly of a third connector portion of a second apparatus distinct from the apparatus. A circuit board has a top surface and a bottom surface opposite the top surface of the circuit board. The circuit board is permanently coupled to the first connector portion such that at least a portion of the bottom surface of the circuit board contacts at least a portion of the top surface of the first housing portion of the first connector portion and at least a portion of the contact assembly electrically and directly engages a portion of the bottom surface of the circuit board. The circuit board is permanently coupled to the second connector portion such that at least a portion of the bottom surface of the circuit board contacts at least a portion of the top surface of the second housing portion of the second connector portion.

Referring now to the figures, FIG. 1A is a schematic illustration of a modular electronic building block system, according to an embodiment. FIGS. 1B-1E each illustrate an example of a different module 120, and FIG. 1F illustrates three modules of FIGS. 1B-1D coupled together. The modular electronic building block system 100 (also referred to herein as "system", "block system" or "electronic building block system" or "electronic building system") can include one or more electronic modules 120 (also referred to herein as "modules," "blocks," or "electronic blocks") that can each be removably coupled to at least one other module 120. FIG. 1A illustrates two modules 120. Each module 120 can include a printed circuit board 122 (also referred to as "PCB" or "circuit board") coupled to two or more connectors or connector portions, such as connectors 124 and 126, shown in FIG. 1A. In some embodiments, a module 120 may have only a single connector 124, 126. The circuit board 122 can include various associated electronic or electrical components to perform various desired functions, and include at least two interfaces (e.g., an input interface and an output interface). In some embodiments, the circuit board 122 can include, for example, two input interfaces and two output interfaces. Although the circuit board 122 is shown having a particular length and width, it should be understood that the circuit board 122 can have different lengths and widths than the example embodiments shown and described. It should also be understood that although the circuit board 122 is shown as being rectangular, the circuit board 122 can alternatively be a variety of different shapes, e.g., square, triangular, etc.

The connectors (also referred to herein as connector portions) 124 and 126 can each include a housing or housing portion 128 that can be fixedly or permanently coupled to the circuit board 122 with, for example, a mechanical fastener (e.g., bolt, screw, rivet, etc.). In other embodiments, the connectors can be coupled to the circuit board with a friction fit, and in yet other embodiments, the connectors can be coupled to the circuit board with a spring-loaded mechanism. As shown in the schematic illustrations of FIGS. 1B-1E, the circuit board 122 is coupled to the connectors 124 and 126 such that a bottom surface of the circuit board 122 contacts at least a portion of a top surface of the connectors 124 and 126. Thus, the circuit board 122 is disposed over the connectors 124 and 126. In some embodiments, when the circuit board 122 is coupled to the connectors 124, 126, at least a portion of a front surface of the circuit board 122 is aligned or substantially aligned with a front surface of the connectors 124, 126, and/or a side surface of the circuit board 122 is aligned or substantially aligned with a side surface of the connectors 124, 126.

In some embodiments, a module 120 can include a single housing structure that includes the housings or housing portions 128 for each connector 124, 126 and a base portion between the housing portions 128. In other words, the housings 128 for each connector 124, 126 are monolithically formed as a single component. In some embodiments, such a housing structure can define in part an interior region or volume, in which components of the module 120 can be disposed such as circuitry and other electrical hardware.

The housing 128 can be the same or substantially the same form factor for both connectors 124 and 126 as described in more detail below. In other words, the connector 124 and the connector 126 each include the same or common housing 128. In alternative embodiments, the connectors 124 and 126 can each include a different form factor housing 128. The housing 128 can be for example, formed with an appropriate plastic material and be injection molded. The housing 128 can be a single injection molded component or can include multiple components coupled together (e.g., with ultrasonic welding, friction fit, or with fasteners). The housing 128 can define one or more receptacles (not shown in FIG. 1A) that can receive therein a magnet that can be used to removably couple a connector (e.g., 124) of one module 120 to a connector (e.g., 126) of another module 120 as described in more detail below. The receptacles can have an open end at a top surface portion of the housing 128 and a closed bottom end. Thus, when a magnet is disposed within the receptacle, the magnet can rest on a bottom surface at the closed end of the receptacle.

The magnets on one connector (e.g., 124) of a module 120 can have the north face of the magnet(s) facing out and the other connector (e.g., 126) of the module 120 can have the south face of the magnet(s) facing out. The south facing side of the connector of one module 120 can only be coupled to the north facing side of a connector on another module 120. This ensures proper connection and appropriate polarity for the electronic circuit/PCB of the modules. The repelling polarities inhibit the magnets from one connector (e.g., 124, 126) connecting to another connector (e.g., 124, 126) in an inappropriate manner to facilitate the electrical connection of the modules 120 in the correct manner. For example, a connector with a magnet with the north face of the magnet facing outward cannot be coupled to another connector with a magnet with the north face of the magnet facing outward. In some embodiments, multiple magnets having alternating or identical polarities can also be used in the manner described above.

In some embodiments, the connectors (e.g., 124, 126) of a module 120 can also include an interlocking coupling mechanism (not shown in FIGS. 1A-1F) that includes at least one protrusion and at least one recess defined by the housing 128 that can interlock, mate, or complimentarily fit with at least one recess and at least one protrusion, respectively, of another connector of another module 120. In some embodiments, the interlocking mechanism can include at least one protrusion and at least one recess that is provided by another component of the module 120 such as the contact assembly (not show in FIGS. 1A-1F) as described in more detail below with respect to specific embodiments. The interlocking of the protrusions and recesses can inhibit the modules 120 from sliding laterally or side-to-side with respect to each other when removably coupled together. Thus, a connector of one module can be coupled to a connector of another module with the magnets and/or the interlocking coupling mechanism. When a first module 120 is removably coupled to a second module 120 (via the magnets of the connectors 124, 126), a front surface of the connector of the first module 120 contacts a front surface of the connector of the second module. In some embodiments, when a first module 120 is removably coupled to a second module 120, a side surface of the connector of the first module 120 can be aligned with a side surface of the connector of the second module 120.

The modules 120 further include a first contact assembly (not shown in FIGS. 1A-1F) that can be coupled to the connector 124 and a second contact assembly (not shown in FIGS. 1A-IF) that can be coupled to the connector 126. The first contact assembly and the second contact assembly can each include a base with multiple electrical contacts or conductors coupled to the base. For example, in some embodiments, the first contact assembly and the second contact assembly can each have from 2-15 contacts, or any suitable number of contacts. The first contact assembly can have the same or different number of contacts as the second contact assembly. The electrical contacts or conductors can be, for example, spring probes or small metal plate. In some embodiments, the electrical contacts can be coupled to the base with soldering; in other embodiments, the electrical contacts can be coupled to the base without soldering, with for example, mechanical couplings or by engagement of the contacts with the base. Further, in some embodiments, the first contact assembly is permanently connected to the connector 124 and to the circuit board 122 without the use of a solder connection between contacts of the contact assembly and the circuit board 122 or housing 128 of the connector 124. Similarly, the second contact assembly can be permanently connected to the connector 126 and to the circuit board 122 without the use of a solder connection between contacts of the contact assembly and the circuit board 122 or housing 128 of the connector 126. For example, the contact assemblies can be sandwiched at least partially between the housing 128 of the connectors 124, 126 and the circuit board 122 when the circuit board 122 is coupled to the housings 128 with mechanical fasteners. In some embodiments, the circuit board 122 is permanently or fixedly coupled to the housings 128 of the connectors 124, 126 such that the contact assemblies are maintained permanently or fixedly coupled to the connector 124, 126 with a pressure fit.

The first contact assembly and the second contact assembly can each include a base and one or more contacts coupled to the base. The base of the first contact assembly and the base of the second contact assembly can be different or can be the same or substantially the same (e.g., the same or substantially same form factor). Similarly, the contacts of the first contact assembly can be the same (e.g., the same or substantially same form factor) or different than the contacts of the second contact assembly. When the first contact assembly is coupled to the connector 124, and the circuit board 122 is coupled to the connector 124, a portion of the first contact assembly extends outwardly from a front surface of the connector 124 and a front surface of the circuit board 122. When the second contact assembly is coupled to the connector 126, and the circuit board 122 is coupled to the connector 126, a portion of the second contact assembly extends outwardly from a portion of the circuit board 122. The portion extending outwardly from the first contact assembly can include multiple elongate protrusions, and the portion extending outwardly from the second contact assembly can define multiple elongate recesses or slots. When a first module 120 is removably coupled to a second module 120, the multiple elongate protrusions of a first contact assembly of the first module 120 can be received within multiple slots or recesses of a second contact assembly of the second module 120 and the contacts of the first contact assembly of the first module engage the contacts of the second contact assembly to electrically couple the first module to the second module.

Thus the magnets of the connectors 124, 126 act as magnetically polarizing and mechanically connecting elements, whereas the contact assemblies carry an electronic signal from one circuit board 122 of a first module 120 to the next circuit board 122 of a second module 120 through the mating of the connectors (e.g., 124, 126) and the contact assemblies. In some embodiments, a connector 124 with a first contact assembly coupled thereto can be referred to as a male connector, and the corresponding connector 126 with a second contact assembly can be referred to as a female connector. As described above, the circuit board 122 can include an input interface and an output interface, and the circuit board 122 can be coupled to the connectors 124 and 126 such that one of the connectors 124, 126 is near the input interface of the circuit board 122, and the other connector 124, 126 is near the output interface. Thus, for example, when a first module 120 is coupled to a second module 120, the connector near the output interface of the first module 120 can be coupled to a connector near the input interface of the second module 120 such that electrical current can be carried or transferred from the first module 120 to the second module 120 via the contact assembly, and transferred to a third module 120 coupled to the second module 120 via the input interface of the second module to the output interface of the second module 120 and then to the input interface of the third module 120.

The modules 120 can also be used or interconnected with components or block B of different interlocking building block systems. For example, each module 120 can be coupled to a component or block B of a LEGO® block system. More specifically, each connector 124, 126 can include one or more mounting portions 130 (e.g., see FIGS. 1B-1E) that can matingly couple to such a component or block B of a different building block system. As shown in FIGS. 1B-1E, the mounting portions 130 extend from a bottom portion of the connectors 124, 126 such that the module 120 can be removably coupled to a top portion of a component B. In addition, in some embodiments, as shown in FIG. 1E, a module 120 can include additional adapters 164 and 166 coupled to a top surface of the circuit board 122 such that the module 120 can be coupled to a bottom portion of a component B of a different interlocking building block system. The adapters 164, 166 can be configured to couple the module 120 to a component B of the same interlocking building block system as the mounting portions 130 and/or to a component B of a different interlocking building block system than the mounting portions 130. Further details of such mounting portions 130 and adapters 164 and 166 are described below with reference to module 320.

Each module 120 can also include one or more electrical or electronic components 135 that can perform a particular function. Example electrical components 135 can include, power components (e.g., various type of batteries, power adapters), sensors (e.g., pressure, temperature), switches, push buttons, knobs, potentiometers, mode switches, tactile switches, timers, speakers, and other audio related components, visual components such as light components (e.g., light emitting diodes (LEDs)), recorders, motors, fans, thermometers, etc. In some embodiments, a module 120 can include, for example, a processor, micro-processor, controller, micro-controller, firmware, or a display such as a digital display. The various electrical or electronic components can be coupled (e.g., soldered) to the circuit board 122 of a module 120. Electrical power can be provided to the electrical components 135 via a power module (described below) and via the contact assemblies and circuit boards 122 of the modules 120 as described above.

As described above, various categories and types of modules 120 can also be referred to by the particular functionality the module provides. For example, a power module, a light module, a sensor module, a switch module, etc. As described above, in some embodiments, a system 100 can include at least four different categories of modules: power; input; output; and logic; although more types of modules are possible. Power modules provide electricity to the system. Input modules can interpret data or their surroundings and provide that input to the system. Output modules can make visual, physical, or audible changes to their surroundings based on signals present in the system. Wire modules can route or modify power, signals and/or communications between the modules in the system and/or interface with other systems, such as, e.g., the MIDI protocol, a digital display, dot matrix display or video display.

In one example, a power module 120 provides power components and can take current from a battery, an AC adapter (e.g., wall wart), or AC to DC converter, or other power source, and convert it into current, feeding the other components of the system (e.g., other electrical components of the modules coupled to the power module). Thus, in any working configuration of modules (e.g., multiple modules removably coupled together to create a desired functionality), there is typically at least one power module to supply power to the desired system. In some embodiments, some or all of the modules can include a power source. An example power module 120 is shown in the schematic illustration of FIG. 1B and can include, a power adapter 127 with a cord 123 that can be releasably coupled to a power source PS (shown in FIG. 1A). In other embodiments, a power module can include a battery block that can receive one or more batteries, a coin battery, a rechargeable battery (e.g., Lithium-Ion (L-Ion) battery or Lithium Polymer (LiPo) battery), or other type of power source within the power module itself. In some embodiments, a power module can include a battery charger, a USB port, and/or a Bluetooth or other type of component to provide wireless capabilities.

Figure 1C:
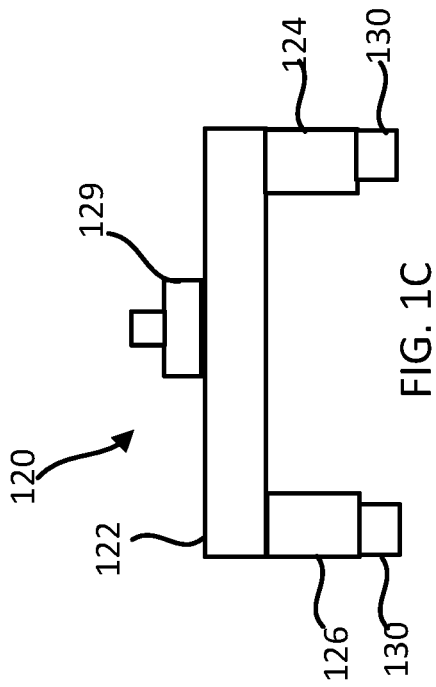
FIGS. 1B-1E are each a schematic illustration of a side view of a module of an electronic building block system, according to an embodiment.
Figure 1E:
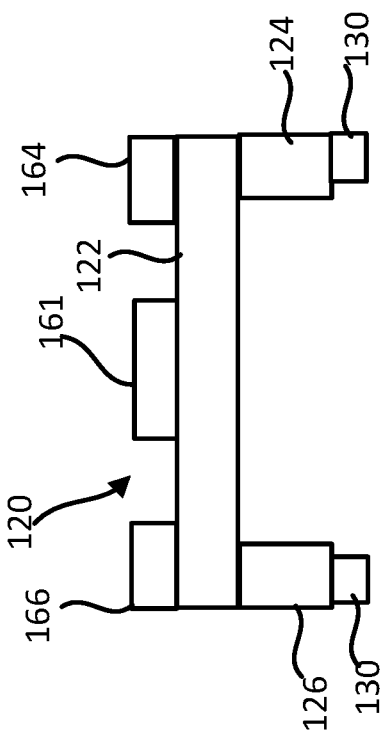

FIG. 1C illustrates another example module. A tactile switch module 120 can include a push button 129 (or other type of switch) that can be coupled (e.g., soldered) onto the circuit board 122 as shown in FIG. 1C. As described above, the circuit board 122 can have an input interface and an output interface. The tactile switch module can have, for example, a connector 126 near the input interface and a connector 124 near the output interface. The connector 126 of the tactile switch module 120 can be designed to couple with a connector near an output interface of another module 120, and the connector 124 of the tactile switch module 120 can be designed to couple to a connector near the input interface of a different module. The tactile switch module 120 can include electrical conductors designed to complete connections between two engaging interfaces for a power line and a ground line. A signal line can go through the push button 129, which makes or breaks the circuit, and thus transfers a modified signal line to the output interface corresponding to the module function.

Figure 1B:
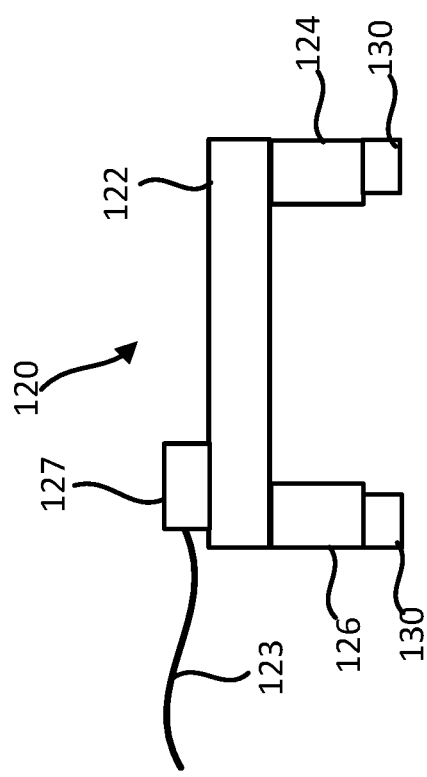
Figure 1D:
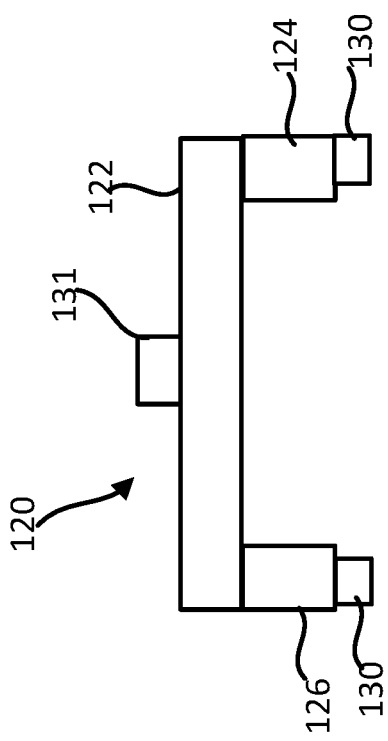
Figure 1F:
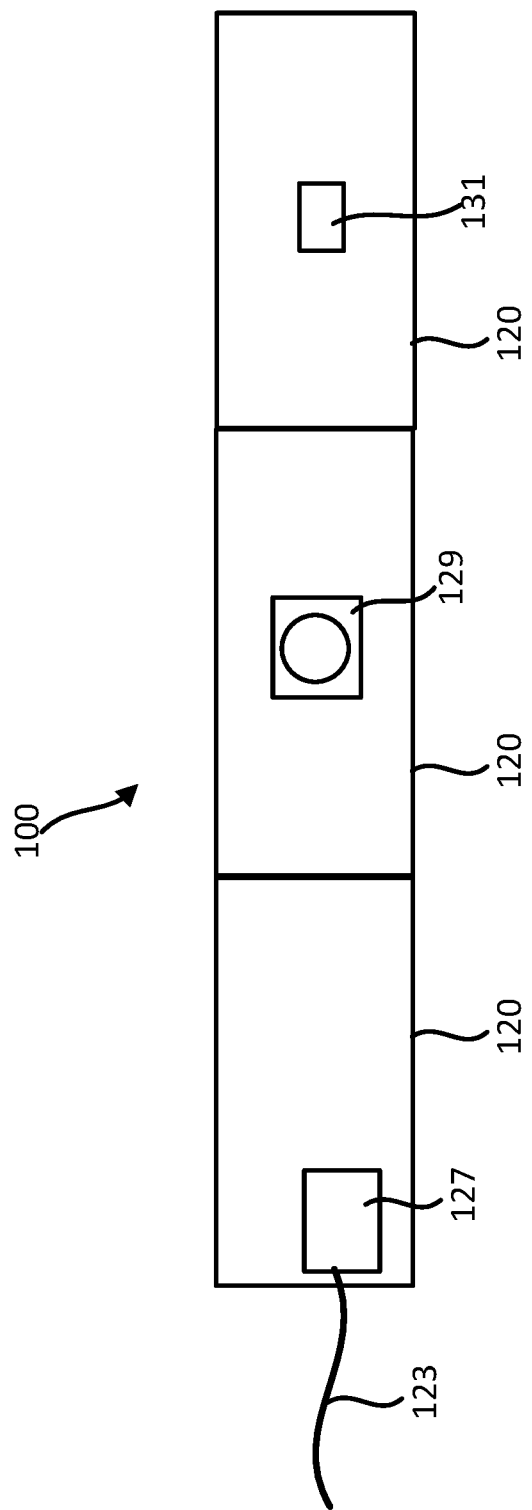
FIG. 1F is a schematic illustration of a top view of the three modules of FIGS. 1B-1D coupled together.

In another example, a light emitting diode (LED) module 120 is shown in the schematic illustration of FIG. 1D. The LED module can include, for example, a LED component 131 (e.g., a dip package LED component) coupled (e.g., soldered) to the circuit board 122. In yet another example, a sound generator module 120 is shown in FIG. 1E, and can include a speaker, alarm, buzzer, or other sound emitting component 161. When, for example, the power module of FIG. 1B is coupled to the tactile switch module of FIG. 1C and the tactile switch module is coupled to the LED module as shown in FIG. 1E, and the power module is connected to a power source, when a user pushes the push button of the switch module, a circuit is completed and the LED illuminates. The power module adapter 127 delivers power to the power module and the pre-integrated circuitry in the power module then converts the voltage to a desired voltage such as, for example, 5 Volts in the present example. If the tactile switch module is removed from between the two other modules, the LED module can be coupled directly to the power module, constant power will be delivered to the LED module and the LED will remain illuminated until the power is terminated. In the above-described example, there is one power module, one input module (the tactile switch module) and one output module (the LED module). It should be understood that this is merely one example of the various types of modules that can be coupled together to achieve a particular functionality. In other examples, the LED module could be replaced with an audio module (e.g., a buzzer module) so that when the push button of the tactile switch module is pressed, the audio module makes an audible sound (a buzzer). Many other combinations and sub-combinations are possible with different modules having different functionality all forming different circuits, with immediate response of the elements, and without any need for programming, soldering or circuit assembly.

In some embodiments, input (e.g., user input) need not be limited to just a mechanical input device (e.g., a mechanical switch) but also can be digital input. For example, in some embodiments, a module can have a wireless receiver, and in such an embodiment, a user can use a processor with a wireless transmitter to send a wireless signal to make an input.

In another example module (not shown), a power module can include a battery component, such as, for example, a coin cell battery block. The coin battery can deliver a little over 3 Volts stepped up to 5 Volts by the electronic circuit of the module. The circuit can also include a discharge protection circuit, which demonstrates an example of how the electronic building system can be designed to make the system easier to use and safe for users. The circuit may also include an embedded switch that enables a user to turn on or off the battery component so as not to waste battery power. Connected to the battery module can be a pressure sensor module, which can read the amount of pressure applied to a pressure sensor component and output voltage in the range of, for example, 0 to 5 Volts depending on the amount of pressure applied. As more pressure is applied to the pressure sensor component, higher voltage transmits to the next modules. In this example, the next modules can be, for example, a vibrating motor module and an LED module, which respectively vibrate more and illuminate brighter as the applied pressure increases. It should be understood that the above example of 0-5 Volts is merely an example, and that other voltage ranges can be used to accomplish the electronic functions described.

In some embodiments, each module 120 can include control and protection circuitry to facilitate safe and easy operation of the module 120. In some embodiments, each module 120 can include an operational amplifier component or other electronic circuits used in a buffer configuration to reduce the amount of overall current consumption on the overall system of coupled modules 120. This assists with facilitating the cascading of multiple modules 120 without significant loss of power, as well as scaling the system as may be desired. In other exemplary embodiments, the system 100 may include a booster module in the overall system of coupled modules to boost the current and/or power traveling through the power lines and ensure proper functioning of all the modules 120 in the system 100.

In another example, a user can program behavior of a circuit by manipulating physical elements. In an example embodiment, a power module can include a 9 Volt battery, which module can be coupled to a temperature sensor module that includes a threshold component, and the temperature sensor module can be coupled to an audio module. In this example, the temperature sensor module may be more advanced than a traditional sensor module and can include a temperature sensor and a potentiometer that may be adjusted to set a temperature threshold. If the temperature detected by the temperature sensor is above the set temperature threshold, the temperature sensor module outputs a high reading. This is an example of integrating logic with a simpler analog module to enable complex circuit configurations. An output of a high reading from the temperature sensor module will cause the audio module to activate and a speaker on the audio module to play a pre-recorded message associated with a high reading. For example, this exemplary circuit could be used by a person wishing to have an alarm to turn on the air conditioning. When the temperature exceeds a pre-set threshold temperature, the audio module could play back a message "time to turn on the AC!" Also, the audio module may instead be replaced with, for example, a fan module, which may activate a fan upon receiving a high temperature reading signal from the temperature sensor module.

In some embodiments, the temperature sensor module may incorporate a mode switch that can change the behavior of the module from 'normally-low' to 'normally-high'. In contrast to the above described configuration (which was normally-low), a 'normally-high' setting would cause the temperature module to output a high reading except when the temperature exceeds the threshold. This means the audio module would be playing recurrently until the room gets warmer, at which point the audio module will cease to output audio. These controls, in addition to pre-programmed modules, logic modules and state modules, can allow the system to enable complex prototypes and circuits with no programming or electronics knowledge.

Each module 120 of a system 100 may also be uniquely configured to provide a quick visual indication to a user of each module's function. The modules 120 may be uniquely configured in any manner and have any characteristic to identify the functionality of the modules. Additionally, any portion of the module 120 may be uniquely configured and have any characteristic to represent the unique configuration feature. For example, the modules may have a characteristic that uniquely identifies the modules by color-coding, patterning, or may include unique structuring such as shapes, housings, interconnection or couplings, etc. In one example, the connectors of a module can be color-coded as the manner of uniquely configuring modules to provide visual indicators as to the function of the modules. In other examples, the module can include color-coded fasteners to identify a particular type or category of module, or a module can include an indicator component coupled to the circuit board and/or one or both of the connectors to identify a particular type or category of module. It should be understood that the color-coding examples provided are merely examples and not intended to be limiting, as the modules 120 may be uniquely configured in any manner. Color-coding of the modules can provide a user with a quick visual confirmation of the type of module, the functionality of the module, as well as allowing the user to learn which color combinations are possible. The functionality of the modules identified by the unique configurations and characteristics may be any type or level of functionality. For example, the unique configurations may indicate that the modules are input modules, power modules, wire modules, output modules, etc. In other examples, the unique configurations of the modules may be more specific such as, for example, an LED module, a 9-volt battery module, a cell battery module, a potentiometer module, a switch module, a pressure sensor module, a pulse module, a button module, a vibration motor module, a wire module, etc.

Figure 16:
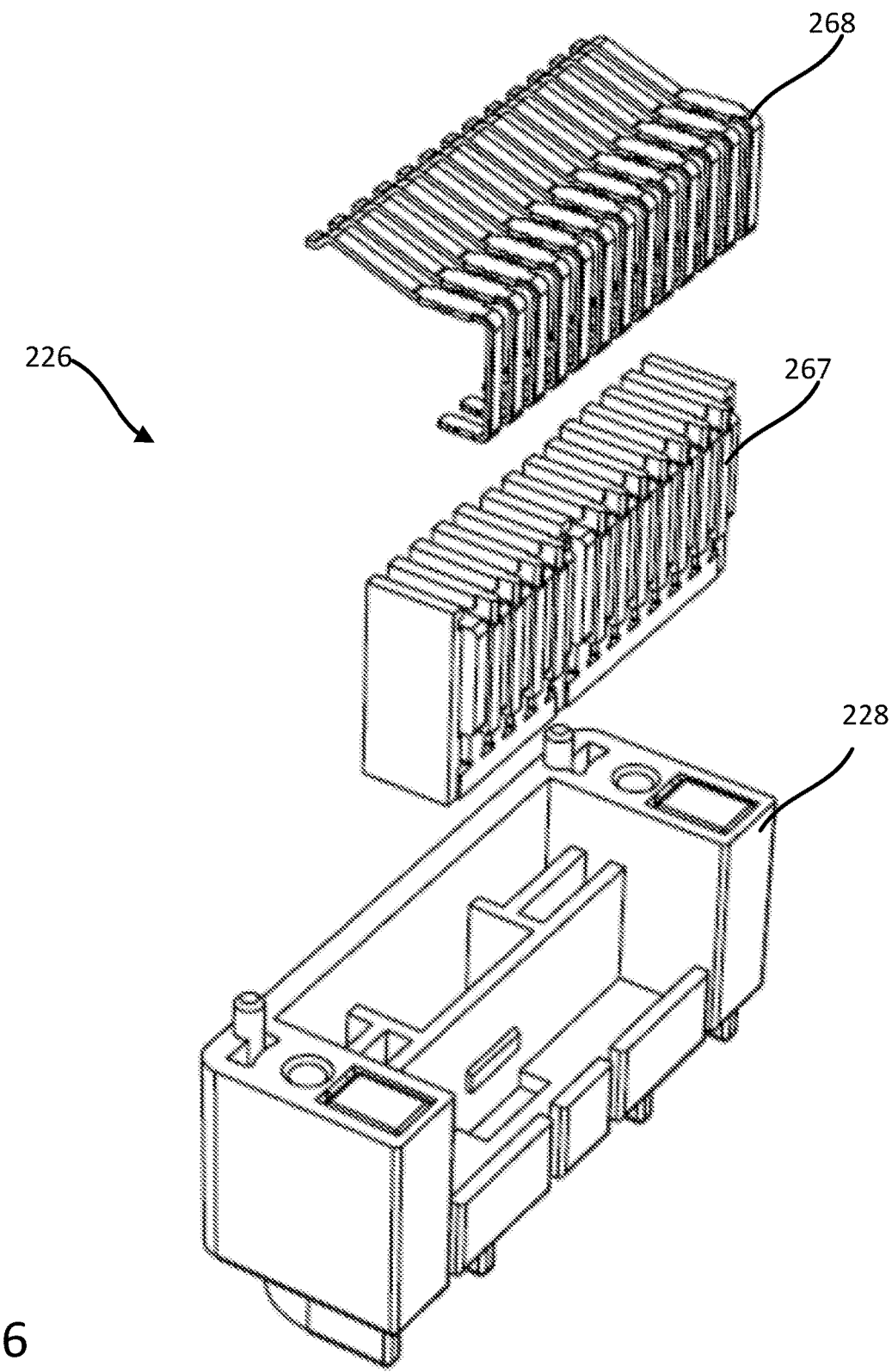
FIG. 16 is a partial exploded perspective view of the connector of FIG. 14, showing the contact assembly exploded.
Figure 17:
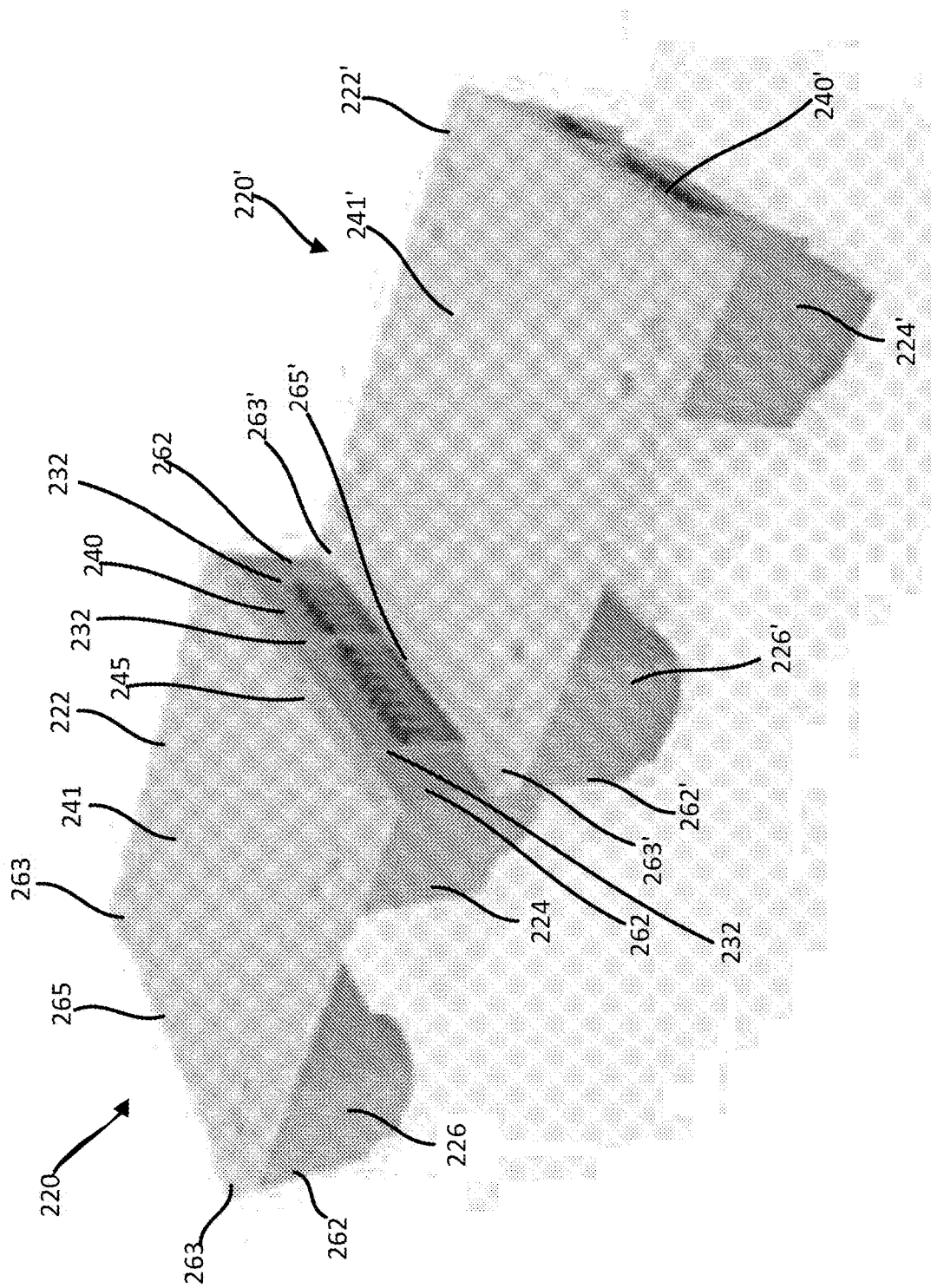
FIG. 17 is a perspective view of the module of FIGS. 2 and 3 shown being coupled to another module of the electronic building block system.
Figures 18A, 18B:
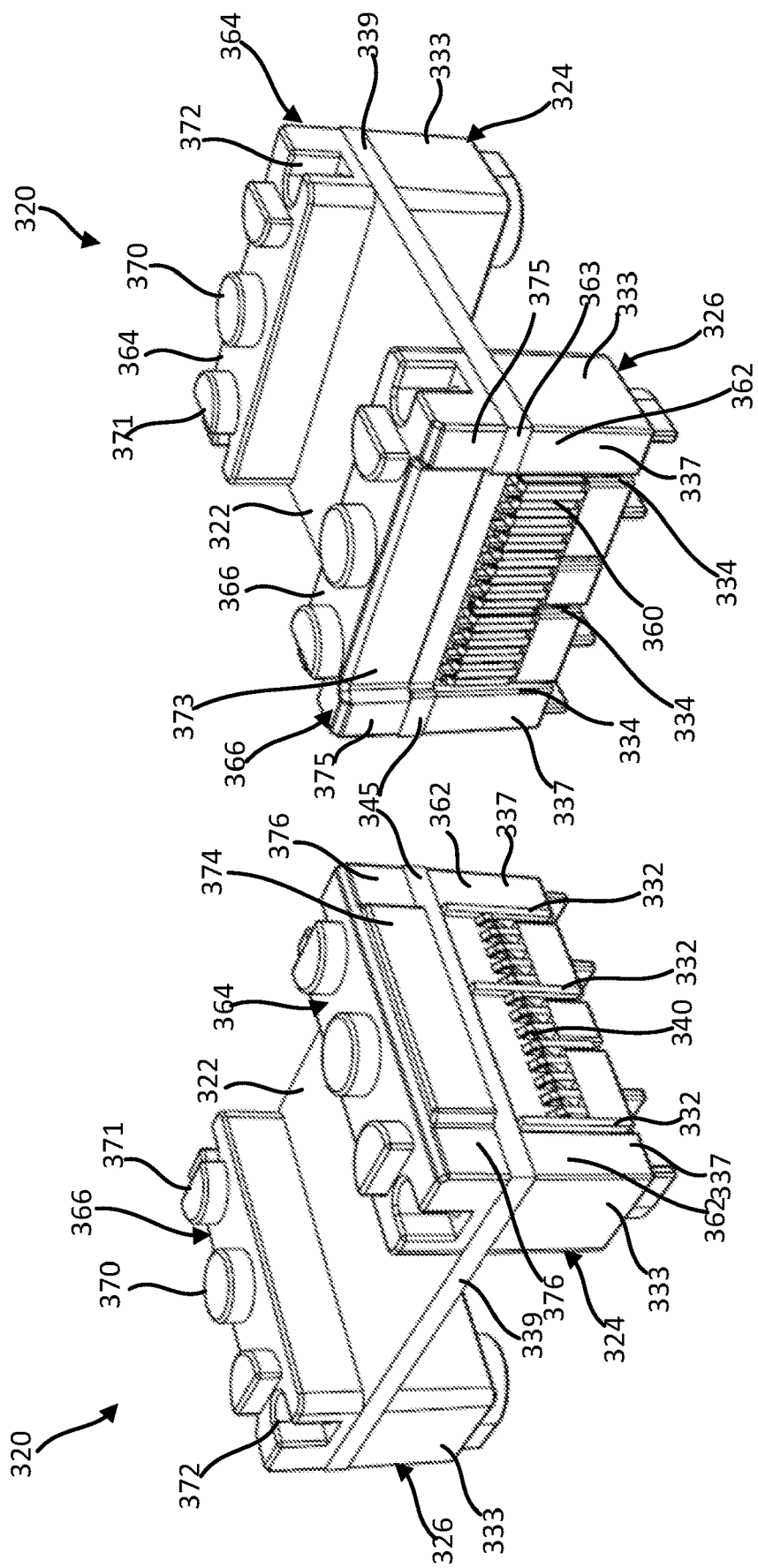
FIG. 18A is a perspective view of a first end of a module of an electronic building block system, according to another embodiment.
FIG. 18B is a perspective view of a second opposite end of the module of FIG. 18A.
Figure 20A:
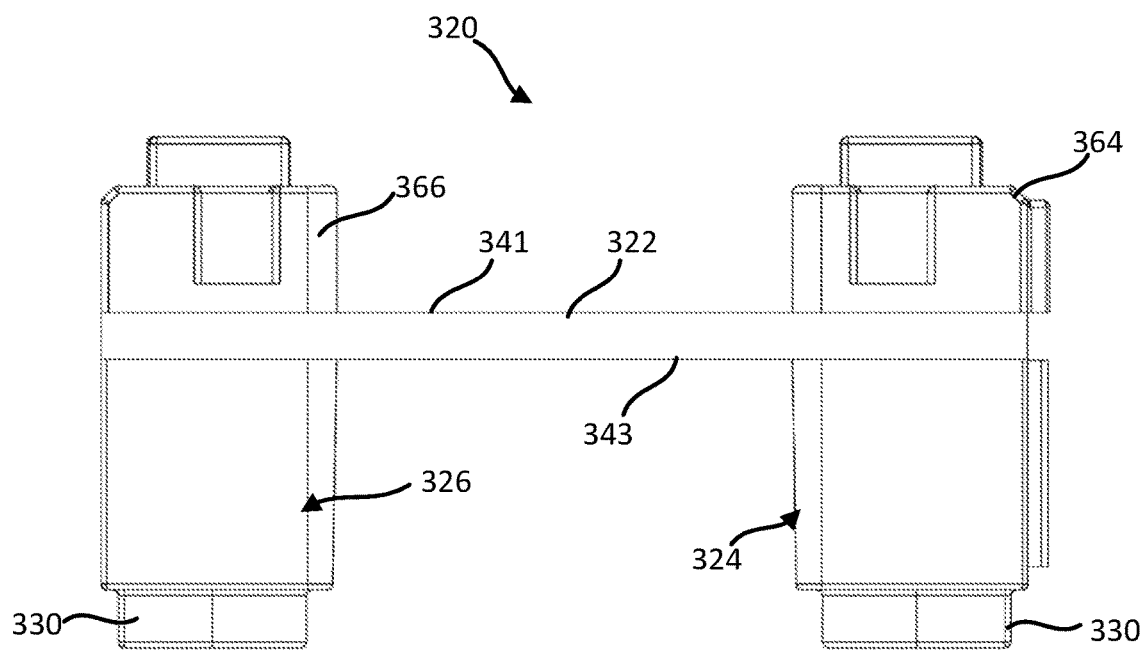
FIG. 20A is a side view of the module of FIGS. 18A and 18B.
Figure 20B:
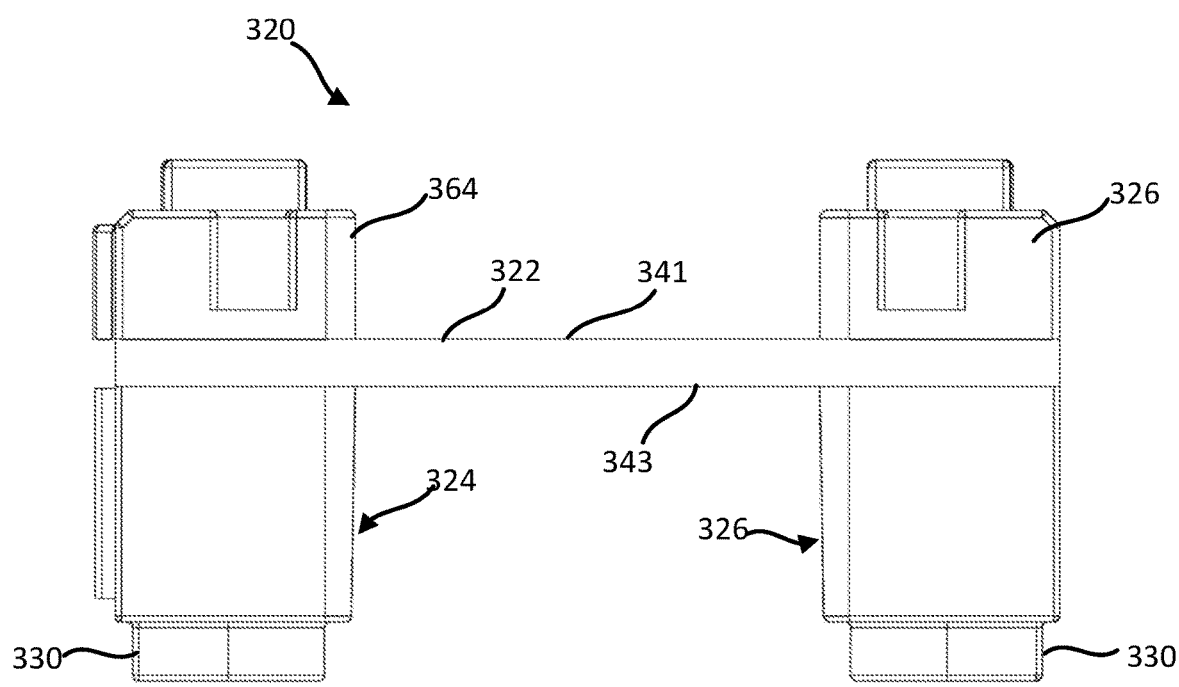
FIG. 20B is a side view opposite the side view of FIG. 20A of the module of FIGS. 18A and 18B.

FIGS. 2-17 illustrate components of another embodiment of a modular electronic building system. A modular electronic building block system 200 (also referred to herein as "system", "block system" or "electronic building block system" or "electronic building system") can include one or more electronic modules 220 (also referred to herein as "modules," "blocks," or "electronic blocks") that can each be removably coupled to at least one other module 220 (see, e.g., FIG. 17 illustrating two modules 220 being coupled together).

A single module 220 is described with respect to FIGS. 2-17, but it should be understood that other modules of the system 200 can have the same or similar components and be coupled to another module in the same manner as described for module 220. Further, although not shown in FIGS. 2-17, the modules 220 of the system 200 can each include one or more electrical components (e.g., electrical components 135) as described above for system 100 that can each provide a module 220 with a particular functionality, and include various categories and types of modules as described above. For example, the system 200 can include a power module 220 and when the power module 220 is removably coupled to another module 220 having an electrical component, the power module 220 can provide power to that other module 220. The electrical component(s) can be, for example, coupled to the circuit board 222 (e.g., to a top surface 241 of the circuit board 222).

The module 220 includes a printed circuit board 222 (also referred to as "PCB" or "circuit board") coupled to a first connector or connector portion 224 and a second connector or connector portion 226. The circuit board 222 can include various associated electronic or electrical components to perform various desired functions, and include an input interface and an output interface. The circuit board 222 can also have various lengths and widths other than those shown with respect to FIGS. 2-17.

The connectors 224 and 226 (also referred to herein as connector portions) each include a common housing 228 (i.e., same shape and size) that can be fixedly or permanently coupled to the circuit board 222 with, for example, a mechanical fastener (e.g., bolt, screw, rivet, etc.) (not shown). For example, the circuit board 222 includes or defines openings 236 and the connectors 224 and 226 can each define corresponding openings 257 (see e.g., FIGS. 10A, 11 and 12) that can receive a fastener (not shown) therethrough to secure the circuit board 222 to the connectors 224 and 226. The circuit board 222 also defines openings 238 that can receive a locating pin 252 of the connectors 224 and 226 (see e.g., FIGS. 10A, 10B, 11 and 12). The locating pins 252 can help position the circuit board 222 during assembly.

As described above for the previous embodiment, the circuit board 222 is coupled to the connectors 224 and 226 such that a bottom surface 243 of the circuit board 222 contacts a top surface 255 of the housing 228 of the connectors 224 and 226. When coupled to the circuit board 222, the connectors 224 and 226 are disposed below or beneath the circuit board 222. In addition, a side surface 239 of the circuit board 222 is aligned or substantially aligned with a side surface 233 of the connectors 224 and 226, and a front or end surface 245 of the circuit board 222 is aligned or substantially aligned with a front surface 237 of the connectors 224 and 226. As described herein, reference to the side surface 233 of the connectors 224 and 226 also refers to a side surface 233 of the common housing 228 of the connectors 224 and 226, and the front surface 233 of the connectors 224 and 226 also refers to a front surface 233 of the common housing 228 of the connectors 224 and 226.

Figure 2:
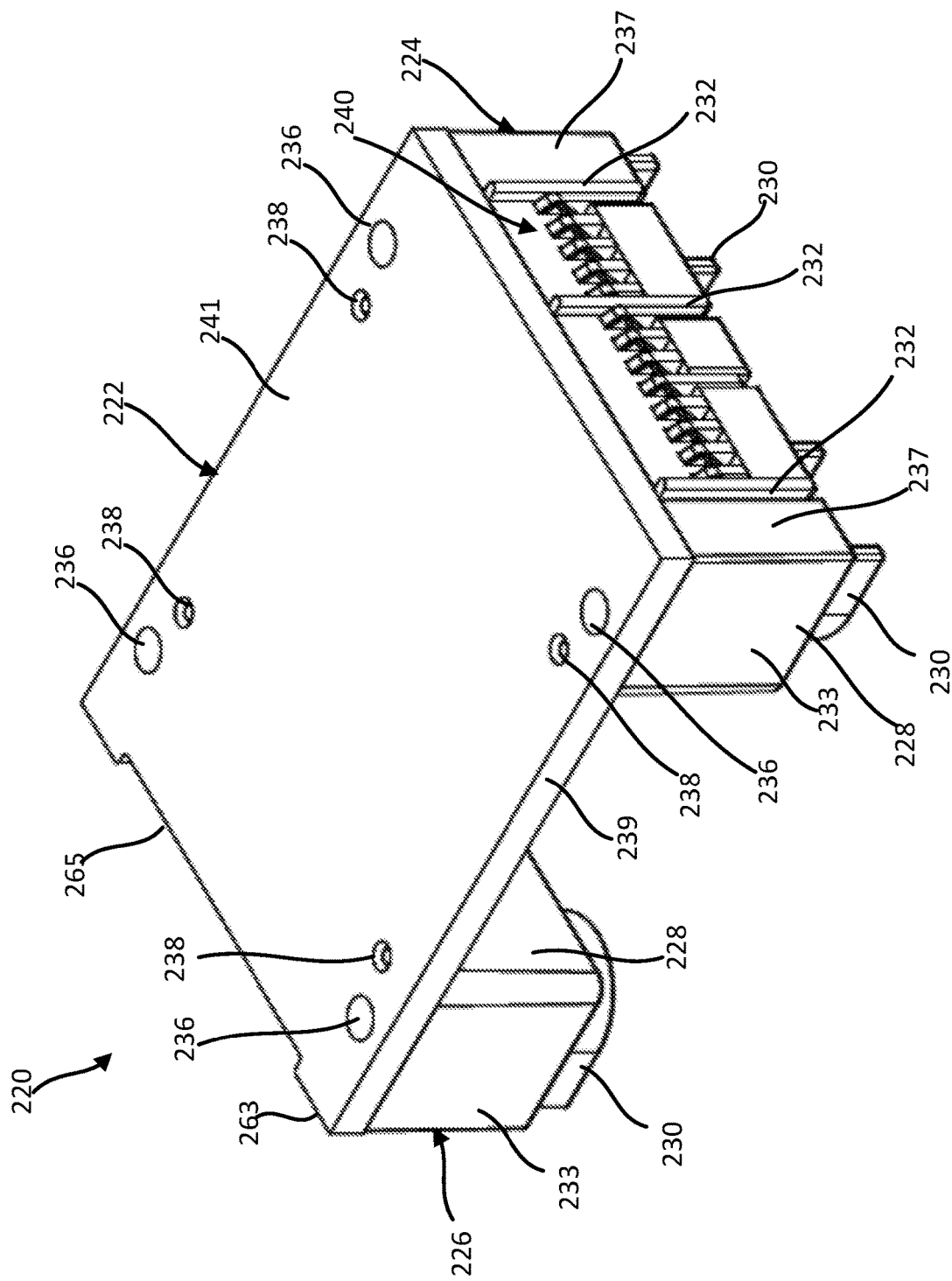
FIG. 2 is a perspective view of a first end of a module of an electronic building block system, according to another embodiment.
Figure 3:
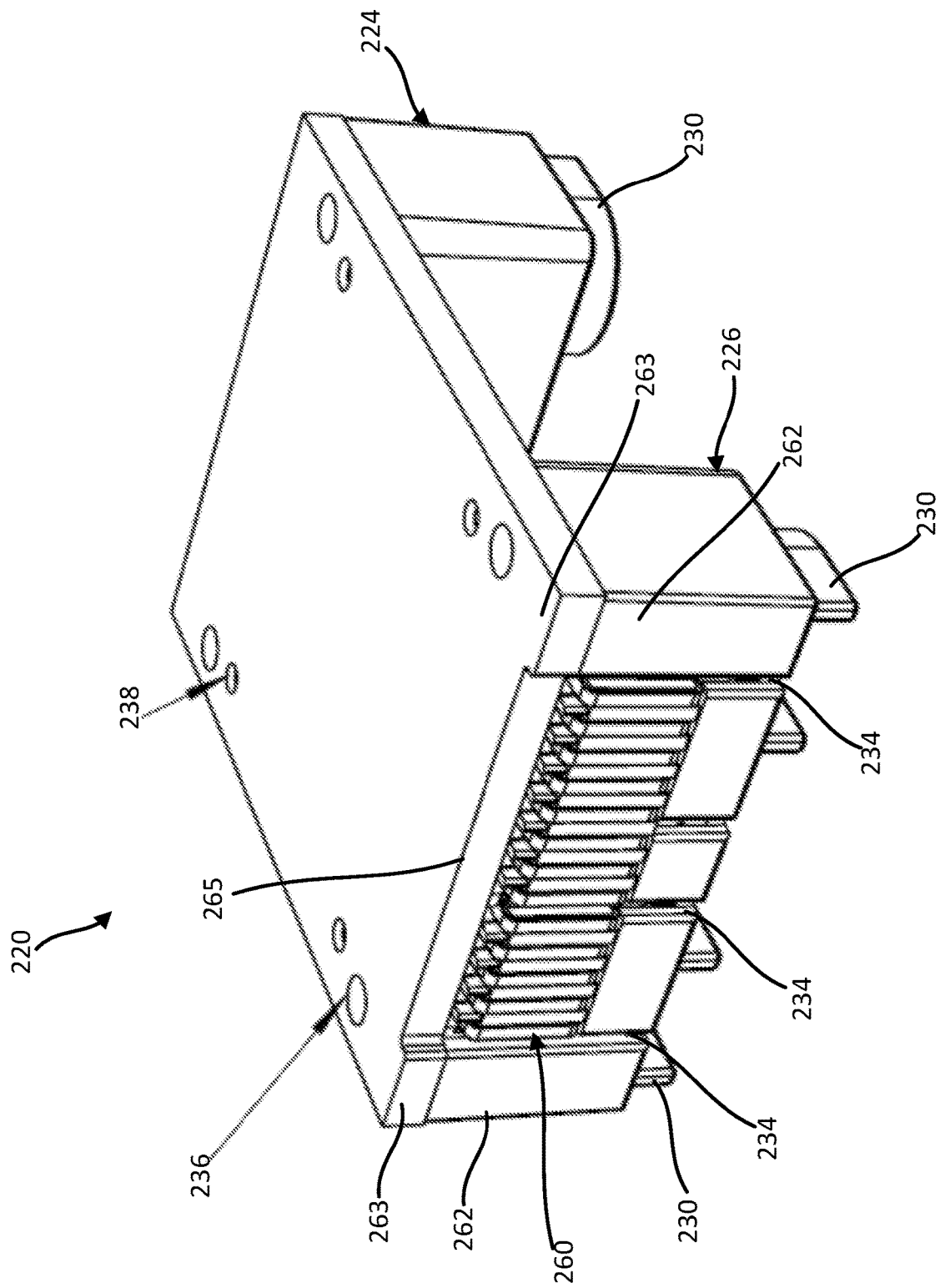
FIG. 3 is a perspective view of a second end opposite the first end of the module of FIG. 2.
Figure 5B:
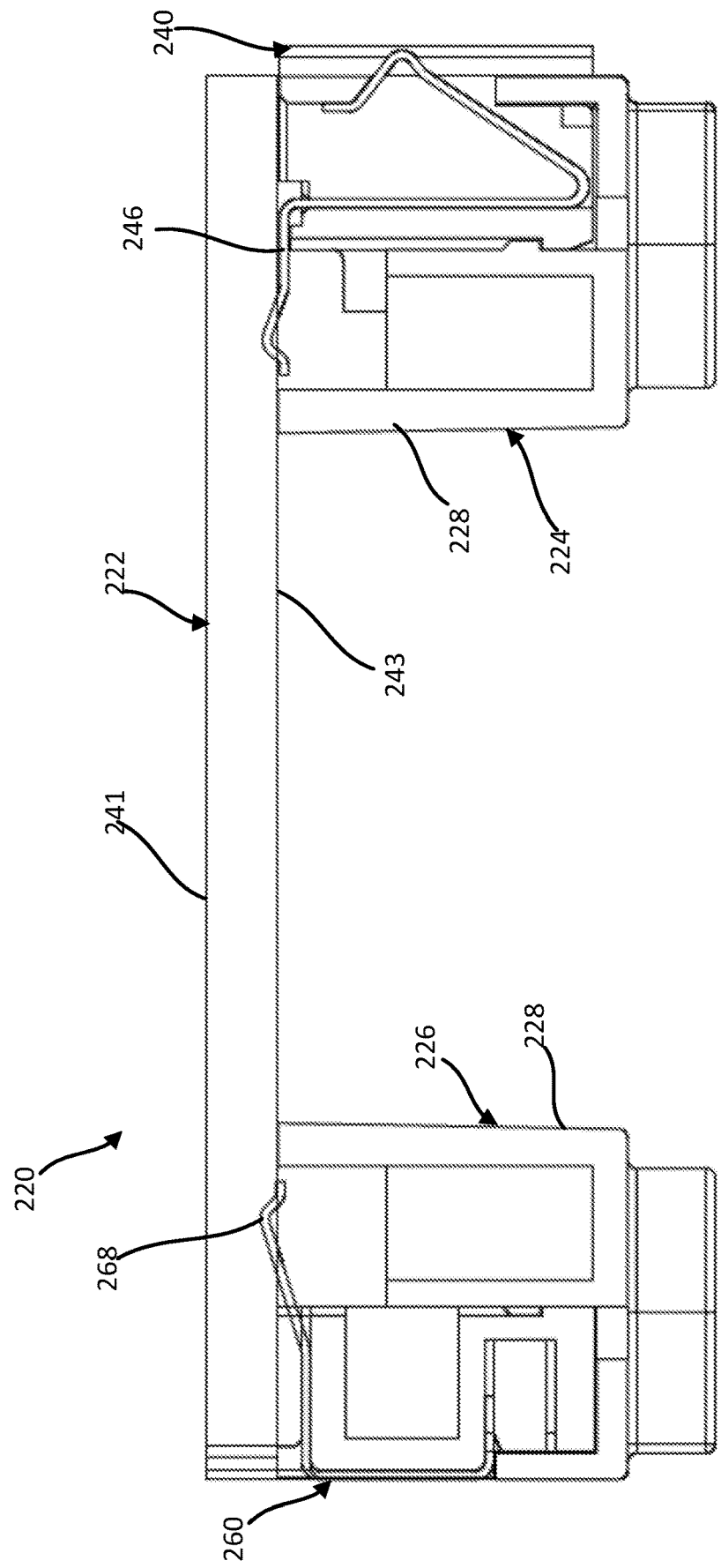
FIG. 5B is a side cross-sectional view of the module of FIG. 5A taken along line 5B-5B in FIG. 5A.
Figure 8:
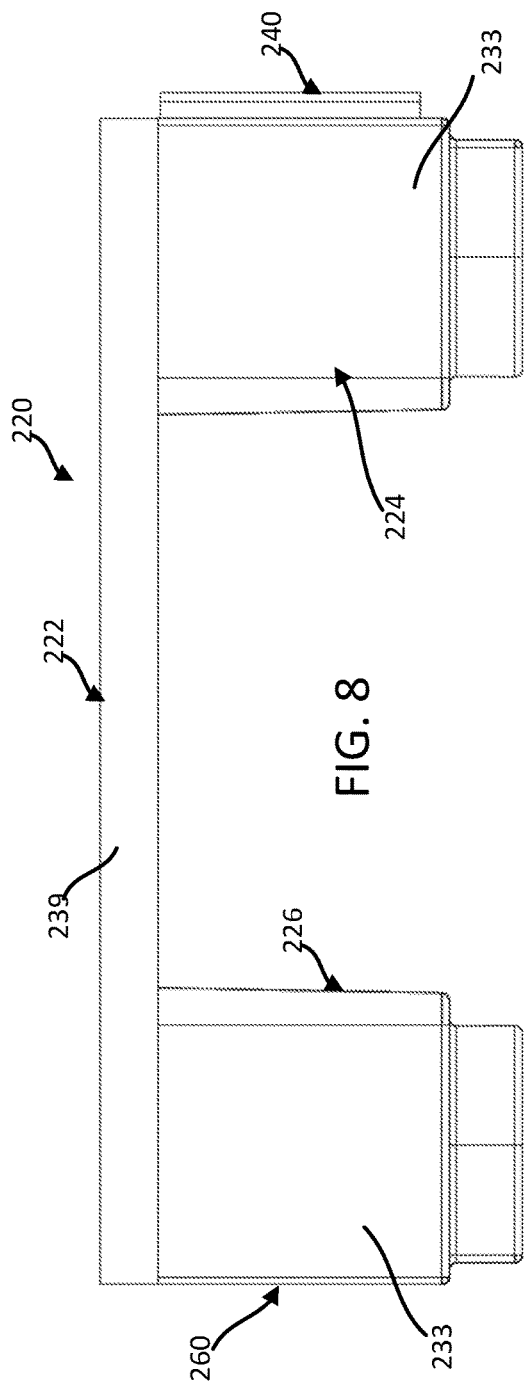
FIG. 8 is a side view of the module of FIGS. 2 and 3.
Figure 9:
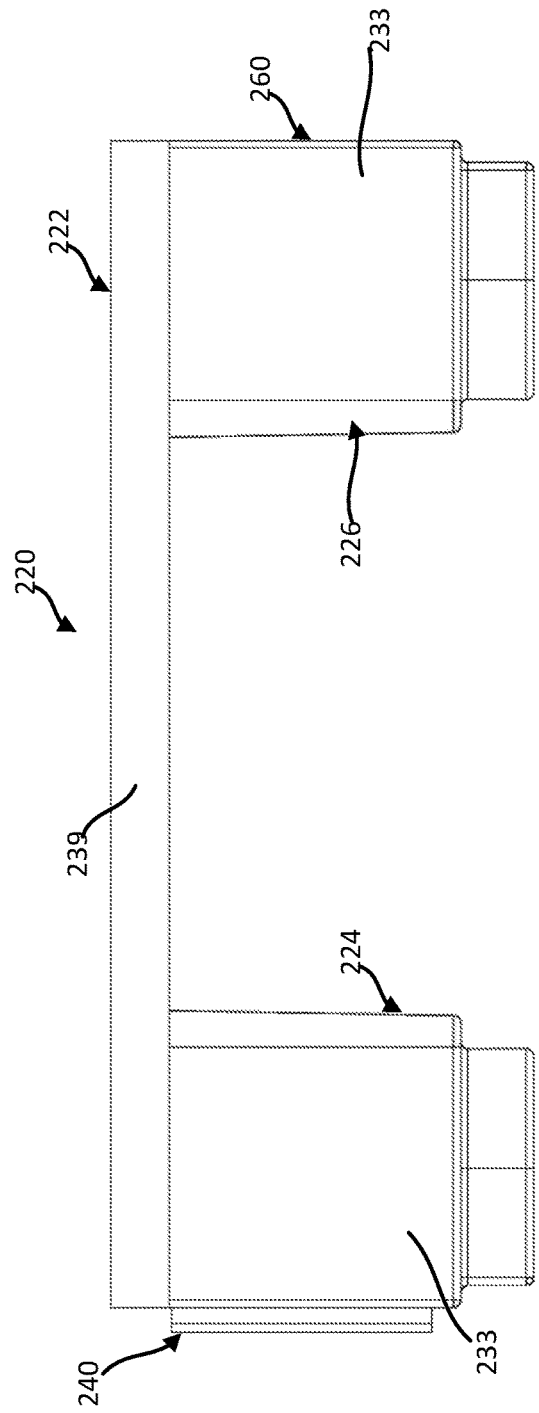
FIG. 9 is an opposite side view than FIG. 7 of the module of FIG. 3.
Figure 10A:
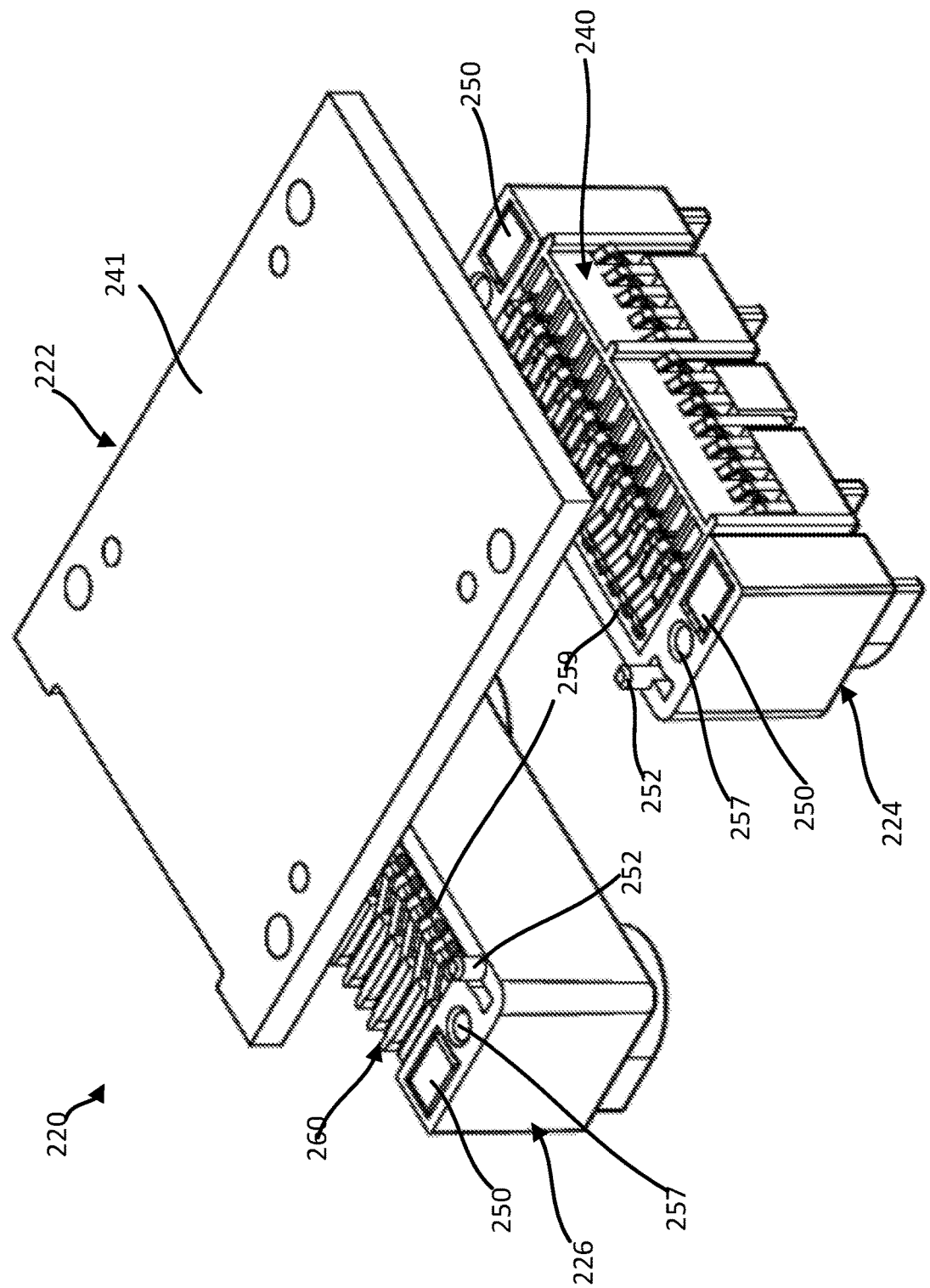
FIG. 10A is a partial exploded perspective view and FIG. 10B is a partial exploded side view of the module of FIGS. 2 and 3 showing the circuit board detached from the connectors.
Figure 10B:
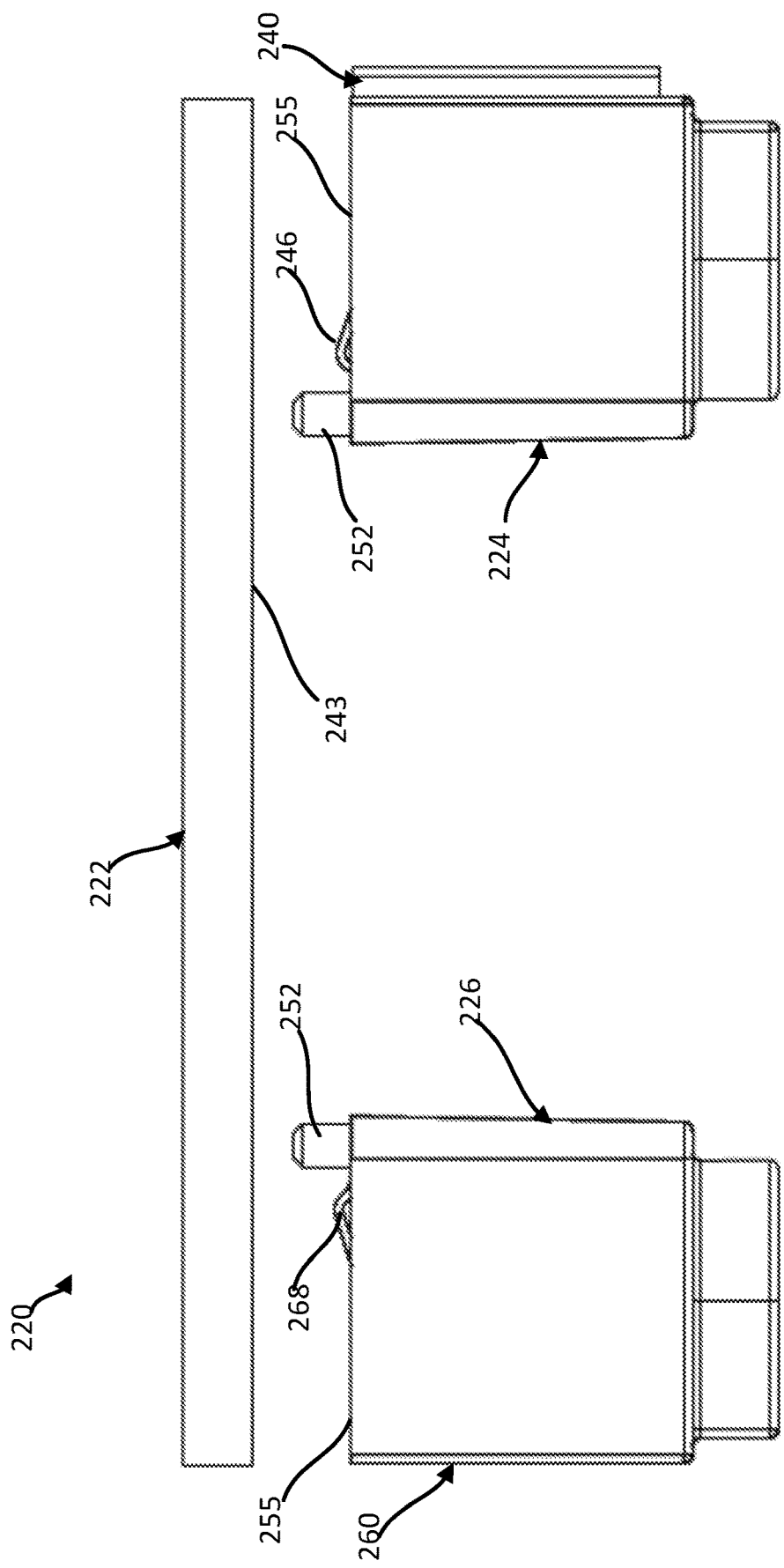

The circuit board 222 further includes a cut-out portion 265 and two extension portions 263 as best shown in FIGS. 2, 3 and 5A. The extension portions 263 are shaped and sized to align with extension portions 262 of the housing 226 of connector 226 as best shown in FIG. 3. The extension portions 262 and 263 can be used to couple the connector 226 of a first module 220 to a connector 224 of a second module 220 as described in more detail below.

The common housing 228 defines two receptacles 256 (see, e.g., FIG. 12) that can each receive therein a magnet 250 (see, e.g., FIGS. 10A, 11-13). The receptacles 256 can have an open end at the top surface 255 of the housing 228 and a closed bottom end. Thus, when a magnet 250 is disposed within a receptacle 256, the magnet 256 can rest on a bottom surface at the closed end of the receptacle 256. The magnets 250 can be used to removably couple each of the connectors 224 and 226 to a connector of a different module 220 of the system 200. For example, with the magnets 250 disposed within the receptacles 256, a magnetic force can be applied/transferred through the front surface 237 of the housing 228 of the connectors 224 and 226. Thus, the connectors 224 and 226 can each be removably coupled to another connector of another module 220 through magnetic force when the front surface 237 of the connectors 224 and 226 engages/contacts a front surface 237 of another connector (similarly constructed with magnets 250 disposed within receptacles 256). In other words, the connectors 224 and 226 will be magnetically coupled to the other connectors via magnetic force of the magnets 250.

As described above, the magnets 250 of one connector (e.g., 224) of the module 220 can have the north face of the magnet(s) facing out and the other connector (e.g., 226) of the module 220 can have the south face of the magnet(s) facing out. The repelling polarities inhibit the magnets 250 from one connector (e.g., 224, 226) connecting to another connector (e.g., 224, 226) in an inappropriate manner to facilitate connecting of the modules in the correct manner. For example, a connector with a magnet 250 with the north face of the magnet facing outward cannot be coupled to another connector with a magnet 250 with the north face of the magnet facing outward.

Figure 13:
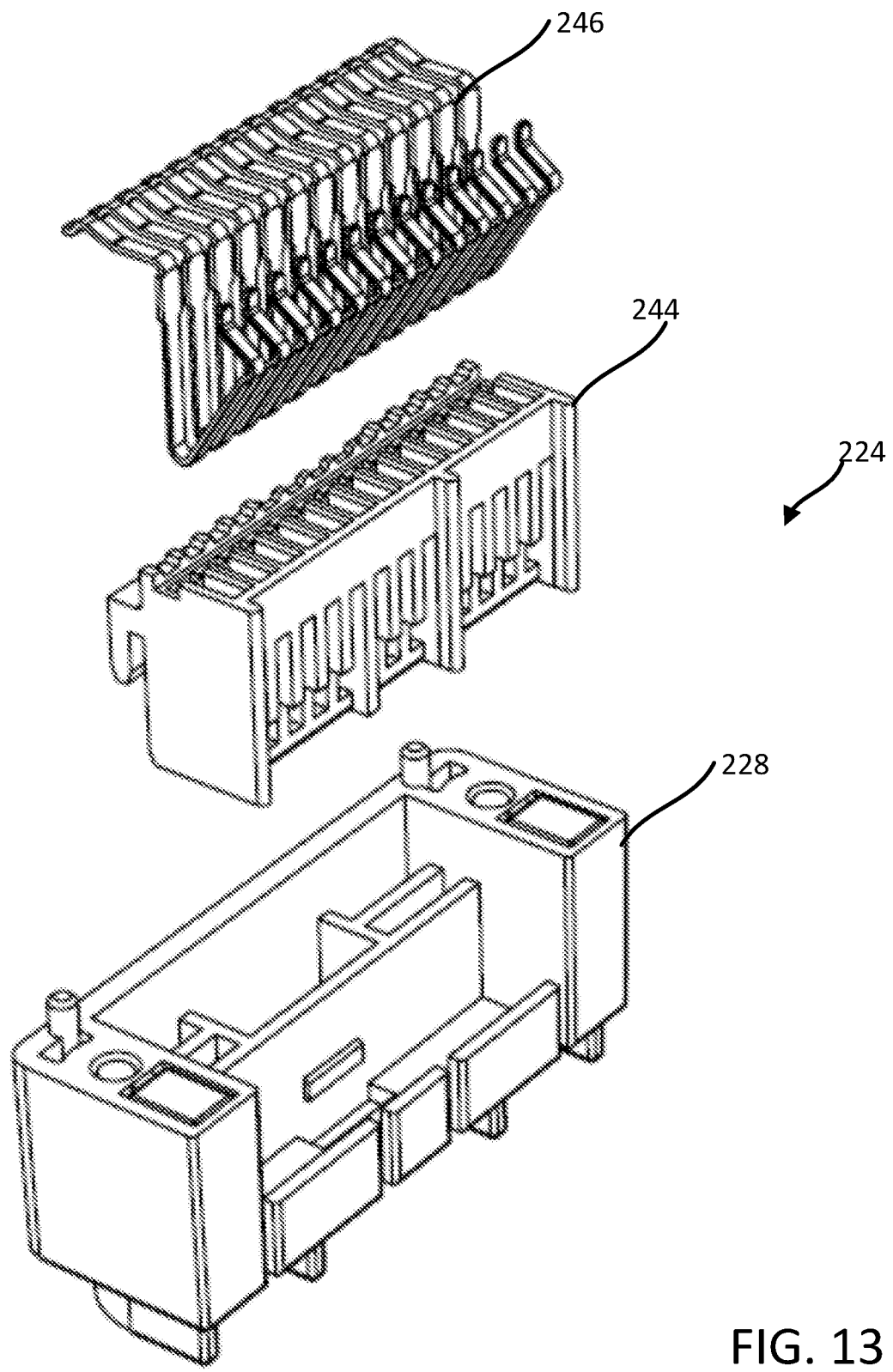
FIG. 13 is a partial exploded perspective view of the connector of FIG. 11, showing the contact assembly exploded.
Figures 14, 15:
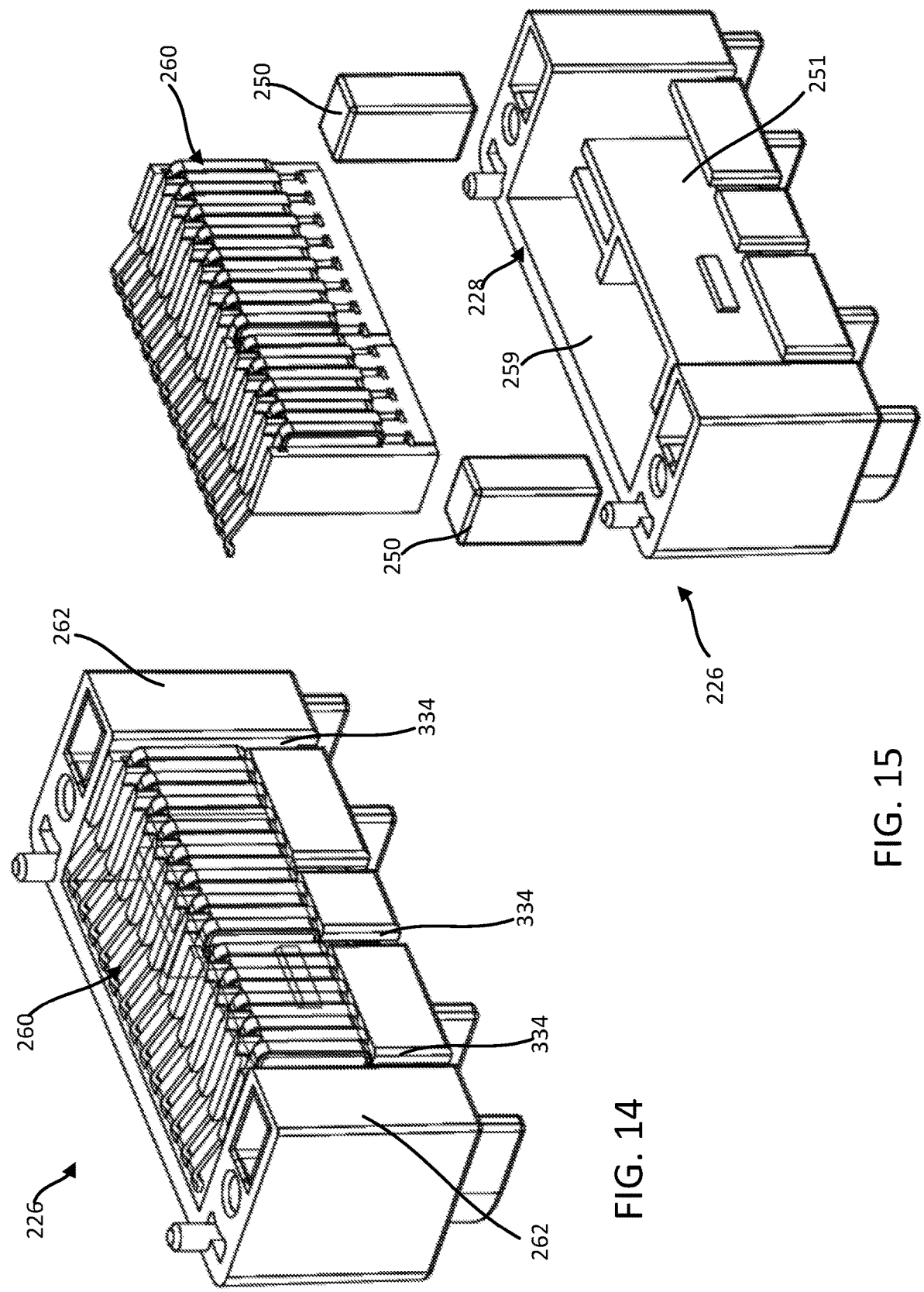
FIG. 14 is a perspective view of a second connector of the module of FIGS. 2 and 3.
FIG. 15 is a partial exploded perspective view of the connector of FIG. 14, showing the contact assembly and magnets detached from the connector.

The module 220 further includes a first contact assembly 240 that is coupled to the connector 224 and a second contact assembly 260 that is coupled to the connector 226. The first contact assembly 240 includes a base 244 and multiple electrical contacts or conductors 246 coupled to the base 244 as best shown in FIGS. 11-13. The second contact assembly 260 includes a base 267 and multiple electrical contacts or conductors 268 as best shown in FIGS. 14-16. The contacts 246 and the contacts 268 can be, for example, spring probes or a small metal plate(s). In this embodiment, there are 13 contacts 246, and 13 contacts 268, but it should be understood that a different number of contacts 246 and/or a different number of contacts 268 can be used. The contacts 246 are coupled to the base 244 through engagement with the base 244, without the use of a solder connection. Similarly, the contacts 268 are coupled to the base 267 through engagement with the base 267, without the use of a solder connection.

The first contact assembly 240 can be fixedly or permanently or fixedly connected to the connector 224 and to the circuit board 222 without the use of a solder connection between the contacts 246 of the contact assembly 240 and the circuit board 222 or housing 228 of the connector 224. Similarly, the second contact assembly 260 can be fixedly or permanently connected to the connector 226 and to the circuit board 222 without the use of a solder connection between the contacts 268 of the contact assembly 260 and the circuit board 222 or housing 228 of the connector 226. For example, the contact assemblies 240 and 260 can be coupled to the connectors 224 and 226, respectively, and the circuit board 222 can be coupled to the connectors 224 and 226 such that the contact assemblies 240 and 260 are disposed between at least a portion of the connectors 224, 226 and the circuit board 222. Thus, when the circuit board 222 is coupled to the connectors 224, 226, the contact assemblies 240 and 260 can be maintained permanently coupled to the connector 224, 226 with, for example, a pressure fit.

More specifically, the contact assembly 240 is positioned within an open region 251 of the housing 228 of connector 224, as shown, for example, in FIGS. 11 and 12. When disposed within the housing 228 of connector 224, a top or upper portion of the contacts 246 extend within an upper open region 259 of the housing 228 and extend upwardly from a top surface 255 of the housing 228 of connector 224 (see, e.g., FIGS. 10A, 10B and 11), and a front portion of the contact assembly 240 extends outwardly from the front surface 237 of the connector 224 (see, e.g., the side view of FIG. 8). Similarly, the contact assembly 260 is positioned within the open region 251 of the housing 228 of connector 226, as shown, for example, in FIGS. 14 and 15. When disposed within the housing 228 of connector 226, a top or upper portion of the contacts 268 extends within the upper open region 259 of the housing 228 (see, e.g., FIGS. 10A, 10B and 11) and upwardly from a top surface 255 of the housing 228 of connector 226 as best shown in the partially exploded side view of FIG. 10B. A front portion of the contact assembly 260 extends outwardly from the front surface 237 of the connector 226 (see, e.g., the side view of FIG. 9)

With the magnets 250 disposed within the receptacles 256 of the housing 228, and the circuit board 222 permanently coupled to the housing 228 of the connector 224 (via fasteners within openings 238 and 254) and to the housing 228 of connector 226 (via fasteners within openings 238 and 254), the top portion of the contacts 246 of contact assembly 240 contact and electrically engage the circuit board 222, and the top portion of the contacts 268 contact and electrically engage the circuit board 222. With the circuit board 222 permanently coupled to the housings 228 of the connectors 224, 226, both contact assemblies 240 and 260 are maintained permanently coupled to the connectors 224 and 226, respectively, with a pressure fit. The magnets 250 are also maintained within the receptacles 256 when the circuit board 222 is coupled to the connectors 224, 226. Thus, the contact assemblies 240, 260, and the magnets 250 are permanently coupled to the connectors 224, 226 and to the circuit board 222 without the use of a solder connection between contacts 246, 268 and the circuit board 222 or housings 228. As shown, for example, in FIGS. 2-5A, 8 and 9, when the module 220 is assembled with the circuit board 222 coupled to the connectors 224 and 226, a portion of the contact assembly 240 extends outwardly from the front surface 237 of the housing 228 of connector 224 and a portion of the contact assembly 260 extends outwardly from the front surface 237 of the housing 228 of the connector 226. In addition, because of the cut-out portion 265 of the circuit board 222, a portion of the contact assembly 260 extends outwardly from a front surface 245 of the circuit board 222, as shown, for example, in FIGS. 3 and 5A.

In addition to the magnets 250 to removably couple a connector of a first module 220 to a connector of a second module 220, the connectors 224 and 226 also include an interlocking coupling mechanism. More specifically, in this embodiment, the contact assemblies 240 and 260 provide the interlocking coupling mechanism. The base 244 of the contact assembly 240 includes multiple elongate protrusions 232, and the base 267 of the contact assembly 260 defines at least in part multiple elongate recesses 234. More specifically, two recesses 234 that are disposed adjacent or proximate the extension portions 262 of the housing 228 are defined collectively by the contact assembly 260 and the housing 228 of the connector 226 (when coupled together). The inner recess 234 is defined by the contact assembly 240. The protrusions 232 of a connector 224 of a first module 220 can be received within recesses 234 of a connector 226 of a second module 220. The interlocking (or mating, or complimentary fit) of the protrusions 232 and recesses 234 can inhibit two modules 220 from sliding laterally or side-to-side with respect to each other when removably coupled together. The two outermost protrusions 232 (the two protrusions 232 closest to the extension portions of the housing 228) of the contact assembly 240, together with the extension portion 262 of the housing 228 of the connector 224, provide a guide to help in the removable coupling of a first module 220 to a second module 220. For example, when removably coupling a connector 224 of a first module 220 to a connector 226 of a second module 220, the extension portions 262 of the connector 226 and the extension portions 263 of the circuit board 222 of the second module 220, can slidably engage in a vertical direction the extension portions 262 of the connector 224 and the extension portions 263 of the first module 220 and the outermost protrusions 232 can help guide and position the vertical insertion of the connector 226 to the connector 224. For example, as shown in FIG. 17, to couple a connector 224 of a first module 220 to a connector 226' of a second module 220', the protrusions 232 of the first module 220 can be slidably received in a vertical direction within the recesses (not visible in FIG. 17) of the second module 220', and the extension portions 262' and 263' of the second module 220' can slidably mate with and contact the extension portions 262 of connector 224 and the end surface 245 of circuit board 222 in a vertical direction using the outermost protrusions 232 (closest to the extension portions 262 of connector 224) to guide the slidable coupling of the connector 224 to the connector 226'. FIG. 17 illustrates the first module 220 in a partial insertion position relative to the second module 220'. To fully couple the first module 220 to the second module 220', the first module 220 would continue to be vertically and slidably coupled to the second module 220' until, for example, the top surfaces 241 and 241' of the circuit boards 222 and 222', respectively, are substantially aligned in the same plane. Further, as the first module 220 and second module 220' are being coupled, the respective magnets of each module 220, 220' will help align the connectors 224, 226'. Thus, the modules 220 can be removably coupled together through vertical insertion of one connector of a first module 220 to another connector of a second module 220. In a further example, because of the vertical insertion capability, a second module can be inserted/coupled between a first module and a third module. In other words, if a series of modules are coupled together and it is desired to remove and replace a module between two other modules, that module can be removed vertically and a new module can be inserted in its place by inserting it vertically as described above with reference to FIG. 17.

As described above, the connectors 224, 226 of the module 220 can each be coupled to a different connector of another module 220 with the magnets 250, and the interlocking coupling mechanism (e.g., protrusions 232 and recesses 234) can further help maintain the connectors of the different modules coupled together. When the module 220 is removably coupled to another module 220 via the magnets 250 of the connectors 224 or 226, a front surface 237 of the connectors 224, 226 of the module 220 contacts a front surface 237 of the connector of the other module 220. Further, when the module 220 is removably coupled to a another module 220 via the magnets 250 of the connectors 224 or 226, a side surface 233 of the connector 224 or 226 of the module 220 is aligned or substantially aligned with a side surface of the connector of the other module 220.

In addition, when a connector 224 of a first module 220 is removably coupled to a connector 226 of a second module 220, the contact assembly 240 of the connector 224 electrically engages the contact assembly 260 of the connector 226, and thus, electrically couples the first module 220 to the second module 220. For example, as a first module 220 and second module 220 are being coupled in a vertical direction as described above, the contacts 246 of the contact assembly 240 will engage the contacts 268 of the contact assembly 260 in a wiping motion and at least one of the contacts 246 and the contacts 268 can flex upon contact/engagement with the other. The contact assembly 240 can then carry a signal from the circuit board 222 of the first module 220 to the circuit board 222 of the second module 220 and vice versa.

Although a first module 220 and second module 220 are described above as being coupled in a vertical direction, it is possible to couple a first module 220 and a second module 220 together in a lateral direction. For example, the protrusions 232 of a connector 224 of a first module 220 can be inserted laterally into the recesses 234 of a connector 226 of a second module, and the extension portions 262 and 263 of the connector 226 of the second module 220 can be placed laterally into contact/engagement with the extension portions 262 of connector 224 and end surface 245 of circuit board 222 of the first module 220. In doing this, the magnets 250 of the first module 220 and the magnets 250 of the second module 220 will magnetically couple the first module 220 and second module 220 together and help align the first module 220 and the second module 220 to each other. In such a case, the vertical wiping between the contacts 246, 268 of the corresponding contact assemblies 240, 260, respectively, would not occur, but the contacts 246 and 268 would engage and compress each other to electrically couple the first module 220 to the second module 220

Figure 23:
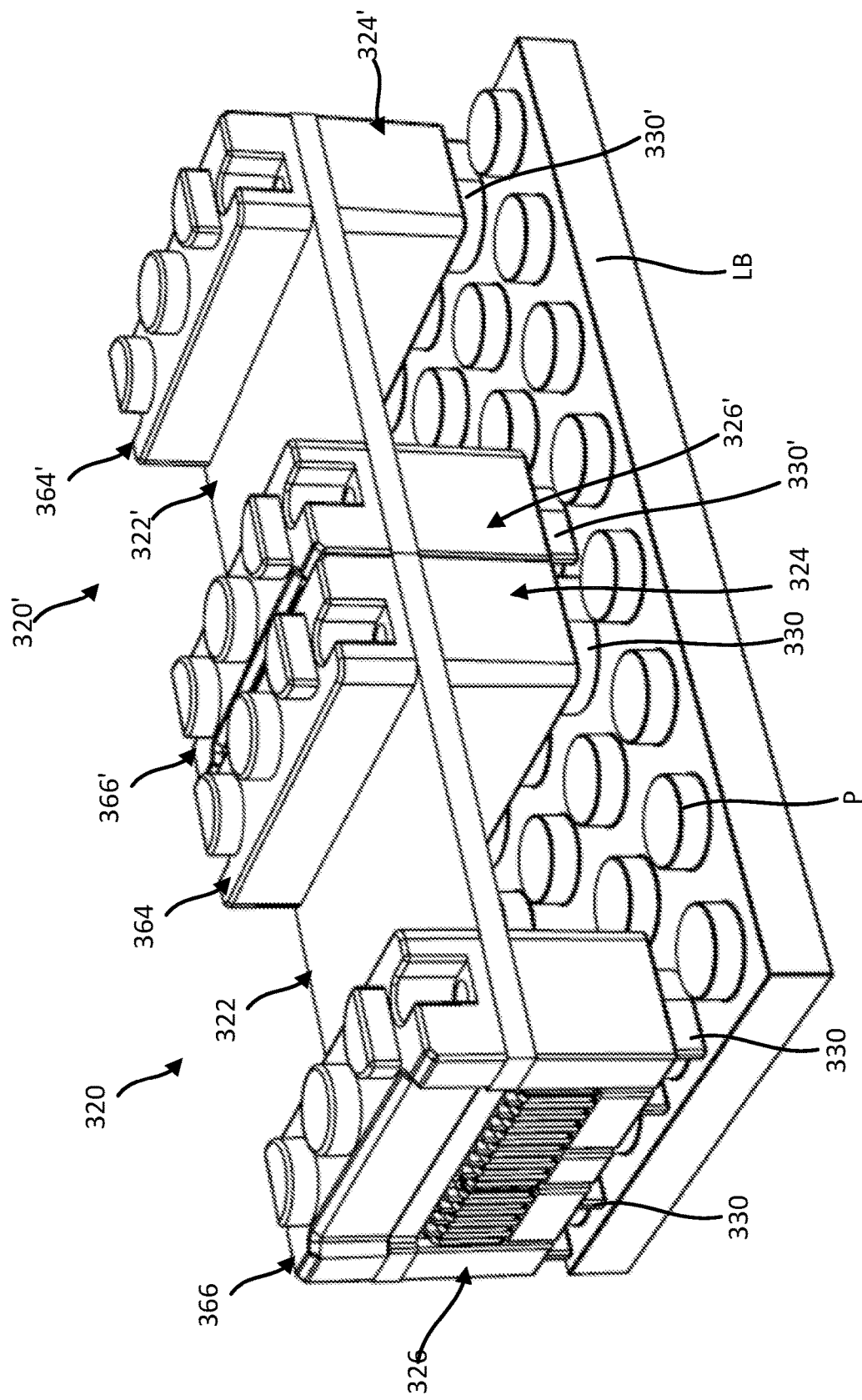
FIG. 23 is a perspective view of the modules of FIG. 22 shown coupled together and coupled to a component of a different building block system.

As described above for the previous embodiment, the module 220 can also be used or interconnected with a component of a different building block system, such as a LEGO® block system. More specifically, each connector 224, 226 includes mounting portions 230 that can be used to removably couple the module 220 to such a component of a different building block system (see, e.g., FIG. 23 illustrating modules 320, 320' coupled to a LEGO® block LB). In this embodiment, the mounting portions 230 are substantially u-shaped and define a recessed area, as best shown in the bottom view of FIG. 4. The recessed area of the mounting portions 230 can matingly couple to, for example, a protrusion or post P of a LEGO® block LB (see, e.g., posts P of block LB in FIG. 23) to removably couple the module 220 to the LEGO® block LB.

Figure 22:
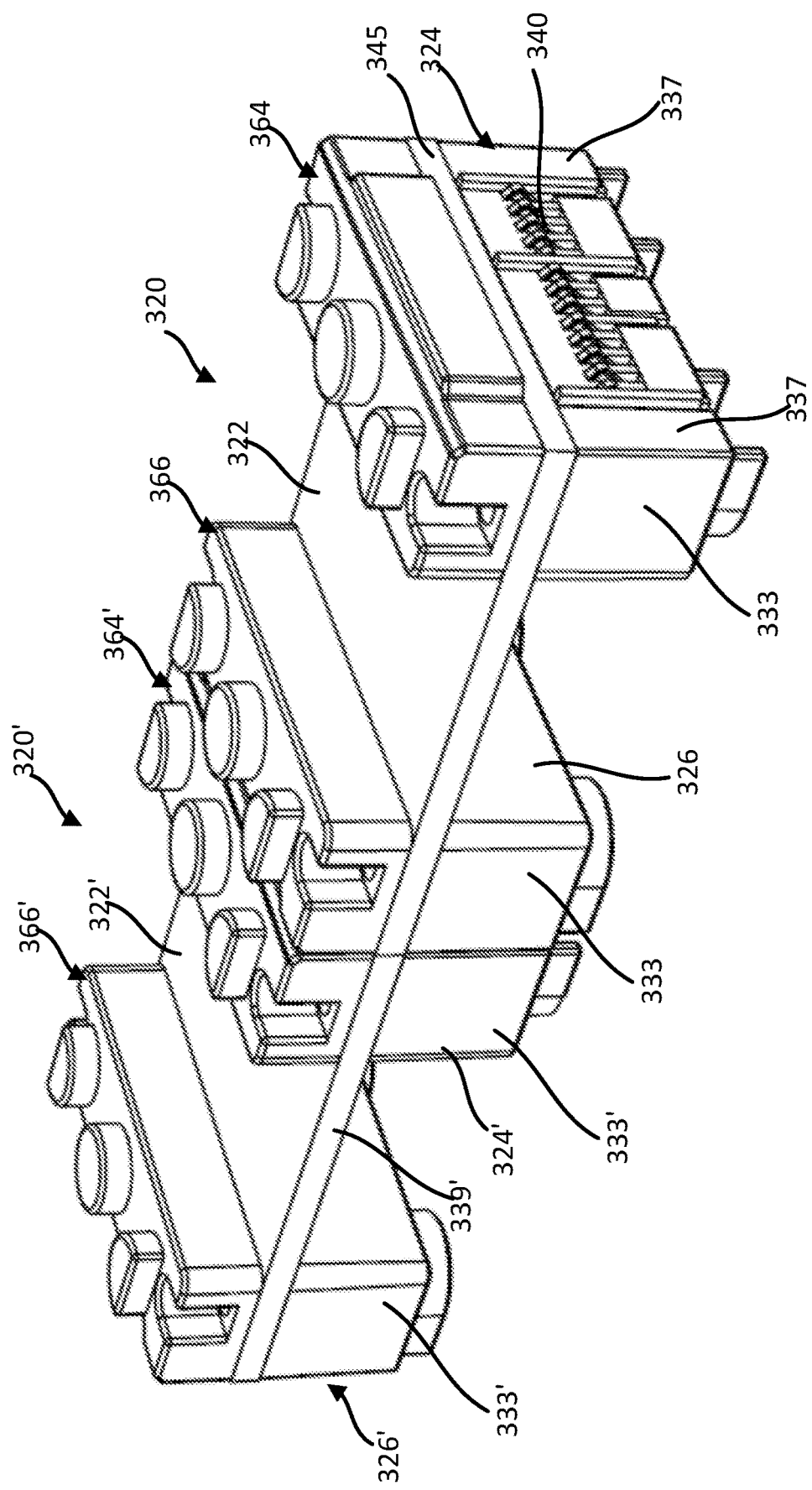
FIG. 22 is a perspective view of the module of FIGS. 18A and 18B shown coupled to another module of the electronic building block system.

FIGS. 18A-23 illustrate components of another embodiment of a modular electronic building block system. A modular electronic building block system 300 (also referred to herein as "system", "block system" or "electronic building block system" or "electronic building system") can include one or more electronic modules 320 (also referred to herein as "modules," "blocks," or "electronic blocks") that can each be removably coupled to at least one other module 320 (see FIG. 22-23 illustrating two modules 320 and 320' coupled together).

The modules 320 can include the same or similar features and can provide the same or similar function(s) as described above for modules 120 and 220, and each module 320 of system 300 can be coupled to another module 320 in the same manner as described for module 220. Thus, some details of the module 320 are not described herein. Further, although not shown in FIGS. 18A-23, the modules 320 of the system 300 can each include one or more electrical components (e.g., electrical components 135) as described above for system 100 that can each provide a module 320 with a particular functionality, and include various categories and types of modules as described above. For example, the system 300 can include a power module 320 and when the power module 320 is removably coupled to another module 320 having an electrical component, the power module 320 can provide power to that other module 320.

The module 320 includes a printed circuit board 322 (also referred to as "PCB" or "circuit board") coupled to a first connector or connector portion 324 and a second connector or connector portion 326. The circuit board 322 can have the same or similar structure and function as the circuit boards 122 and 222 described above. In this embodiment, the module 320 also includes adapters 364 and 366 can be used to couple the module 320 to a component of a different building block system as described in more detail below. The adapters 364 and 366 each includes coupling portions that include a post 370, half-posts 371 and define recessed regions or volumes 372. The recessed regions 372 can provide access to couple the adapters 364 and 366 to the circuit board 322 and connectors 324 and 326 (described below). For example, the same fasteners used to couple the circuit board to the connectors 324 and 326 can be used to couple the adapters 364 and 366 to the circuit board 322. The post 370 and half-posts 371 can be used to matingly couple the module 320 to a component of a different interlocking building block system such as a LEGO® block system, as described in more detail below with reference to FIG. 23.

The adapter 364 is coupled to the circuit board 322 above the connector 324 and the adapter 366 is coupled to the circuit board 322 above the connector 326. The adapter 364 includes an extension portion 374 that extends outwardly from the front surface 345 of the circuit board and side recesses 376. The adapter 366 defines a recessed area 373 that is sized and shaped to align with the size and shape of the recessed or cut-out potion (e.g., cut-out portion 265 described above for circuit board 222) of the circuit board 322, and extension portions 375 that are sized and shaped to align with the extension portions (e.g., 262 of connector 226) of the connector 326 and the extension portions (e.g., 263 of circuit board 222) of the circuit board 322. Thus, when a connector 324 of a first module 320 is coupled to a connector 326 of a second module 320, the extension portion 374 of the connector 322 of the first module 320 can be received within the recess area 373 of the connector 326 of the second module 320, and the extension portions 375 can be received with side recesses 376. In an alternative embodiment, the adapter 364 may not include an extension portion 374. In such an embodiment, clearance can be provided between a front face of the adapter 364 and the recessed area 373 of the adapter 366 when a first module with adapter 364 is coupled to a second module 320 with an adapter 366.

The connectors 324 and 326 (also referred to herein as connector portions) can also be the same as or similar to the connectors 224, 226 described above. For example, each connector 324 and 326 includes a common housing 328 that can be fixedly or permanently coupled to the circuit board 322 with, for example, a mechanical fastener (e.g., bolt, screw, rivet, etc.) (not shown). For example, as described above for module 220, the circuit board 322 can include or define openings (not shown) and the connectors 324 and 326 can each define corresponding openings (not shown) that can receive the fastener therethrough to secure the circuit board 322 to the connectors 324 and 326. The circuit board 322 can also define openings (not shown) that can receive a locating pin (not shown) of the connectors 324 and 326 as described above for module 220.

As with previous embodiments, the circuit board 322 is coupled to the connectors 324 and 326 such that a bottom surface 343 (see, e.g., FIG. 19B, 20A, 20B) of the circuit board 322 contacts a portion of a top surface (not shown) of the housing 328 of each of the connectors 324 and 326. When coupled to the circuit board 322, the connectors 324 and 326 are disposed below or beneath the circuit board 322. In addition, a side surface 339 of the circuit board 322 is aligned or substantially aligned with a side surface 333 of the connectors 324 and 326, and a front or end surface 345 of the circuit board 322 is aligned or substantially aligned with the front surface 337 of the connectors 324 and 326 (see, e.g., FIG. 22).

The common housing 328 defines two receptacles (not shown) that can each receive therein a magnet (not shown) that can be used to removably couple each of the connectors 324 and 326 to a connector of a different module 320 of the system 300. The magnets can be the same as or similar to and function the same as or similar to the magnets described above for modules 120 and 220. For example, with the magnets disposed within the receptacles, a magnetic force can be applied/transferred through a front surface 337 of the housing 328 of the connectors 324 and 326. Thus, the connectors 324 and 326 can each be removably coupled to another connector of another module 320 through magnetic force when the front surface 337 of the connectors 324 and 326 engages/contacts a front surface of another connector (similarly constructed with magnets disposed within a receptacle). In other words, the connectors 324 and 326 will be magnetically coupled to the other connectors via magnetic force of the magnets.

The module 320 further includes a first contact assembly 340 that is coupled to the connector 324 and a second contact assembly 360 that is coupled to the connector 326. The first contact assembly 340 can be constructed the same as or similar to the contact assembly 240, and the second contact assembly 360 can be constructed the same as or similar to the contact assembly 260. The contact assemblies 340 and 360 can be coupled to the connectors 324 and 326, respectively, in the same manner as described for contact assemblies 240 and 260. For example, the first contact assembly 340 can be fixedly or permanently coupled to the connector 324 and to the circuit board 322 without the use of a solder connection.

The connectors 324 and 326 of the module 320 also include an interlocking coupling mechanism as described above for modules 220 that includes, for example, protrusions 332 provided as part of the contact assembly 340 and recesses 334 defined at least in part by the second contact assembly 360 as described above for module 220. The protrusions 332 of a connector 324 of a first module 320 can be slidably received in a vertical direction within recesses 334 of a connector 326 of a second module 320. The interlocking of the protrusions 332 and recesses 334 can inhibit two modules 320 from sliding laterally or side-to-side with respect to each other when removably coupled together.

The connectors 324, 326 of the module 320 can each be coupled to a different connector of another module 320 with the magnets and the interlocking coupling mechanism (e.g., protrusions 332 and recesses 334) further helps maintain the connectors of the different modules coupled together. As described above, to couple a connector 326 of a first module 320 to a connector 324 of a second module 320, the protrusions 332 of the connector 324 can be received within the recesses 334 of connector 326 in a vertical direction, and extension portions 362 of the connector 326 and extension portions 363 of the circuit board 322 can slidably engage in a vertical direction the extension portions 362 of the connector 324 of the second module 320 and can use the outermost protrusions 332 (the protrusions closest to the extension portions 362 of connector 324) to help guide the insertion. Further, the extension portion 374 of the adapter 364 can be slidably received in a vertical direction within corresponding recess area 373 of adapter 366, and the extension portions 375 of adapter 366 can slidably engage in a vertical direction the side recesses 376 of adapter 364. When the module 320 is removably coupled to another module 320, a front surface 337 of the connectors 324, 326 of the module 320 contacts a front surface of the connector of the other module 320, as described above for previous embodiments. Further, when the module 320 is removably coupled to another module 320, a side surface 333 of the connector 324 or 326 (or the housings 328) of the module 320 is aligned or substantially aligned with a side surface (or the housing) of the connector of the other module 320. For example, as shown in FIG. 22, the module 320 is removably coupled to the module 320' and the side surface 333 of connector 326 is aligned with the side surface 333' of the connector 324'.

As described above for the previous embodiments, the module 320 can also be used or interconnected with a component of a different interlocking building block system, such as a LEGO® block system. More specifically, each connector 324, 326 includes mounting portions 330 that can be used to removably couple the module 320 to such a component of a different building block system (see, e.g., FIG. 23 illustrating modules 320, 320' coupled to a LEGO® block 315). In this embodiment, the mounting portions 330 are substantially u-shaped and define a recessed area, as best shown in the bottom view of FIG. 19B. The recessed area of the mounting portions 330 can matingly couple to, for example, a protrusion or post P of a LEGO® block LB as shown in in FIG. 23 to removably couple the modules 320, 320' to the LEGO® block LB.

In addition, as described above, in this embodiment, the module 320 includes adapters 364 and 366 that can also be used to matingly couple the module 320 to a component of a different interlocking building block system. For example, although not shown in FIG. 23, a block LB as shown in FIG. 23 can be coupled to the adapters 364 and 366 by coupling the bottom side of the block LB to the adapters 364 and 366 such that the post 370 and half-posts 371 are received within voids defined on the bottom side of the block LB. The adapters 364 and 366 can alternatively be configured to couple a module 320 to a component of block of a different interlocking building system than the mounting portions 330. Thus, the module 320 can be coupled on a bottom side to a component of a different interlocking building block system and on a top side to a component of a different interlocking building block system.

Figure 24A:
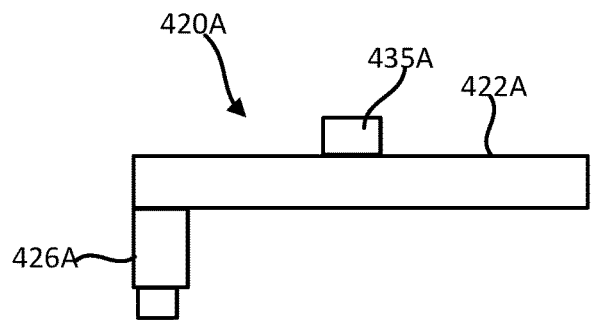
FIG. 24A-24C are each a schematic illustration of a side view of a different embodiment of a module.
Figure 24B:
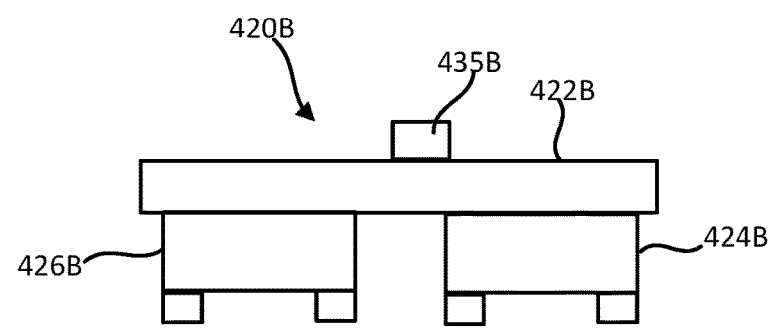
Figure 24C:
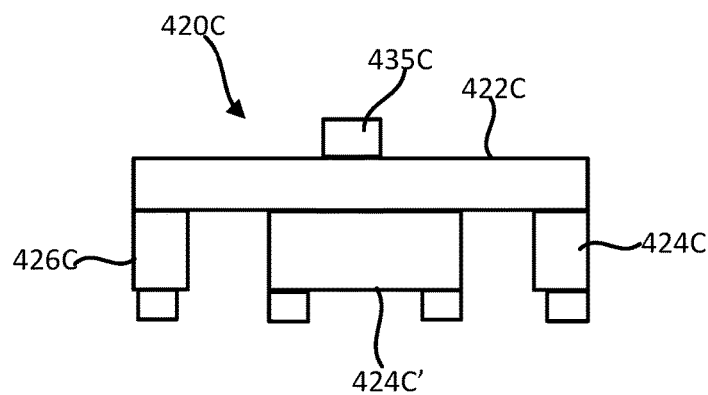
Figure 25:
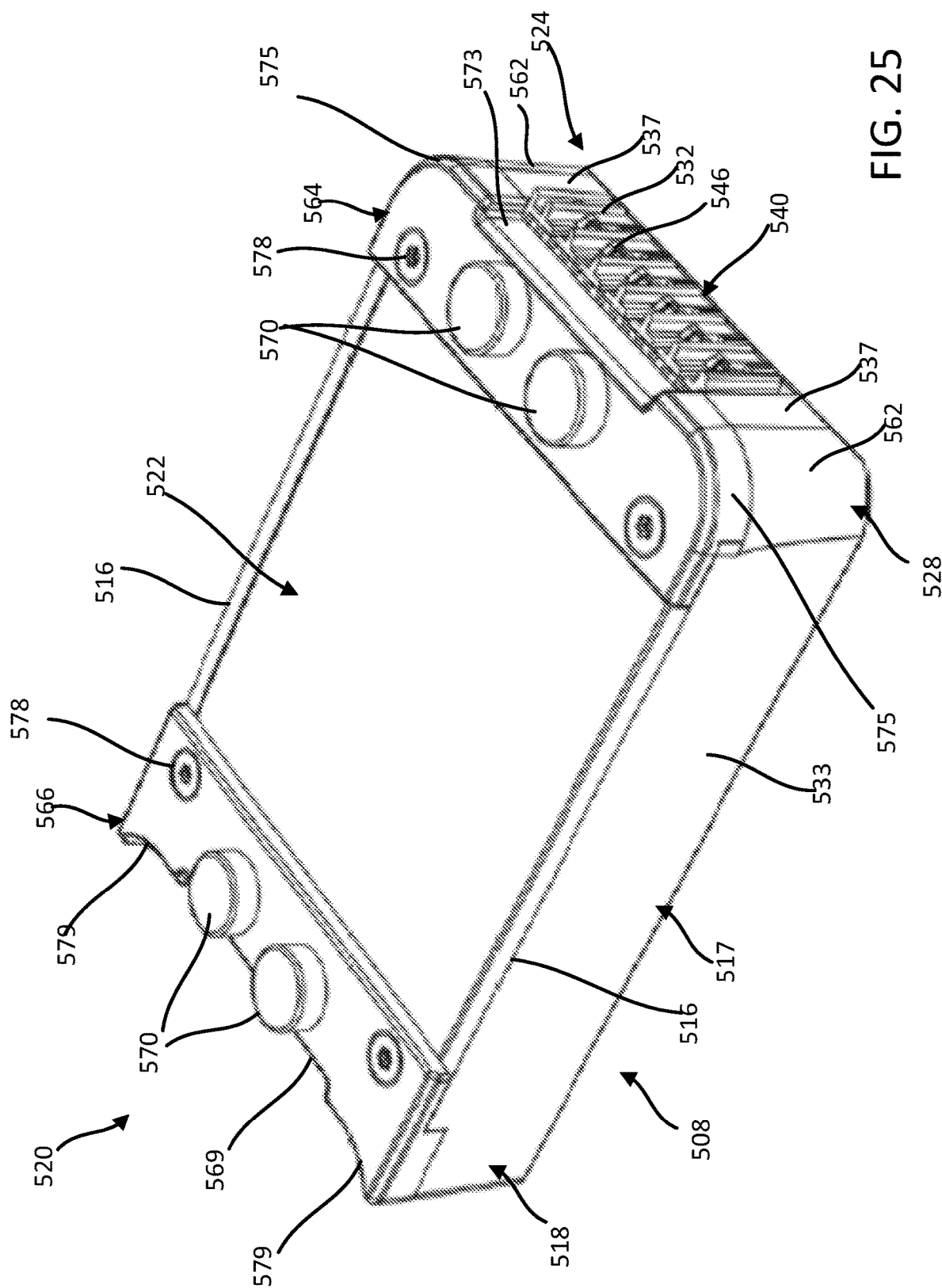
FIG. 25 is a perspective view of a module of an electronic building block system, according to another embodiment.

Although embodiments of modules (e.g., 120, 220, 320) are shown and described as having a connector (e.g., connectors 124 and 126) coupled to one end or two opposite ends or edges of a circuit board (e.g., circuit boards 122), in other embodiments, a module can include connectors coupled to more than two ends or edges of a circuit board. For example, FIGS. 24A-24C are each a schematic illustration of a side view of a module including a circuit board and one or more connectors. The modules of FIGS. 24A-24C can include various different embodiments of a connector and/or circuit board as described herein.

FIG. 24A illustrates a module 420A including a circuit board 422A, one connector 426A coupled to a single edge or end portion of the circuit board 422A, and an electronic component 435A. FIG. 24B illustrates a module 420B including a circuit board 422B, two connectors 424B and 426B coupled to a single edge or end portion of the circuit board 422B, and an electronic component 435B. FIG. 24C illustrates a module 420C including a circuit board 422C, three connectors 424C, 424C', 426C coupled to three different edges or end portions of the circuit board 422C, and an electronic component 435C. The module 420C can also include a fourth connector, e.g., a connector 426C' (not shown in the side view) on the opposite side of the circuit board 422C as connector 424C'.

FIGS. 25-30 illustrate components of another embodiment of a modular electronic building block system. A modular electronic building block system 500 (also referred to herein as "system", "block system" or "electronic building block system" or "electronic building system") can include one or more electronic modules 520 (also referred to herein as "modules," "blocks," or "electronic blocks") that can each be removably coupled to at least one other module 520 in a similar manner as described above for previous embodiments.

The modules 520 can include the same or similar features and can provide the same or similar function(s) as described above for modules 120, 220 and 320, and each module 520 of system 500 can be coupled to another module 520 in the same or similar manner as described for module 220. Thus, some details of the module 520 are not described herein. Further, although not shown in FIGS. 25-29, the modules 520 of the system 500 can each include one or more electrical components (e.g., electrical components 135) as described above for system 100 that can each provide a module 520 with a particular functionality, and include various categories and types of modules as described above. For example, the system 500 can include a power module 520 and when the power module 520 is removably coupled to another module 520 having an electrical component, the power module 520 can provide power to that other module 520.

In this embodiment, the module 520 includes a printed circuit board 522 (also referred to as "PCB" or "circuit board") coupled to a housing structure 508. The housing structure 508 includes housing portions 528 and 518 of a first connector or connector portion 524 and a second connector or connector portion 526, respectively, and a base portion 517 between the housing portions 528 and 518. The housing portions 528 and 518 and the base portion 517 are monolithically formed as a single component. The base portion 517 includes two side walls 516 and a bottom floor 515 that collectively with the housing portions 518 and 528 define an interior region 519 (as shown in the exploded view of FIG. 26). The interior region 519 can contain various components of the module 520, such as circuitry and other electrical hardware (not shown in FIGS. 25-29). In some embodiments, the floor 515 can define openings 514 as shown in FIG. 27. The openings 514 can provide viewing access to the interior region 519 such that a user can view the interior components of the module 520. In some embodiments, alternatively or in addition to the openings 514, the floor 515 can be formed with a clear or translucent material such that a user can view the interior components through the floor 515.

The floor 515 also includes mounting portions 530 (as shown in FIG. 27) disposed on an exterior side of the floor 515 that can be used to removably couple the module 520 to a component of a different building block system (see, e.g., FIG. 28 illustrating module 520 coupled to a LEGO® block LB). In this embodiment, the mounting portions 530 are substantially circular shaped and define a recessed area, as shown in the bottom view of FIG. 27. The recessed area of the mounting portions 530 can matingly couple to, for example, a protrusion or post P of a LEGO® block LB (see, e.g., posts P of block LB in FIG. 28) to removably couple the module 520 to the LEGO® block LB. As shown in FIG. 27, there are three rows of three mounting portions 530. Each of the rows of three mounting portions 520 is disposed along a width of the module 520, which provides for the module 520 to be coupled to a LEGO® block LB and span four protrusions or post P of the LEGO® block LB.

The circuit board 522 can have the same or similar structure and function as the circuit boards 122 and 222 described above. Each module 520 can also include one or more electrical or electronic components (not shown) such as components 135 described above that can perform a particular function. The various electrical or electronic components can be coupled (e.g., soldered) to the circuit board 522 of a module 520. Electrical power can be provided to the electrical components via a power module (described above) and via the contact assemblies and circuit boards 522 of the modules 520 as described above for previous embodiments.

The connectors 524 and 526 (also referred to herein as connector portions) can also be the same as or similar to the connectors 224, 226 described above. For example, the housing portion 528 of connector 524 and the housing portion 518 of the connector 526 can be fixedly or permanently coupled to the circuit board 522 with, for example, a fastener 578. For example, as described above for module 220, the circuit board 522 can include or define openings 536 and the housing portions 528 and 518 of the connectors 524 and 526, respectively, can each define corresponding openings 557 that can receive the fastener therethrough to secure the circuit board 522 to the connectors 524 and 526 (see FIG. 26). The circuit board 522 can also define openings 538 that can receive a locating pin 552 of the connectors 524 and 526 as described above for module 220.

As with previous embodiments, the circuit board 522 is coupled to the connectors 524 and 526 such that a portion of a bottom surface (not shown) of the circuit board 522 contacts a portion of a top surface 555 of the housing portion 528 of connector 524 and a top surface 555 of the housing portion 518 of the connector 526.

In this embodiment, the housing portion 528 includes extension portions 562 and front surfaces 537, and the housing portion 518 includes concave portions 581 and front surfaces 580. Each of the housing portions 528 and 518 defines two receptacles 556 that can each receive therein a magnet (not shown) that can be used to removably couple each of the connectors 524 and 526 to a connector of a different module 520 of the system 500. The magnets can be the same as or similar to and function the same as or similar to the magnets 250 described above for modules 120 and 220. For example, with the magnets disposed within the receptacles 556, a magnetic force can be applied/transferred through a front surface 537 of the housing portion 528 of the connector 524 and a front surface 580 of the housing portion 518 of the connector 526. Thus, the connectors 524 and 526 can each be removably coupled to another connector of another module 520 through magnetic force when the front surfaces 537 and 580 of the connectors 524 and 526 engages/contacts a front surface of another connector (similarly constructed with magnets disposed within a receptacle). In other words, the connectors 524 and 526 will be magnetically coupled to the other connectors via magnetic force of the magnets.

Figure 26:
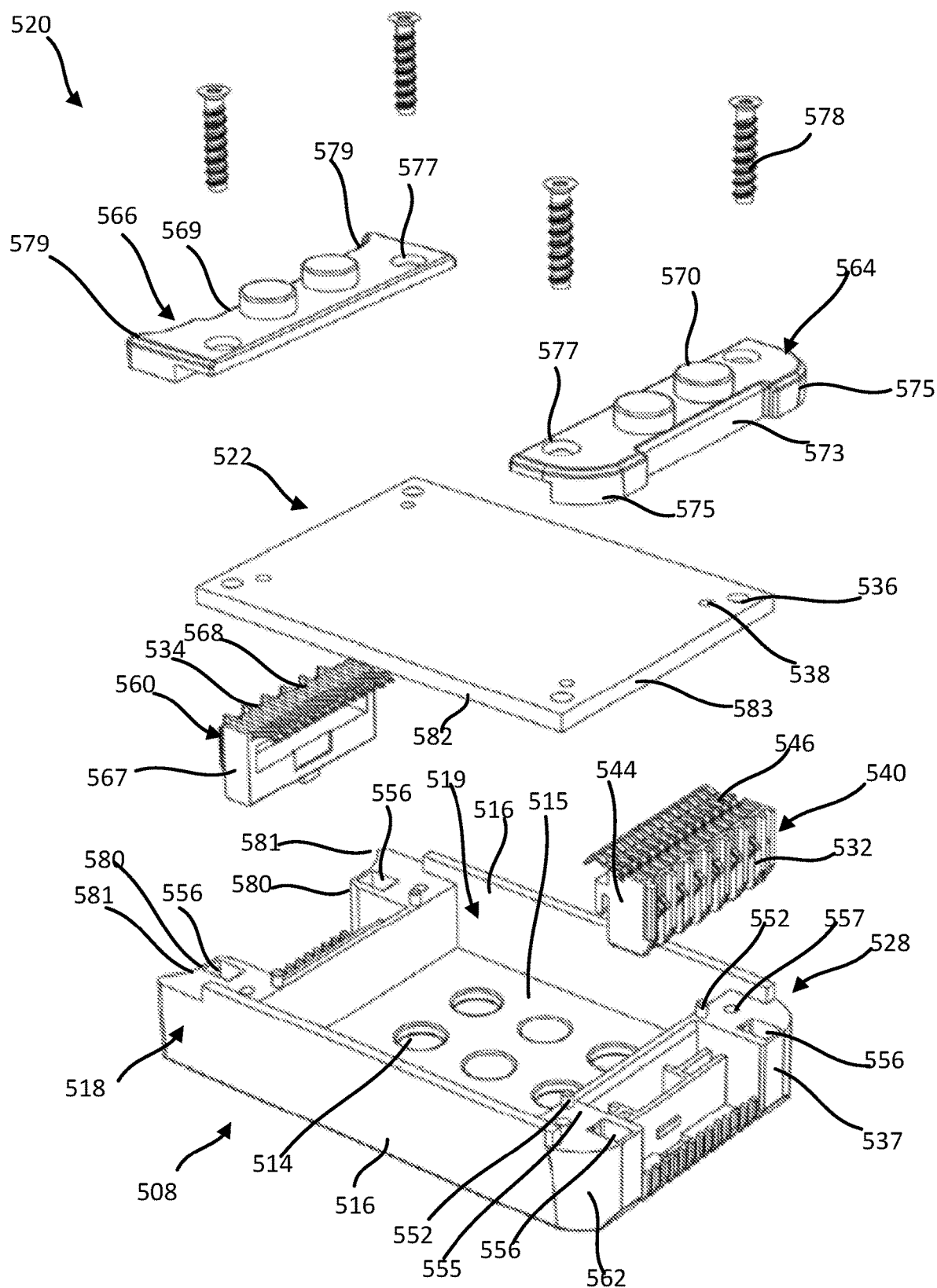
FIG. 26 is an exploded view of the module of the electronic building block system of FIG. 25.

The module 520 further includes a first contact assembly 540 that is coupled to or included within the connector 524 and a second contact assembly 560 that is coupled to or included within the connector 526. The first contact assembly 540 can be constructed the same as or similar to the contact assembly 240, and the second contact assembly 560 can be constructed the same as or similar to the contact assembly 260. The first contact assembly 540 includes a base 544 and multiple electrical contacts or conductors 546 coupled to the base 544 as best shown in FIG. 26. The second contact assembly 560 includes a base 567 and multiple electrical contacts or conductors 568 as best shown in FIG. 26. The contacts 546 and the contacts 568 can be, for example, spring probes or a small metal plate(s). In this embodiment, there are 13 contacts 546, and 13 contacts 568, but it should be understood that a different number of contacts 546 and/or a different number of contacts 568 can be used. The contacts 546 are coupled to the base 544 through engagement with the base 544, without the use of a solder connection. Similarly, the contacts 568 are coupled to the base 567 through engagement with the base 567, without the use of a solder connection. The contact assemblies 540 and 560 can be coupled to the connectors 524 and 526, respectively, in the same or similar manner as described for contact assemblies 240 and 260. For example, the first contact assembly 540 and the second contact assembly 560 can each be fixedly or permanently coupled to the housing portion 528 of the connector 524 and the housing portion 518 of the connector 526, respectively, and to the circuit board 522 without the use of a solder connection.

The connectors 524 and 526 of the module 520 also include an interlocking coupling mechanism as described above for modules 220 that includes, for example, protrusions 532 provided as part of the contact assembly 540 and recesses 534 defined at least in part by the second contact assembly 560 as described above for module 220. The protrusions 532 of a connector 524 of a first module 520 can be slidably received in a vertical direction within recesses 534 of a connector 526 of a second module 520. The interlocking of the protrusions 532 and recesses 534 can inhibit two modules 520 from sliding laterally or side-to-side with respect to each other when removably coupled together.

In this embodiment, the module 520 also includes adapters 564 and 566 that can be used to couple the module 520 to a component of a different building block system such as a LEGO® block as described herein for modules 320. In this embodiment, the adapters 564 and 566 each include coupling portions that include two posts 570 and define openings 577, as shown in the exploded view of FIG. 26. The adapters 564 and 566 can be coupled to the circuit board 522 and connectors 524 and 526 (described in more detail below) with, for example, threaded fasteners 578. For example, the same fasteners used to couple the circuit board to the connectors 524 and 526 can be used to couple the adapters 564 and 566 to the circuit board 522. The circuit board 522 is coupled to the housing structure 508 such that outer side edges 582 (see FIG. 26) of the circuit board 522 are disposed within the interior region 519 and bounded by the walls 516, and end surfaces 583 (see FIG. 26) of the circuit board 522 are disposed under the adapters 564 and 566 and unexposed on the ends of the modules 520.

The adapter 564 includes extension portions 575 and a recessed area 573. The extension portions 575 correspond to a contour and shape of the extension portions 562 and front surfaces 537 of the housing portion 528 of the connector 524. The adapter 566 includes concave portions 579 and a recessed area 569. The concave portions 579 are sized and shaped to align with the size and shape of concave portions 581 (see FIG. 27) of the housing portion 518 of connector 526. Thus, housing portion 528 and adapter 564 of connector 524 have a different shape than the housing portion 518 and the adapter 566 of connector 526. As shown in the figures, the asymmetry of the shape and contour of the connectors 524 and 526 provide a visual indicator to a user to help with connectivity of one module 520 to another module 520. Thus, the likelihood of a short circuit or otherwise damaging a module 520 by wrongly connecting the modules together can be reduced.

Figure 29:
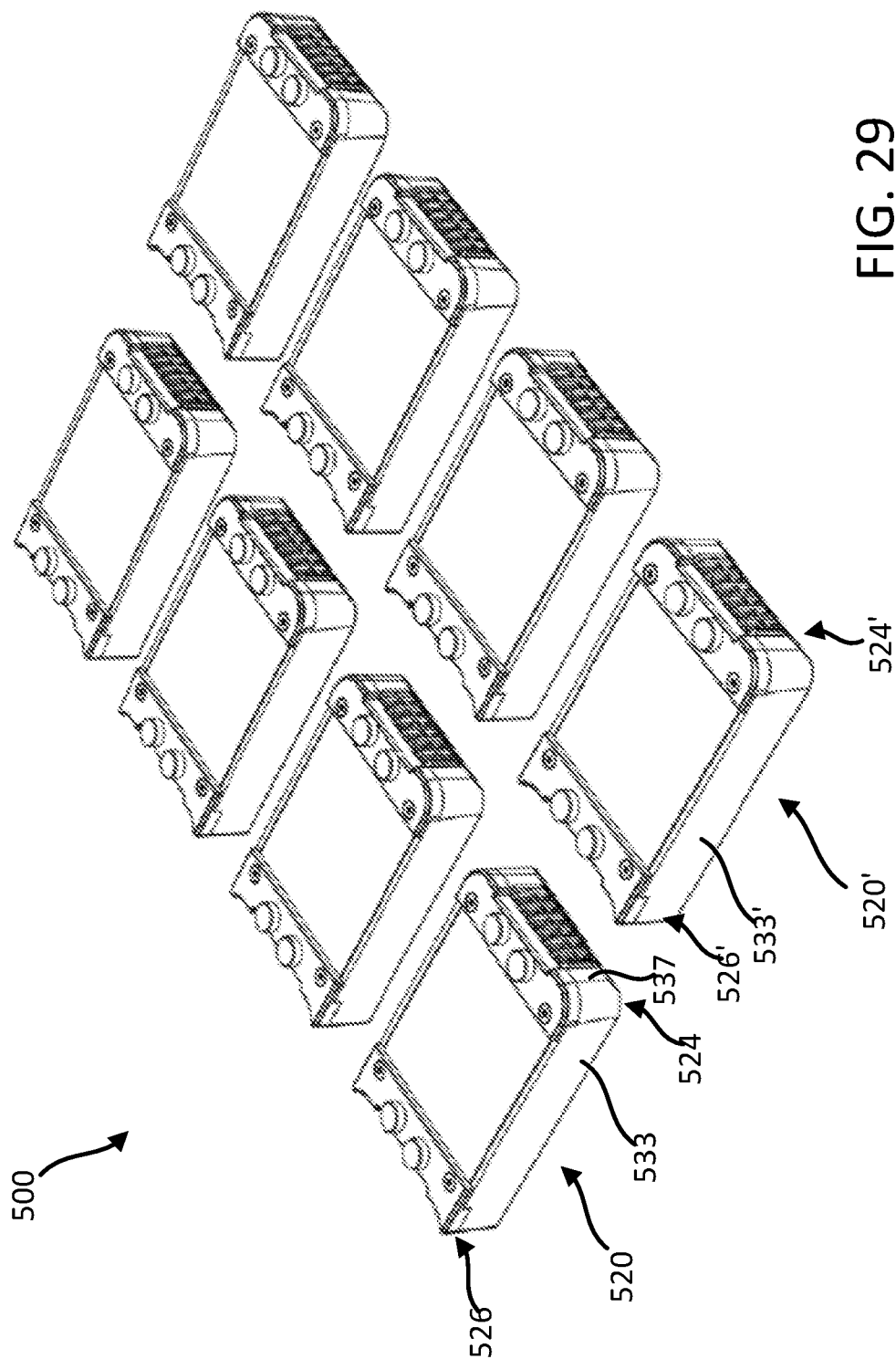
FIG. 29 is a perspective view of multiple modules of the electronic building block system of FIG. 25.
Figure 30A:
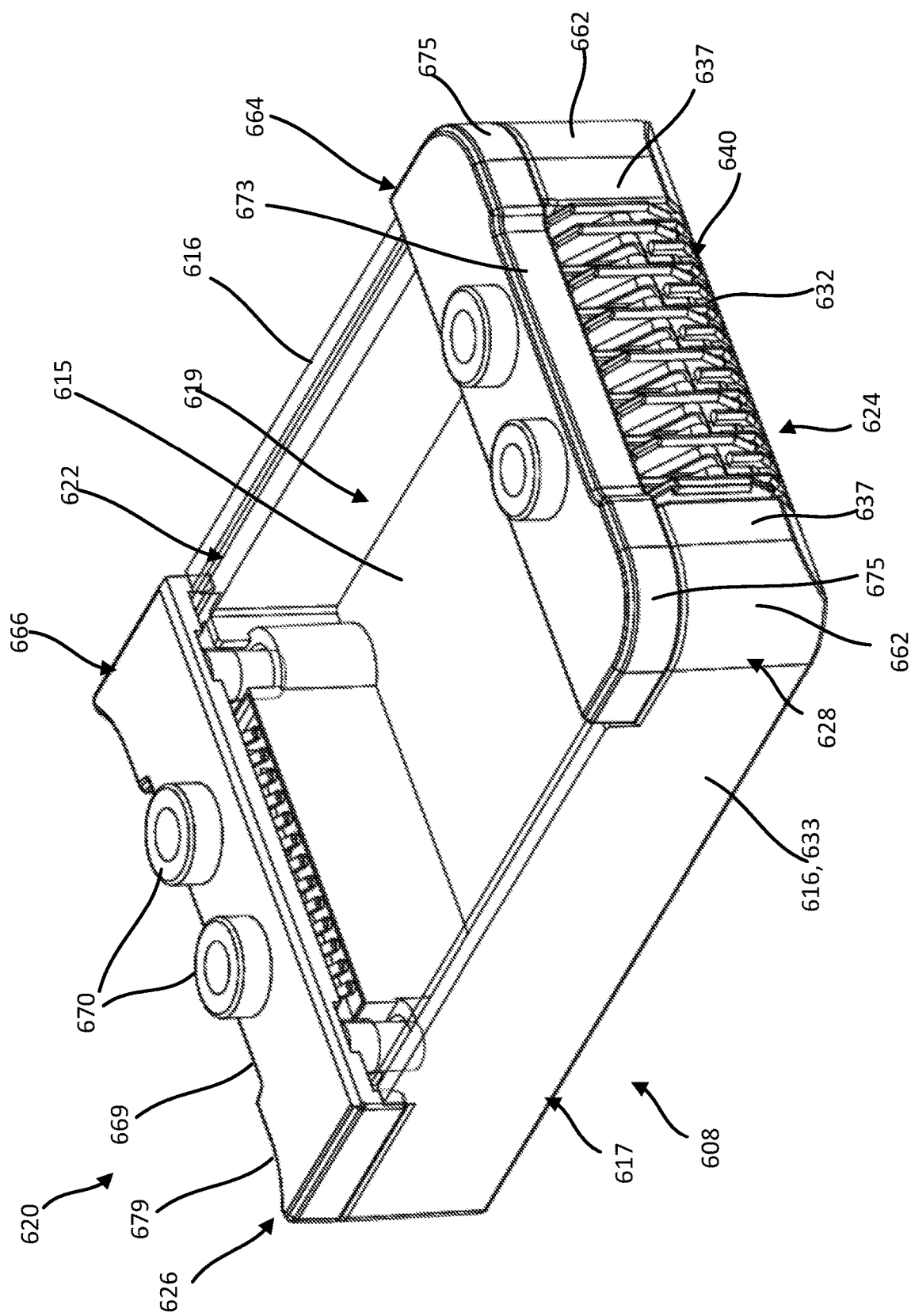
FIG. 30A is a first end perspective view of a module of an electronic building block system, according to another embodiment, with the circuit board shown transparent for illustration purposes.
Figure 30B:
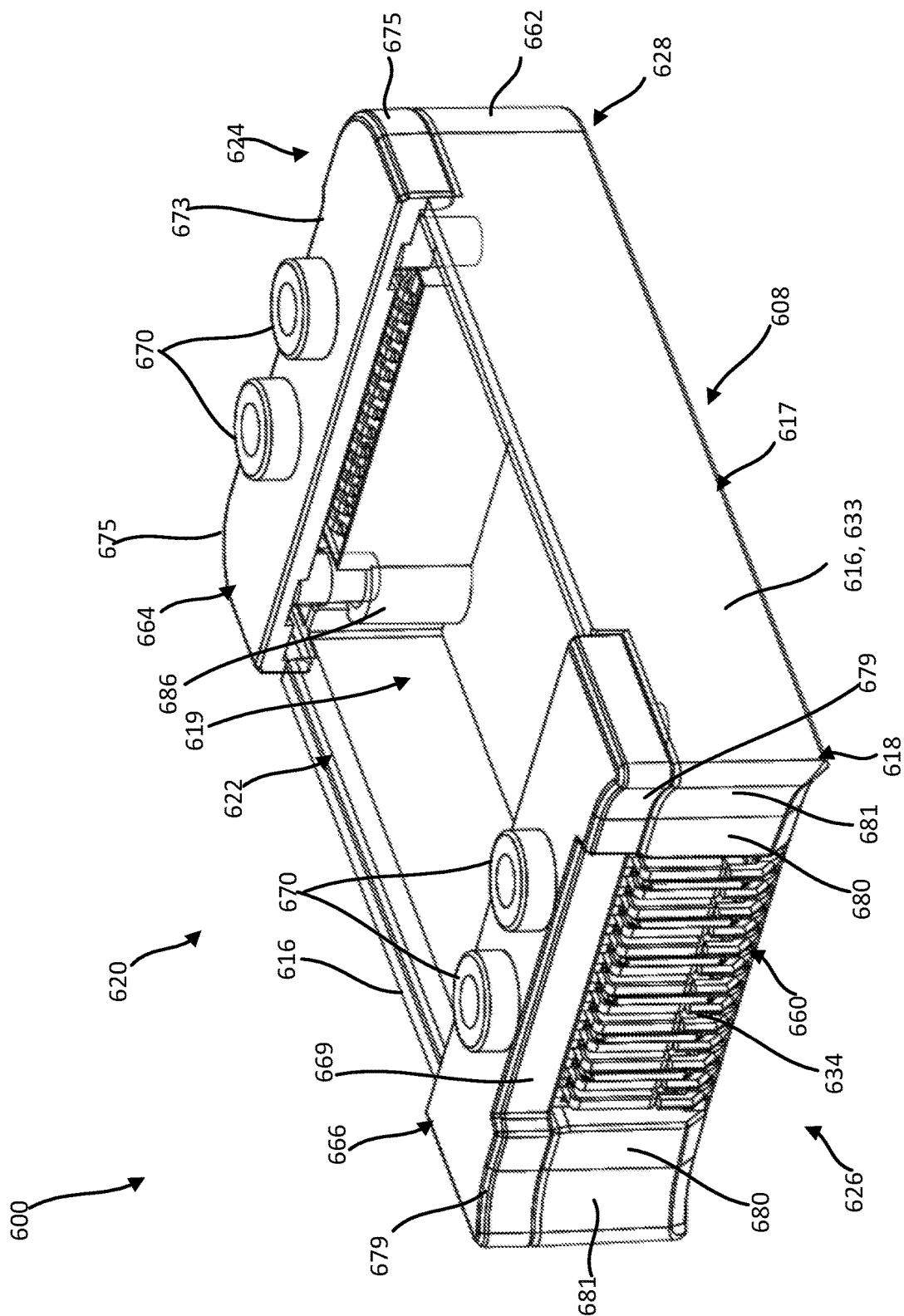
FIG. 30B is a second end perspective view opposite the first end of FIG. 30 of the module of the electronic building block system of FIG. 30.

The connectors 524 and 526 of the module 520 can each be coupled to a different connector of another module 520 with the magnets and the interlocking coupling mechanism (e.g., protrusions 532 and recesses 534) further helps maintain the connectors of the different modules coupled together. As described above, to couple a connector 526 of a first module 520 to a connector 524 of a second module 520, the protrusions 532 of the connector 524 can be received within the recesses 534 of connector 526 in a vertical direction, and the concave portions 581 of the housing portion 518 of the connector 526 can slidably engage in a vertical or horizontal direction with the extension portions 562 of the connector 524 of the second module 520. When a module 520 is removably coupled to another module 520, the front surface 537 of the connector 524 contacts the front surface (e.g., 580) of the connector (e.g., 526) of the other module 520, as described above for previous embodiments. Further, when the module 520 is removably coupled to another module 520, the side surfaces 533 of the housing structure 508 (and of the housing portions 528 and 518) of the module 520 are each aligned or substantially aligned with a side surface (of the housing) of the connector of the other module 520. For example, as shown in FIG. 29, the module 520 can be removably coupled to the module 420' and the side surfaces 533 of housing portion 528 of the connector 524 can be aligned with the side surfaces 533' of the housing portion 518' of the connector 526', and the front surfaces 537 of the connector 524 can abut and contact the front surfaces (not shown in FIG. 29) of the connector 526'.

Figure 31:
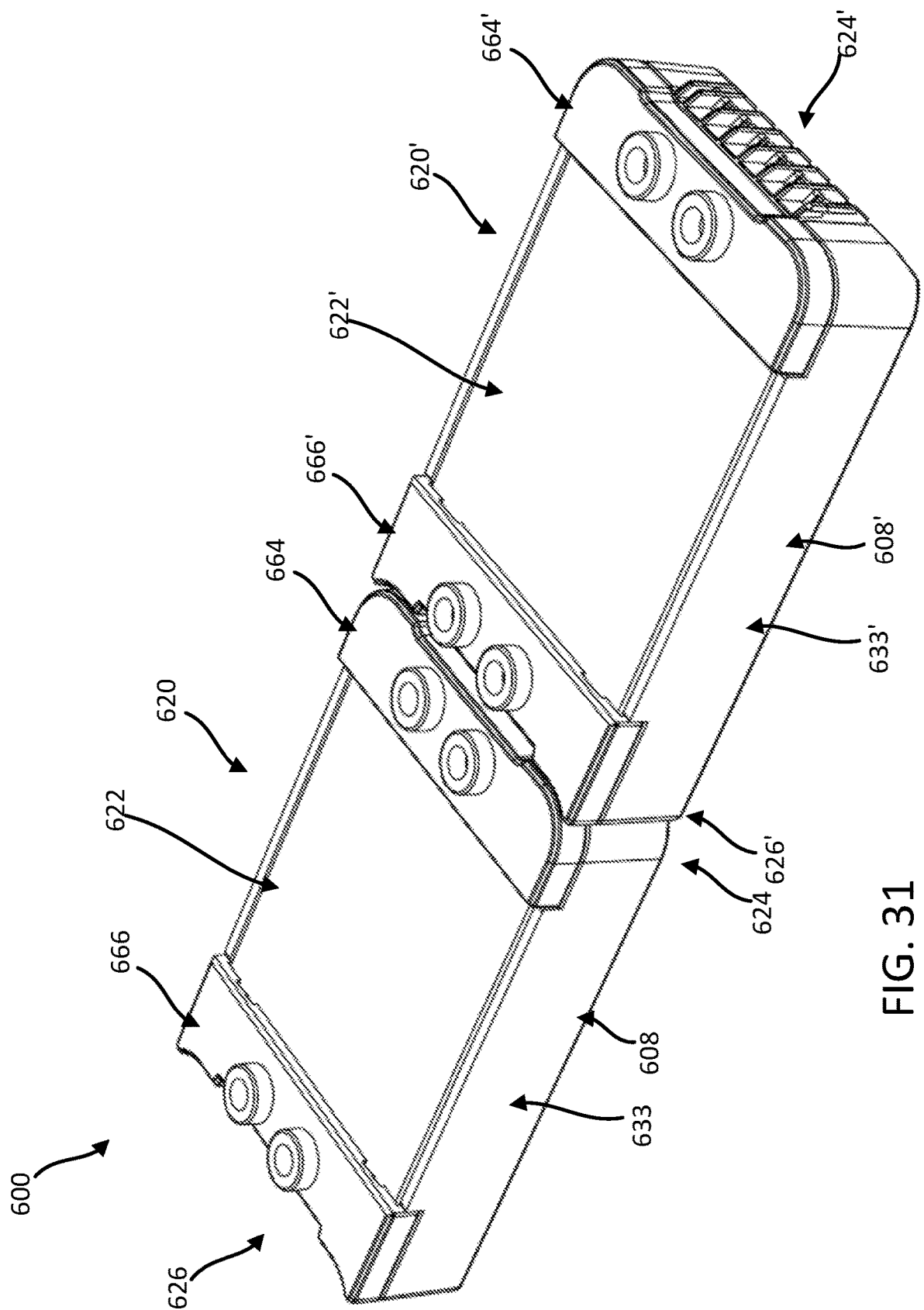
FIG. 31 illustrates a perspective view of two modules of FIGS. 30A and 30B coupled together.
Figure 32A:
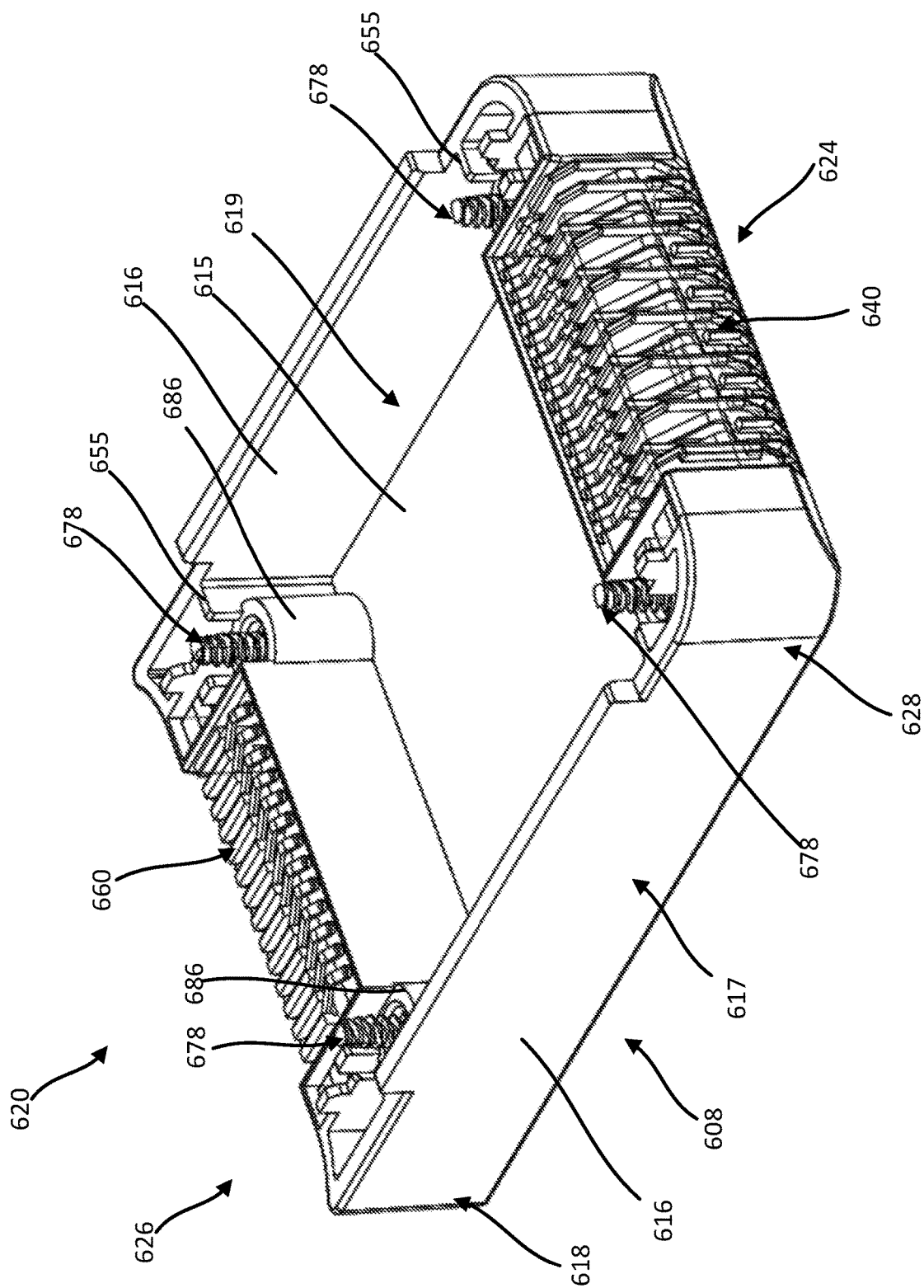
FIG. 32A is a first end perspective view of the module of the electronic building block system of FIG. 30A with the circuit board and adapters removed for illustration purposes.
Figure 32B:
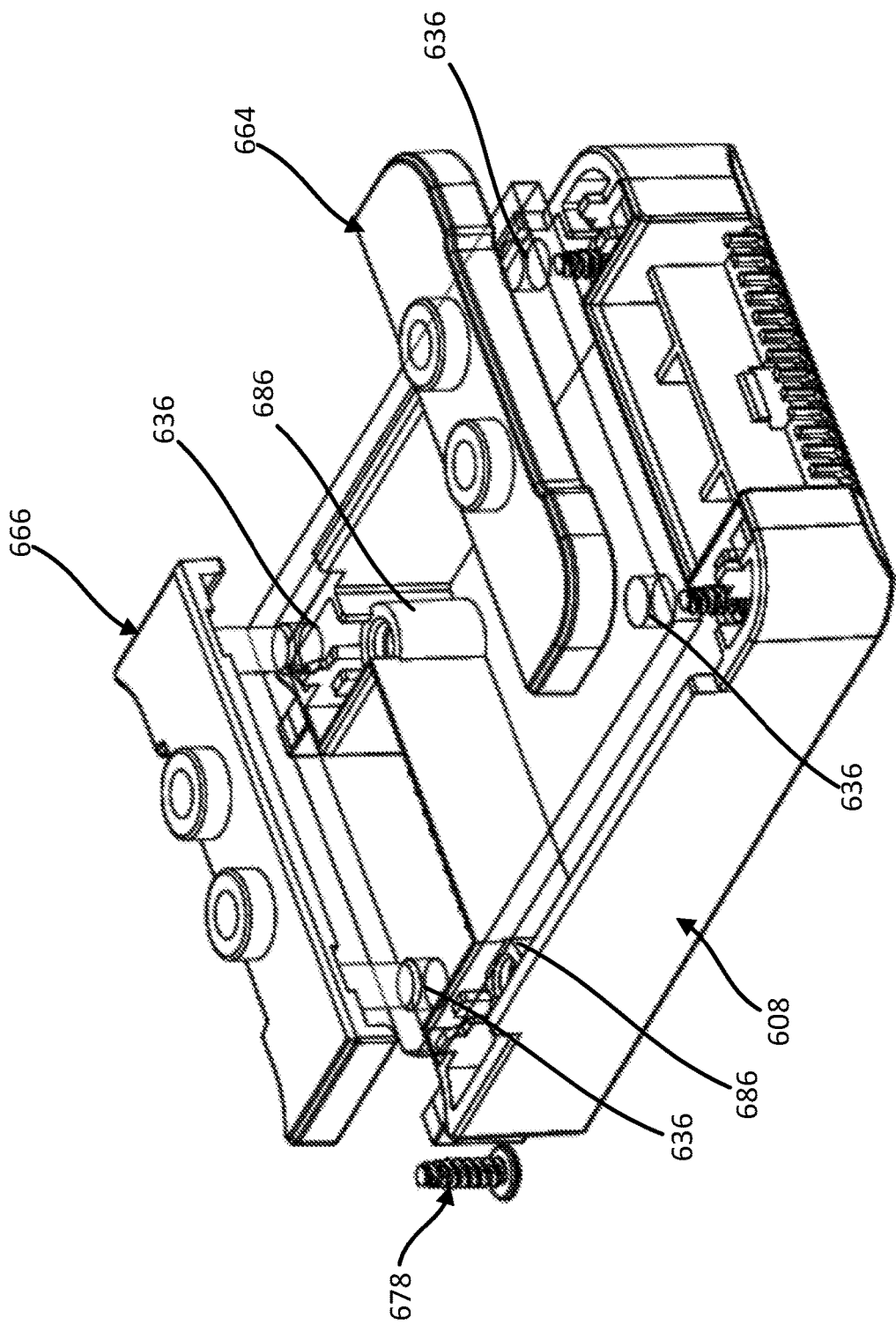
FIG. 32B is a partial exploded view of the module of the electronic building block system of FIG. 30A without the contact assemblies for illustration purposes.

FIGS. 30A-38 illustrate components of another embodiment of a modular electronic building block system that is similar to the system 500. A modular electronic building block system (also referred to herein as "system", "block system" or "electronic building block system" or "electronic building system") can include one or more electronic modules 620 (also referred to herein as "modules," "blocks," or "electronic blocks") that can each be removably coupled to at least one other module 620 in a similar manner as described above for previous embodiments. FIG. 31 illustrates two modules 620 coupled together.

The modules 620 can include the same or similar features and can provide the same or similar function(s) as described above for module 520 of system 500 and can be coupled to another module 620 in the same or similar manner as described for module 520. Thus, some details of the module 620 are not described herein. Further, although not shown in FIGS. 30A-38, the modules 620 of the system 600 can each include one or more electrical components (e.g., electrical components 135) as described above for system 100 that can each provide a module 620 with a particular functionality, and include various categories and types of modules as described above. For example, the system 600 can include a power module 620 and when the power module 620 is removably coupled to another module 620 having an electrical component, the power module 620 can provide power to that other module 620.

In this embodiment, the module 620 includes a printed circuit board 622 (also referred to as "PCB" or "circuit board") coupled to a housing structure 608. The housing structure 608 includes housing portions 628 and 618 of a first connector or connector portion 624 and a second connector or connector portion 626, respectively, and a base portion 617 between the housing portions 628 and 618. The module 620 also includes contact assemblies 640 and 660 described below.

The housing portions 628 and 618 can be the same as or similar to the housing portions 528 and 518, respectively, and therefore some details are not described with respect to this embodiment. For example, the housing portion 628 includes extension portions 662 and front surfaces 637, and the housing portion 618 includes concave portions 681 and front surfaces 680.

Each of the housing portions 628 and 618 also defines two receptacles (not shown) that can each receive therein a magnet (not shown) that can be used to removably couple each of the connectors 624 and 626 (also referred to herein as connector portions) to a connector of a different module 620 of the system 600. The magnets can be the same as or similar to and function the same as or similar to the magnets 250 described above for modules 120, 220 and 520 and provide similar coupling capabilities. The housing portions 628 and 618 and the base portion 617 are monolithically formed as a single component. The base portion 617 includes two side walls 616 each having a side surface 633, and a bottom floor 615 that collectively with the housing portions 618 and 628 define an interior region 619. As with module 520, the interior region 619 can contain various components of the module 620, such as circuitry and other electrical hardware (not shown in FIGS. 30A-38). In some embodiments, although not shown, the floor 615 can optionally define openings as with floor 515 described above, to provide viewing access to the interior region 619. In some embodiments, alternatively or in addition to openings, the floor 615 can be formed with a clear or translucent material such that a user can view the interior components through the floor 615.

The floor 615 also includes mounting portions 630 disposed on an exterior side (as shown, for example, in FIGS. 33, 34 and 38) that can be used to removably couple the module 620 to a component of a different building block system, such as, for example, a LEGO® block. In this embodiment, the mounting portions 630 are substantially circular shaped and define a recessed area. The recessed area of the mounting portions 630 can matingly couple to, for example, a protrusion or post of a LEGO® block to removably couple the module 620 to the LEGO® block as described above, for example, for module 520. In addition, in this embodiment, the floor 615 includes two additional mounting portions 613, which can provide further coupling to a component of a different building block system. Other features of the housing portions 628 and 618 not described, such as the shape and contour, can be the same as or similar to the housing portions 528 and 518, respectively.

The circuit board 622 is shown transparent or clear in FIGS. 30A, 30B, 32B and 37 for illustration purposes to enable viewing of the interior region 619. The circuit board 622 can have the same or similar structure and function as the circuit boards described above. For example, the circuit board 622 defines openings 636 (see FIG. 32B) that can be used to couple the circuit board 622 to the housing 608 as discussed in more detail below. Each module 620 can also include one or more electrical or electronic components (not shown), such as components 135 described above, that can be coupled to the circuit board 622 and perform a particular function.

The connectors 624 and 626 can be the same as or similar to the connectors 524, 526 described above. For example, the housing portion 628 of connector 624 and the housing portion 618 of the connector 626 can be fixedly or permanently coupled to the circuit board 622 with, for example, fasteners 678 (see, e.g., FIGS. 32A, 32B, 33 and 38) as described in more detail below. As with the previous embodiment, the circuit board 622 is coupled to the housing structure 608 (e.g., housing portions 628 and 618) such that outer side edges (not shown) of the circuit board 622 are disposed within the interior region 619 and bounded by the walls 616, and end surfaces (not shown) of the circuit board 622 are disposed under adapters 664 and 666 (described below) and unexposed on the ends of the modules 620. As with previous embodiments, the circuit board 622 is coupled to the connectors 624 and 626 such that a portion of a bottom surface (not shown) of the circuit board 622 contacts a portion of a top surface 655 (see FIG. 32) of each of the housing portions 628 and 618.

The adapters 664 and 666 can be used in the same or similar manner as the adapters 564 and 566, and can be structurally similar, and therefore, it should be understood that some features not discussed with respect to this embodiment can be the same as with adapter 564 and 566. As with the adapters 564 and 566, each of adapters 664 and 666 includes coupling portions that include two posts 670. The adapter 664 includes extension portions 675 and a recessed area 673. The extension portions 675 correspond to a contour and shape of the extension portions 662 and front surfaces 637 of the housing portion 628 of the connector 624. The adapter 666 includes concave portions 679 and a recessed area 669. The concave portions 679 are sized and shaped to align with the size and shape of concave portions 681 of the housing portion 618 of connector 626.

In this embodiment, the adapters 664 and 666 also include tubular posts 688 (see FIGS. 34A and 34B) with threaded interior walls (not shown) that can be used to couple the adapters 664 and 666 to the circuit board 622 and housing structure 608 with the fasteners 678 as described in more detail below.

Figure 38:
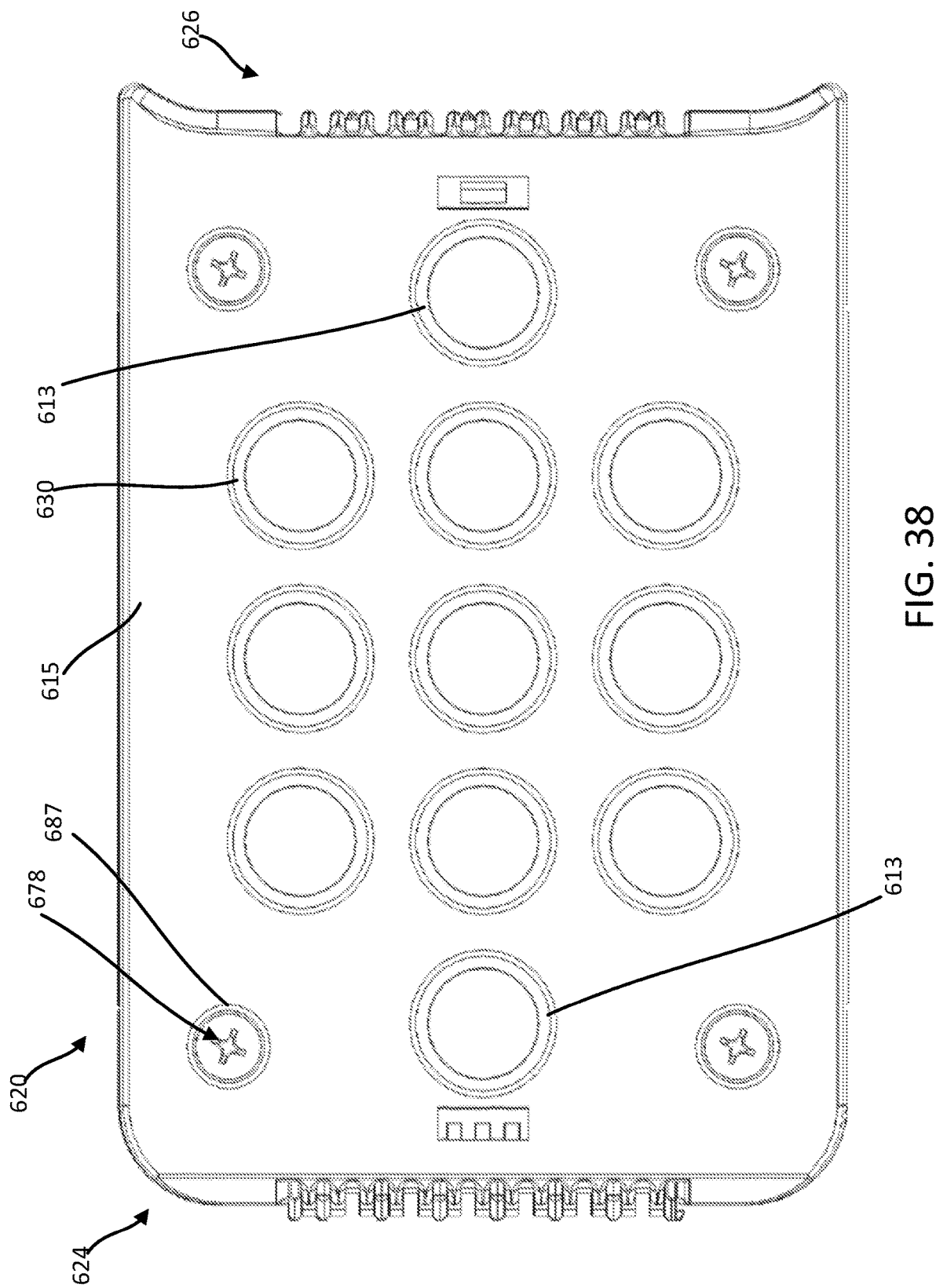
FIG. 38 is a bottom view of the module of the electronic building block system of FIG. 30A.
Figure 39:
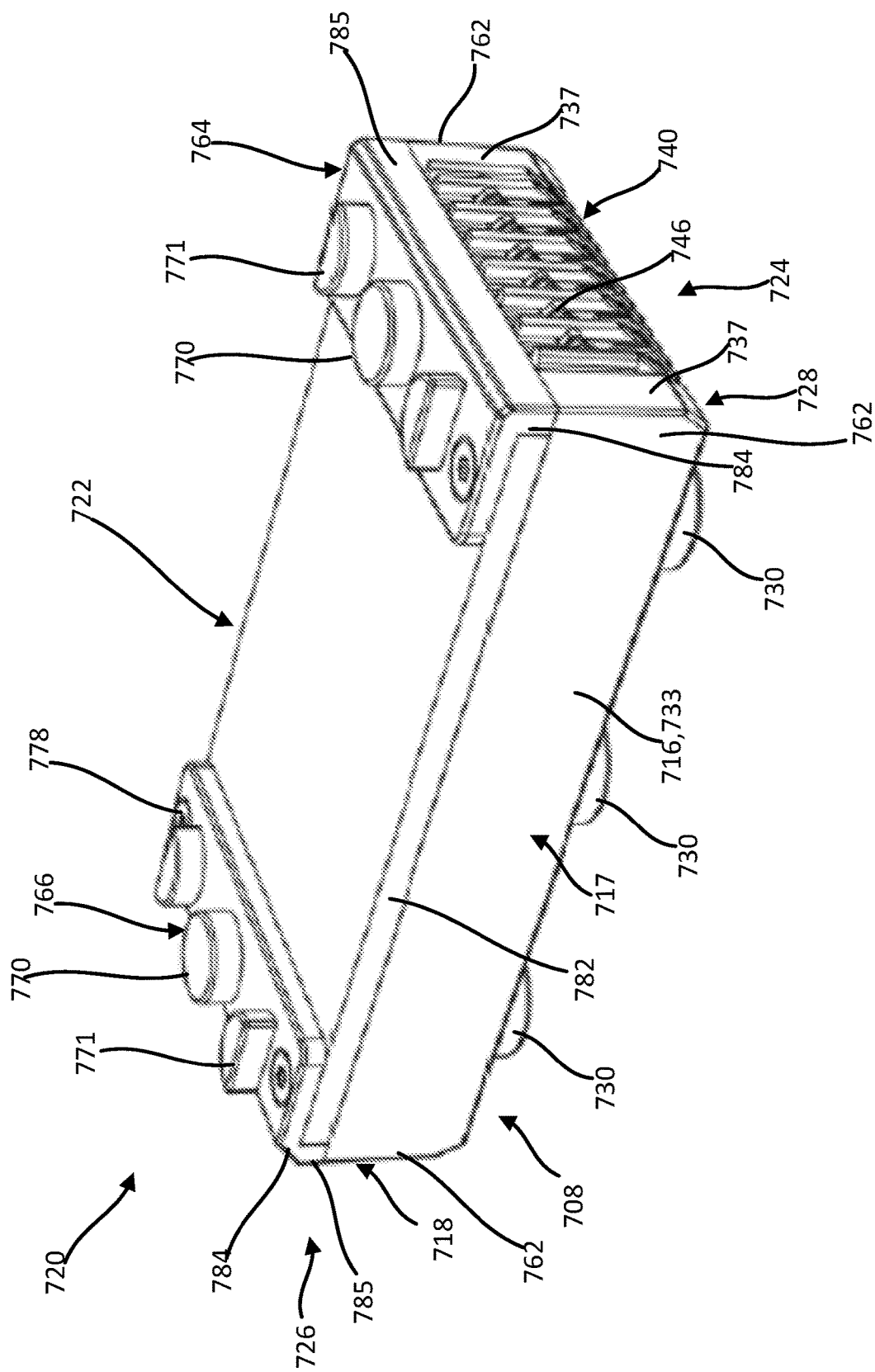
FIG. 39 is a first end perspective view of a module of an electronic building block system, according to another embodiment.
Figure 40:
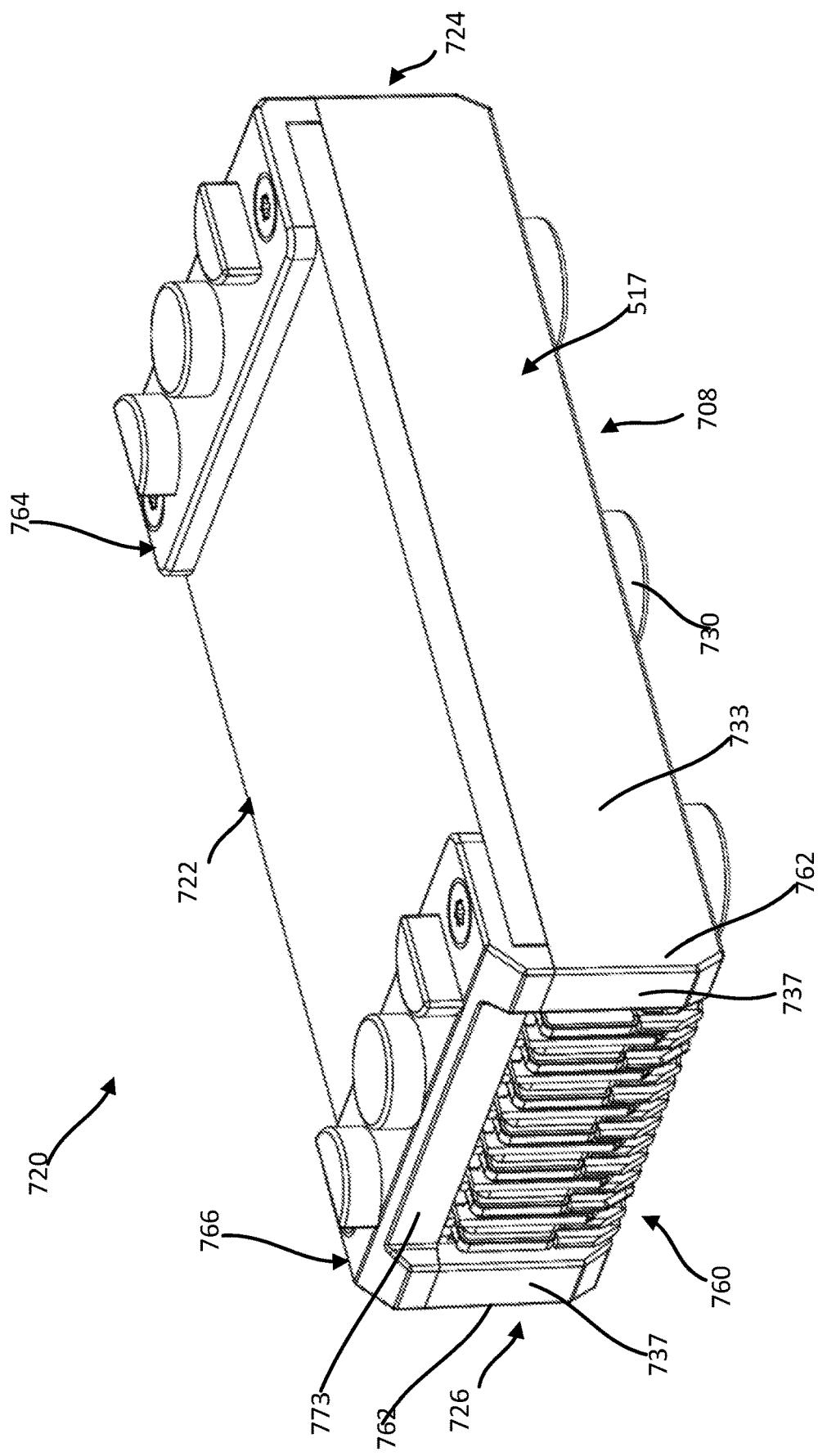
FIG. 40 is a second end perspective view opposite the first end of FIG. 39 of the module of the electronic building block system.

In this embodiment, the circuit board 622 and adapters 664 and 666 are coupled to the housing portions 618, 628 with the fasteners 678 inserted through a bottom portion of the module 620. More specifically, as shown in FIGS. 32 and 38, the housing 608 includes four channels 686 with threaded interior walls (not shown). The circuit board 622 can be placed on a top surface of the housing structure 608 such that the four openings 636 of the circuit board 622 are aligned with the four channels 686. The adapters 664 and 666 can be positioned over the circuit board 622 and the respective housing portions 628 and 618 with the posts 688 of the adapters 664 and 666 inserted through the openings 636 of the circuit board and aligned with the channels 686. The fasteners 678 can be inserted through bottom openings 687 (see FIG. 33) in communication with the channels 686 and threadably secured with the threaded interior walls of the channels 686 and the posts 688. Thus, when the fasteners 678 are secured, end portions of the circuit board 622 are sandwiched between the adapters 664 and 666 and the housing portions 628 and 618.

The first contact assembly 640 is coupled to or included within the connector 624 and the second contact assembly 660 is coupled to or included within the connector 626. The first contact assembly 640 can be constructed the same as or similar to the contact assemblies 240 and/or 540, and the second contact assembly 660 can be constructed the same as or similar to the contact assemblies 260 and/or 560, and therefore, are not discussed in detail with respect to this embodiment.

The connectors 624 and 626 of the module 620 also include an interlocking coupling mechanism as described above for modules 220 and 520 that include, for example, protrusions 632 (see, e.g., FIG. 30A) provided as part of the first contact assembly 640 and recesses 634 (see, e.g., FIG. 30B) defined at least in part by the second contact assembly 660 as described above for modules 220. The protrusions 632 of a connector 624 of a first module 620 can be slidably received in a vertical or horizontal direction within recesses 634 of a connector 626 of a second module 620. The interlocking of the protrusions 632 and recesses 634 can inhibit two modules 620 from sliding laterally or side-to-side with respect to each other when removably coupled together.

The connectors 624 and 626 of the module 620 can each be coupled to a different connector of another module 620 with the magnets, and the interlocking coupling mechanism (e.g., protrusions 632 and recesses 634) further helps maintain the connectors of the different modules coupled together in the same or similar manners as described above for module 620. As described above, to couple a connector 626 of a first module 620 to a connector 624 of a second module 620, the protrusions 632 of the connector 624 can be received within the recesses 634 of connector 626 in a vertical direction, and the concave portions 681 of the housing portion 618 of the connector 526 can slidably engage in a vertical or horizontal direction with the extension portions 662 of the connector 624 of the second module 620. When a module 620 is removably coupled to another module 620, the front surface 637 of the connector 624 contacts the front surface (e.g., 680) of the connector (e.g., 626) of the other module 620, as described above for previous embodiments. Further, when the module 620 is removably coupled to another module 620, the side surfaces 633 of the housing structure 608 (and of the housing portions 628 and 618) of the module 620 are each aligned or substantially aligned, for example, within acceptable machine tolerances, with a side surface (of the housing) of the connector of the other module 620. For example, as shown in FIG. 31, the module 620 can be removably coupled to the module 620' and the side surfaces 633 of the housing structure 608 of the connector 624 of module 620 can be aligned with the side surfaces 633' of the housing structure 608' of the connector 626' of module 620', and the front surfaces 637 of the connector 624 can abut and contact the front surfaces (not shown in FIG. 31) of the connector 626'.

FIGS. 39-44 illustrate components of another embodiment of a modular electronic building block system. A modular electronic building block system 700 (also referred to herein as "system", "block system" or "electronic building block system" or "electronic building system") can include one or more electronic modules 720 (also referred to herein as "modules," "blocks," or "electronic blocks") that can each be removably coupled to at least one other module 720 in a similar manner as described above for previous embodiments.

The modules 720 can include the same or similar features and can provide the same or similar function(s) as described above for modules 120, 220, 320, 520 and 620, and each module 720 of system 700 can be coupled to another module 720 in the same or similar manner as described for previous modules. Thus, some details of the module 720 are not described herein. Further, although not shown in FIGS. 39-44, the modules 720 of the system 700 can each include one or more electrical components (e.g., electrical components 135) as described above for system 100 that can each provide a module 720 with a particular functionality, and include various categories and types of modules as described above. For example, the system 700 can include a power module 720 and when the power module 720 is removably coupled to another module 720 having an electrical component, the power module 720 can provide power to that other module 720.

In this embodiment, the module 720 includes a printed circuit board 722 (also referred to as "PCB" or "circuit board") coupled to a housing structure 708. The housing structure 708 includes housing portions 728 and 718 of a first connector or connector portion 724 and a second connector or connector portion 726, respectively, and a base portion 717 between the housing portions 728 and 718. The housing portions 728 and 718 and the base portion 717 are monolithically formed as a single component. In this embodiment, the housing portions 728 and 718 have the same form factor or are symmetric. The base portion 717 includes two side walls 716 and a bottom floor 715 that collectively with the housing portions 718 and 728 define an interior region 719 (as shown in the exploded view of FIG. 41). The interior region 719 can contain various components of the module 720, such as circuitry and other electrical hardware. In some embodiments, the floor 715 can define openings (not shown in FIGS. 39-44) as described above for module 520 to provide viewing access to the interior region 719 such that a user can view the interior components of the module 720. In some embodiments, alternatively or in addition to the openings, the floor 715 can be formed with a clear or translucent material such that a user can view the interior components through the floor 715.

Figure 42:
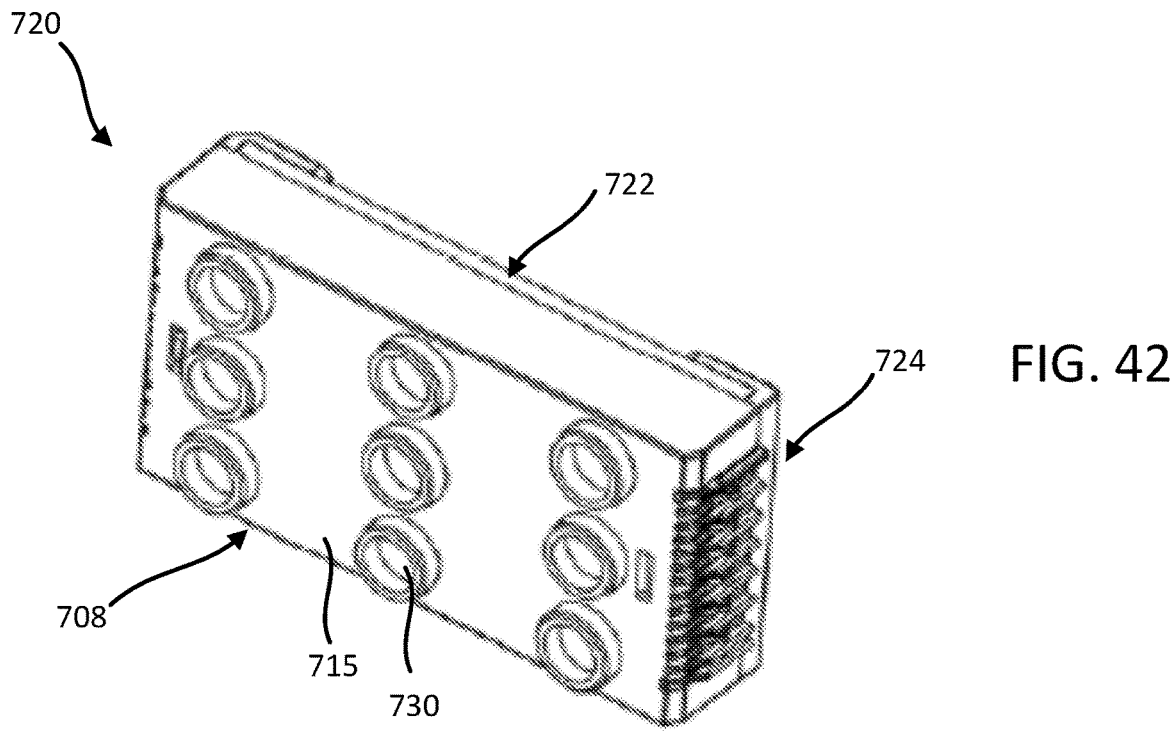
FIG. 42 is a bottom perspective view of the module of the electronic building block system of FIG. 39.
Figure 43:
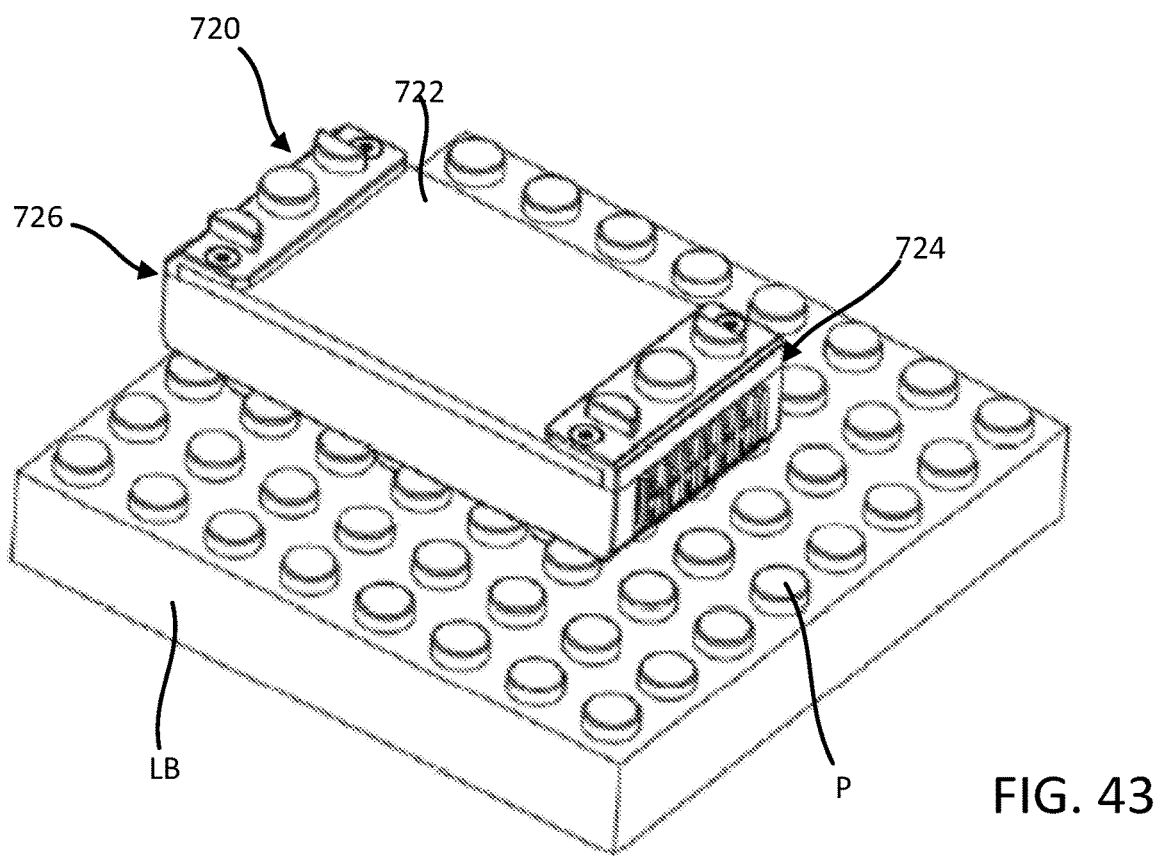
FIG. 43 is a perspective view of the module of the electronic building block system of FIG. 39 shown coupled to a component of a different building block system.
Figure 44:
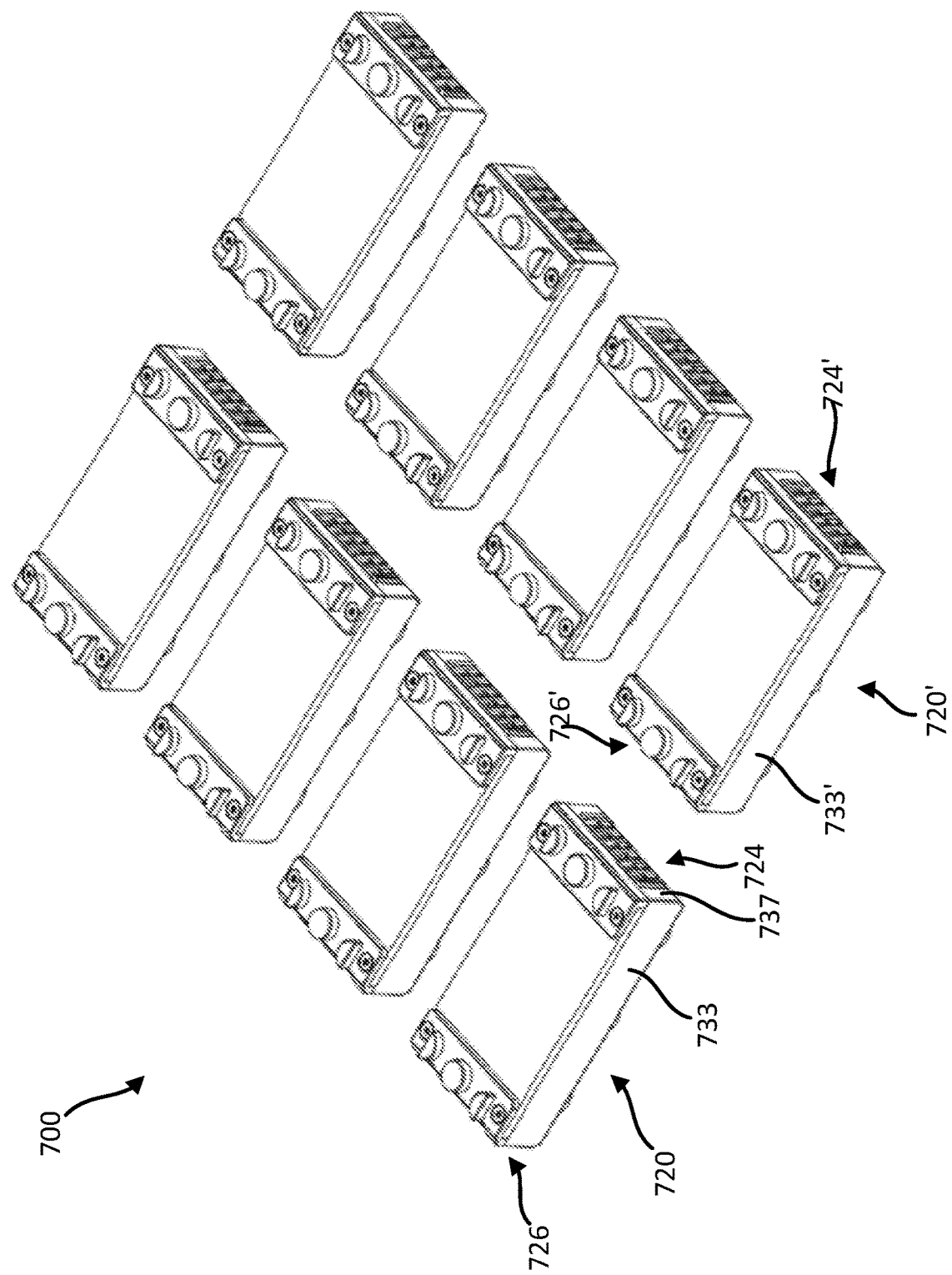
FIG. 44 is a perspective view of multiple modules of the electronic building block system of FIG. 39.
Figure 45:
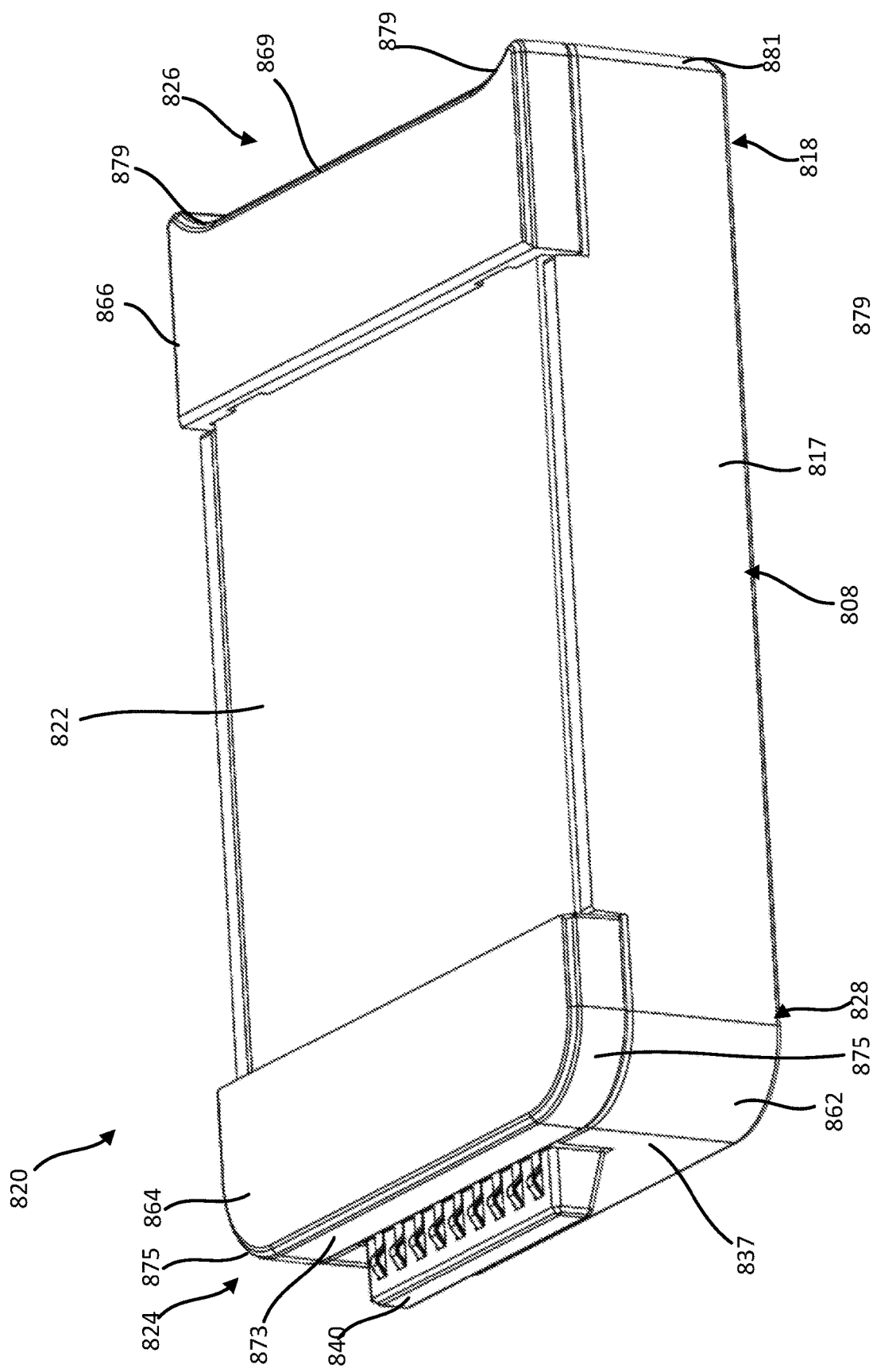
FIG. 45 is a side perspective view of a module of an electronic building block system, according to another embodiment.
Figure 46:
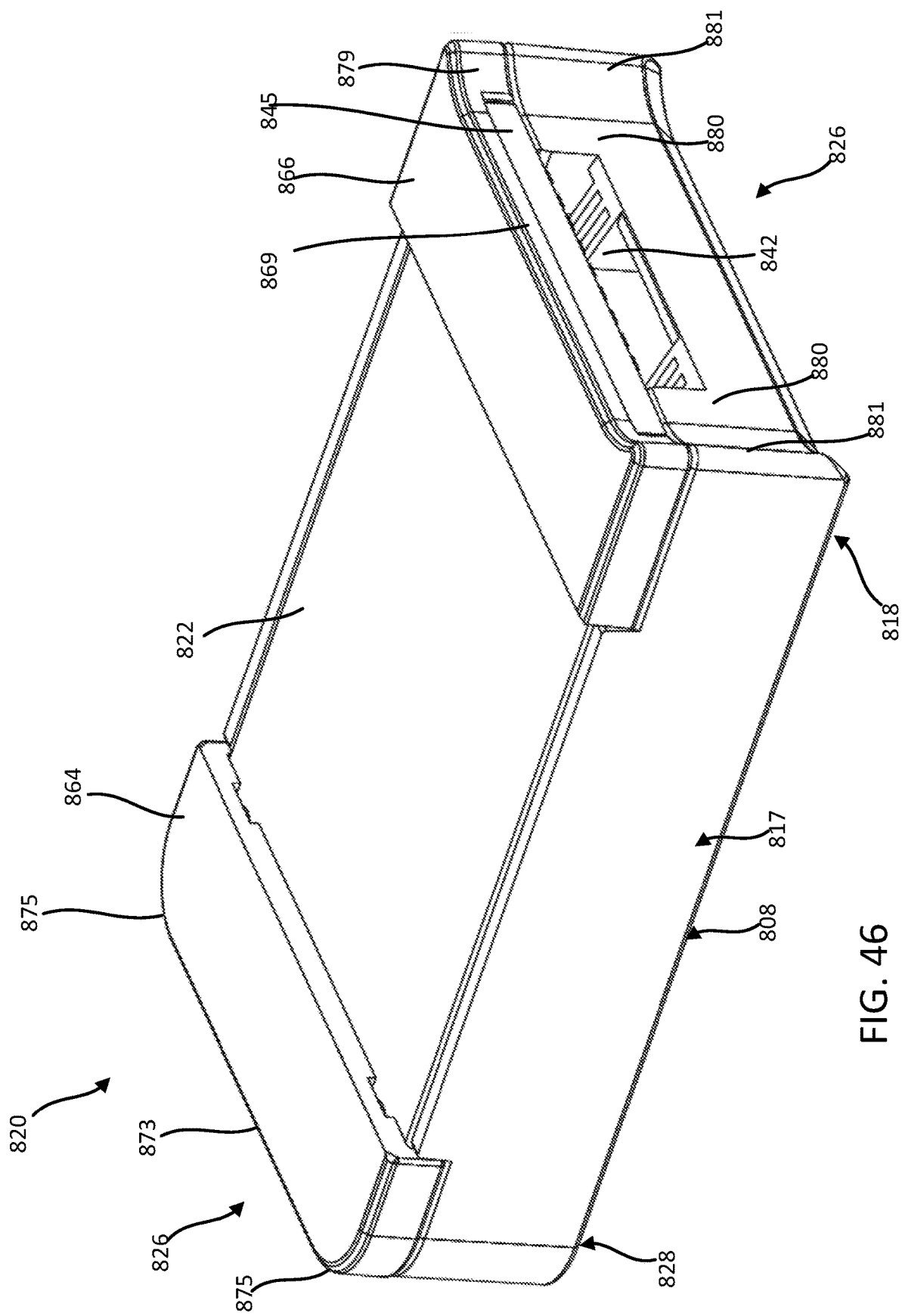
FIG. 46 is a side perspective view opposite the side perspective view of FIG. 45 of the module for an electronic building block system of FIG. 45.
Figure 47:
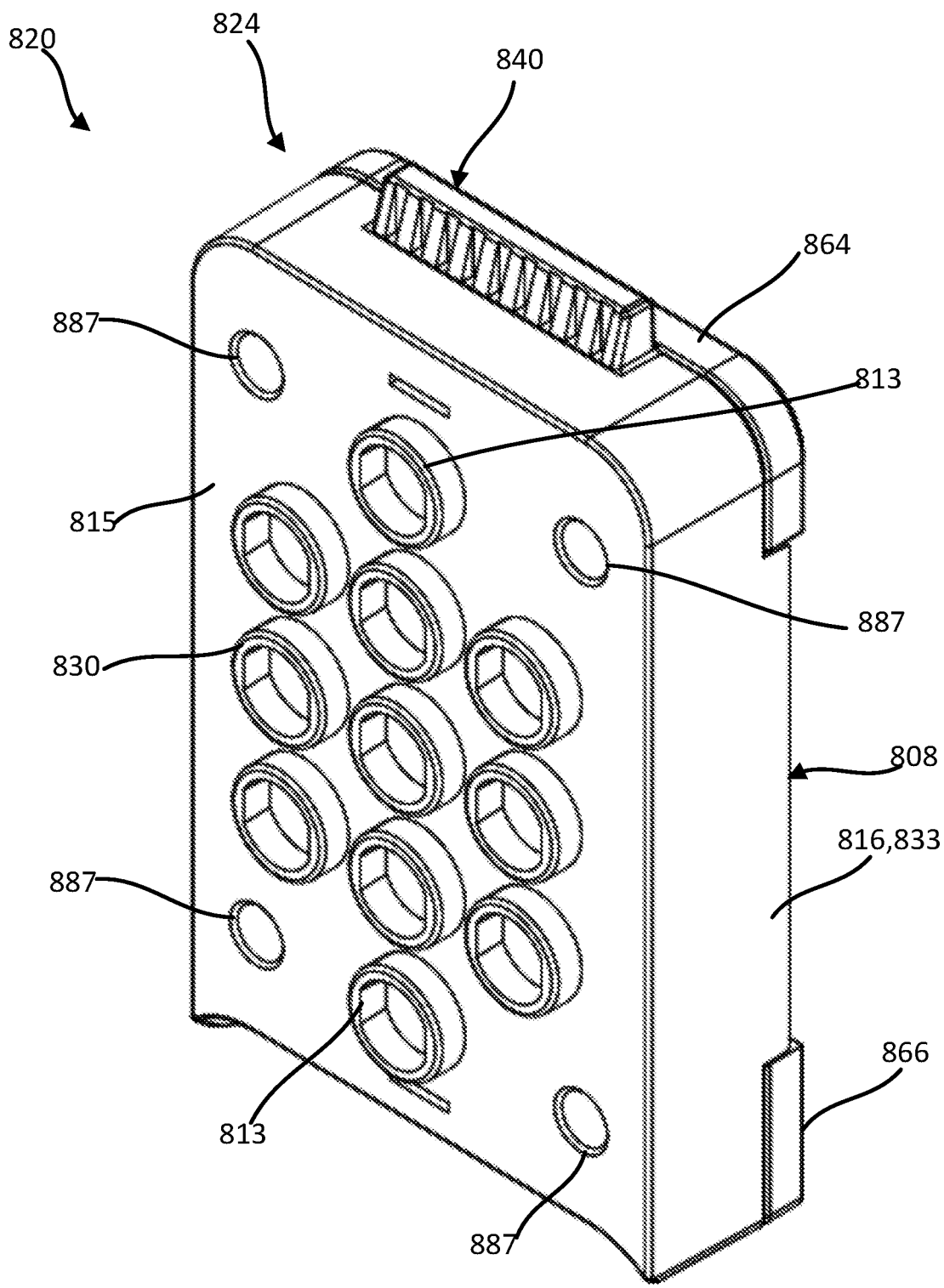
FIG. 47 is a bottom perspective view of the module for an electronic building block system of FIG. 45.
Figure 48:
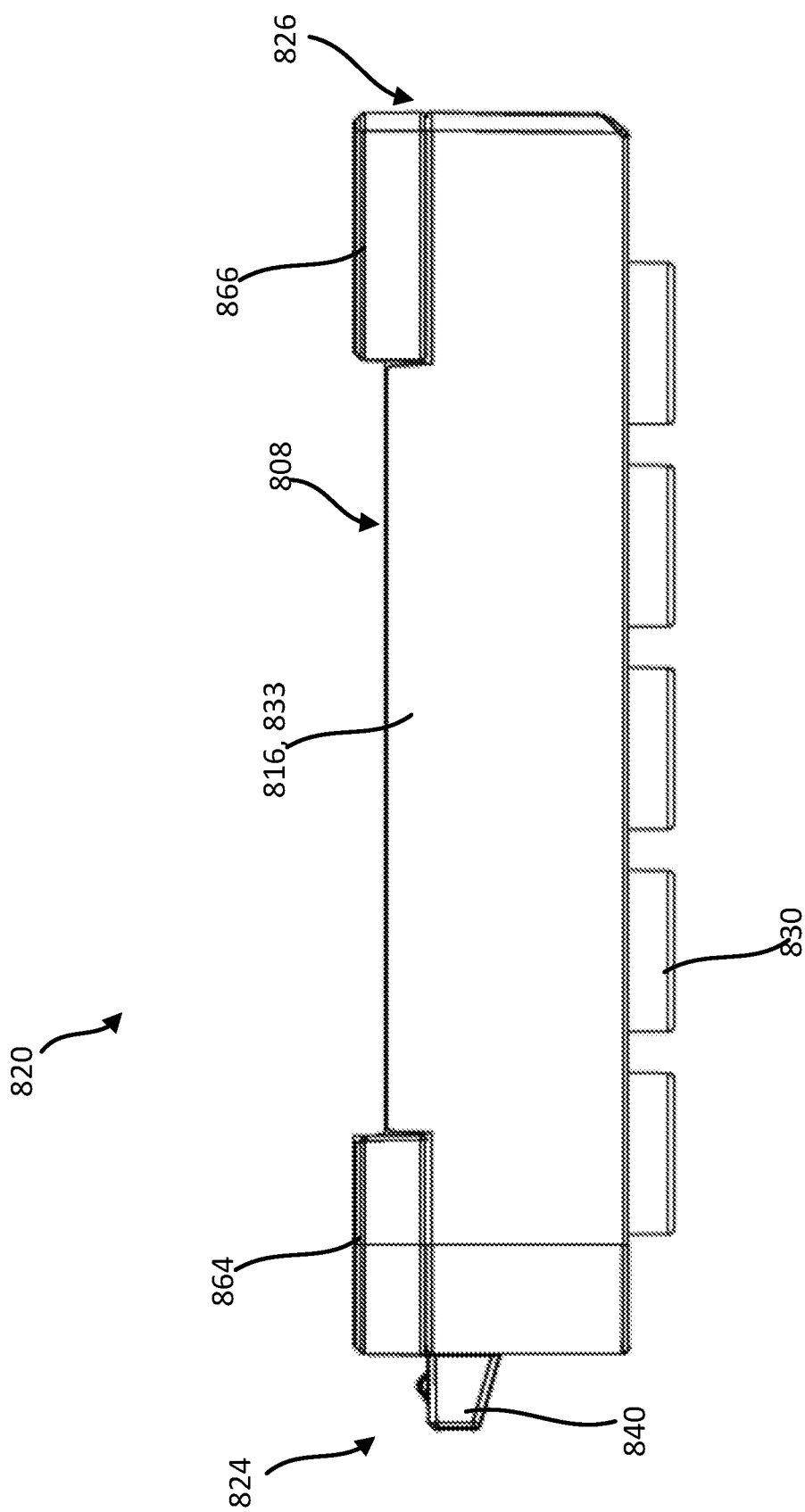
FIG. 48 is a side view of the module for an electronic building block system of FIG. 45.

The floor 715 also includes mounting portions 730 (as shown in FIG. 42) that can be used to removably couple the module 720 to a component of a different building block system (see, e.g., FIG. 43 illustrating module 720 coupled to a LEGO® block LB). In this embodiment, the mounting portions 730 are substantially circular shaped and define a recessed area, as shown in the bottom view of FIG. 42. The recessed area of the mounting portions 730 can matingly couple to, for example, a protrusion or post P of a LEGO® block LB (see, e.g., posts P of block LB in FIG. 43) to removably couple the module 720 to the LEGO® block LB. As shown in FIG. 42, in this embodiment, there are three rows of three mounting portions 730. Each of the rows of three mounting portions 720 is disposed along a width of the module 720, which provides for the module 720 to be coupled to a LEGO® block LB and span four protrusions or post P of the LEGO® block LB.

The circuit board 722 can have the same or similar structure and function as the circuit boards 122 and 222 described above. Each module 720 can also include one or more electrical or electronic components (not shown) such as components 135 described above that can perform a particular function. The various electrical or electronic components can be coupled (e.g., soldered) to the circuit board 722 of a module 720. Electrical power can be provided to the electrical components via a power module (described above) and via the contact assemblies and circuit boards 722 of the modules 720 as described above for previous embodiments.

The connectors 724 and 726 (also referred to herein as connector portions) can also be the same as or similar to the connectors 524, 526 and 624, 626 described above. For example, the housing portion 728 of connector 724 and the housing portion 718 of the connector 726 can be fixedly or permanently coupled to the circuit board 722 with, for example, the fastener 778. For example, the circuit board 722 can include or define openings 736 and the housing portions 728 and 718 of the connectors 724 and 726, respectively, can each define corresponding openings 757 that can receive the fastener therethrough to secure the circuit board 722 to the connectors 724 and 726 (see FIG. 41). The circuit board 722 can also define openings 738 that can receive a locating pin 752 of the connectors 724 and 726 as described above for module 220.

As with previous embodiments, the circuit board 722 is coupled to the connectors 724 and 726 such that a portion of a bottom surface (not shown) of the circuit board 722 contacts a portion of a top surface 755 of the housing portion 728 of connector 724 and a top surface 755 of the housing portion 718 of the connector 726.

In this embodiment, both the housing portion 728 and housing portion 718 include extension portions 762 and front surfaces 737. Each of the housing portions 728 and 718 defines two receptacles 756 that can each receive therein a magnet 750 (see exploded view of FIG. 41) that can be used to removably couple each of the connectors 724 and 726 to a connector of a different module 720 of the system 700. The magnets 750 can be the same as or similar to and function the same as or similar to the magnets 250 described above for modules 120 and 220. For example, with the magnets 750 disposed within the receptacles 756, a magnetic force can be applied/transferred through a front surface 737 of the housing portion 728 of the connector 724 and the housing portion 718 of the connector 726. Thus, the connectors 724 and 726 can each be removably coupled to another connector of another module 720 through magnetic force when the front surfaces 737 of the connectors 724 and 726 engages/contacts a front surface of another connector (similarly constructed with magnets disposed within a receptacle). In other words, the connectors 724 and 726 will be magnetically coupled to the other connectors via magnetic force of the magnets 750.

Figure 41:
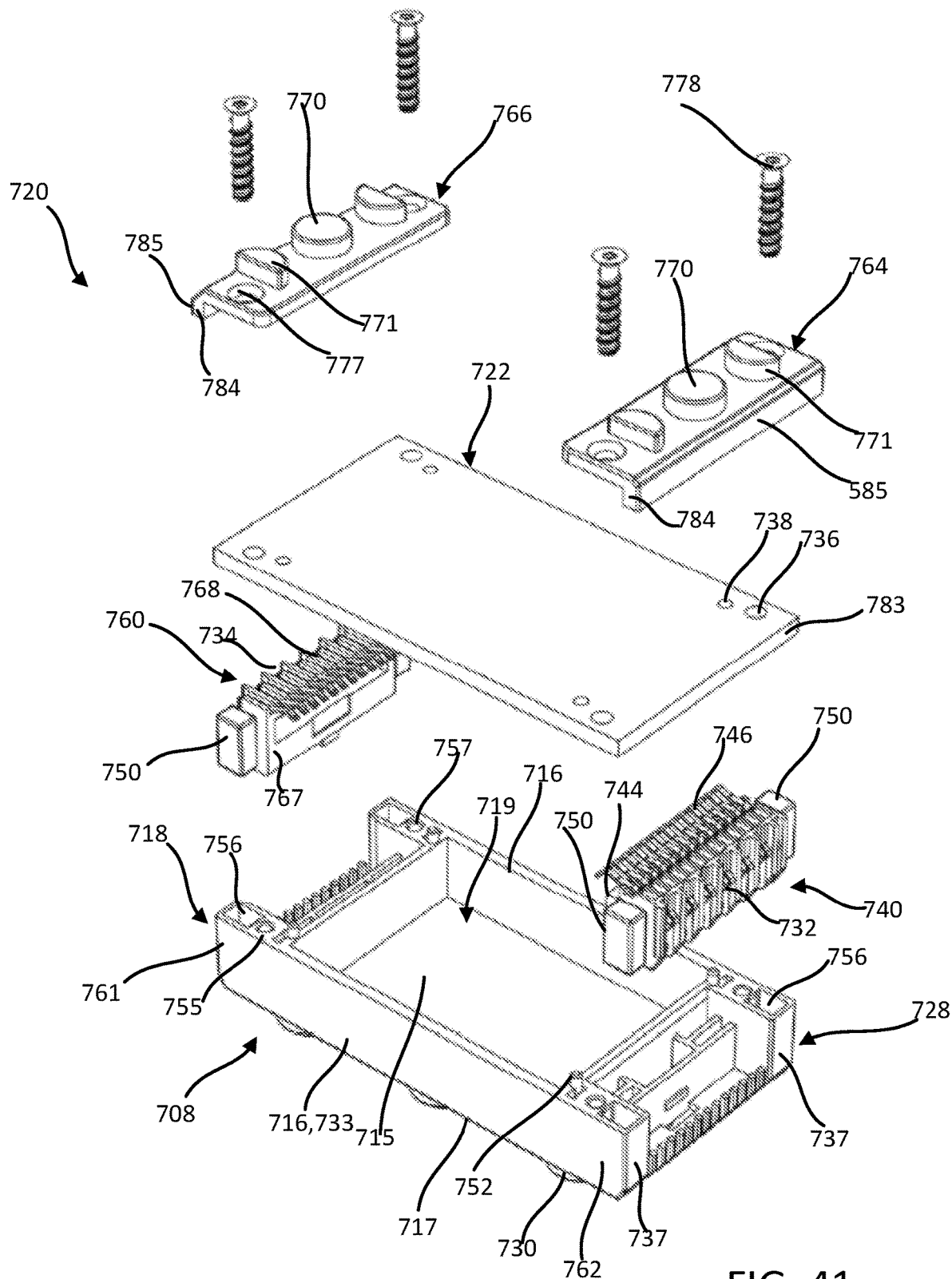
FIG. 41 is an exploded view of the module of the electronic building block system of FIG. 39.

The module 720 further includes a first contact assembly 740 that is coupled to or included within the connector 724 and a second contact assembly 760 that is coupled to or included within the connector 726. The first contact assembly 740 can be constructed the same as or similar to the first contact assembly 240, and the second contact assembly 760 can be constructed the same as or similar to the second contact assembly 260. The first contact assembly 740 includes a base 744 and multiple electrical contacts or conductors 746 coupled to the base 744 as best shown in FIG. 41. The second contact assembly 760 includes a base 767 and multiple electrical contacts or conductors 768 as best shown in FIG. 41. The contacts 746 and the contacts 768 can be, for example, spring probes or a small metal plate(s). In this embodiment, there are 13 contacts 746, and 13 contacts 768, but it should be understood that a different number of contacts 746 and/or a different number of contacts 768 can be used. The contacts 746 are coupled to the base 744 through engagement with the base 744, without the use of a solder connection. Similarly, the contacts 768 are coupled to the base 767 through engagement with the base 767, without the use of a solder connection. The contact assemblies 740 and 760 can be coupled to the connectors 724 and 726, respectively, in the same or similar manner as described for contact assemblies 240 and 260. For example, the first contact assembly 740 and the second contact assembly 760 can each be fixedly or permanently coupled to the housing portion 728 of connector 724 and the housing portion 718 of connector 726, respectively, and to the circuit board 722 without the use of a solder connection.

The connectors 724 and 726 of the module 720 also include an interlocking coupling mechanism as described above for modules 220 that includes, for example, protrusions 732 provided as part of the contact assembly 740 and recesses 734 defined at least in part by the second contact assembly 760 as described above for module 220. The protrusions 732 of a connector 724 of a first module 720 can be slidably received in a vertical direction within recesses 734 of a connector 726 of a second module 720. The interlocking of the protrusions 732 and recesses 734 can inhibit two modules 720 from sliding laterally or side-to-side with respect to each other when removably coupled together.

In this embodiment, the module 720 also includes adapters 764 and 766 that can be used to couple the module 720 to a component of a different building block system such as a LEGO® block as described herein for modules 320 and 420. In this embodiment, the adapters 764 and 766 each include coupling portions that include one post 770 and two half-posts 771 and define openings 777, as shown in the exploded view of FIG. 41. The adapters 764 and 766 can be coupled to the circuit board 722 and connectors 724 and 726 (described in more detail below) with, for example, threaded fasteners 778. For example, the same fasteners used to couple the circuit board to the connectors 724 and 726 can be used to couple the adapters 764 and 766 to the circuit board 722. The circuit board 722 is coupled to the housing structure 708 such that the outer side edges 782 of the circuit board 722 are aligned with the outer surfaces 733 of the housing structure 708, and end surfaces 783 of the circuit board 722 (see, e.g., exploded view of FIG. 41) are disposed under the adapters 564 and 766 and unexposed on the ends of the modules 720. More specifically, each of the adapters 764 and 766 include an over-flange 784 that is disposed against the end surfaces 783 of the circuit board 722 and on the top surfaces 755 of the respective connector 724 and 726 when connected thereto. Further, a front surface 785 of the over-flanges 784 of the adapters 764 and 766 is disposed substantially aligned with the front surfaces 737.

As with the previous embodiments, the connectors 724 and 726 of the module 720 can each be coupled to a different connector of another module 720 with the magnets 750 and the interlocking coupling mechanism (e.g., protrusions 732 and recesses 734) further helps maintain the connectors of the different modules coupled together. As described above, to couple a connector 726 of a first module 720 to a connector 724 of a second module 720, the protrusions 732 of the connector 724 can be received within the recesses 734 of connector 726 in a vertical direction. When a module 720 is removably coupled to another module 720, the front surfaces 737 of the connector 724 contact the front surfaces (e.g., 737) of the connector (e.g., 726) of the other module 720, as described above for previous embodiments. Further, when the module 720 is removably coupled to another module 720, the side surfaces 733 of the housing structure 708 (and of the housing portions 728 and 718) of the module 720 are aligned or substantially aligned with side surfaces (of the housing) of the connector of the other module 720. For example, as shown in FIG. 43, the module 720 can be removably coupled to the module 720' and the side surfaces 733 of housing portion 728 of the connector 724 can be aligned with the side surfaces 733' of the housing portion 718' of the connector 726', and the front surfaces 737 of the connector 724 can abut and contact the front surfaces (not shown in FIG. 43) of the connector 726'.

Figure 55:
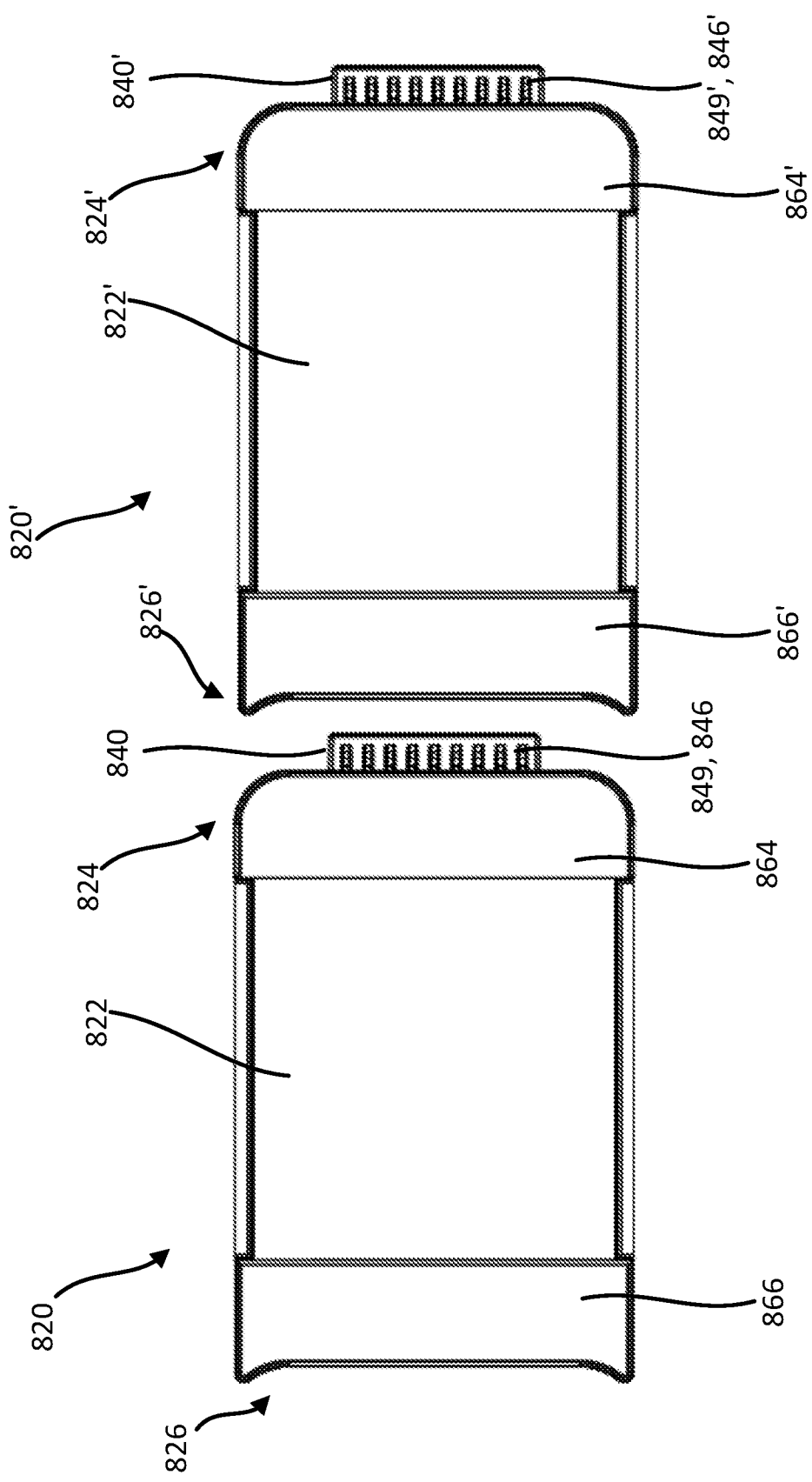
FIG. 55 is a top view illustrating two of the modules of the electronic building block system of FIG. 45.
Figure 56:
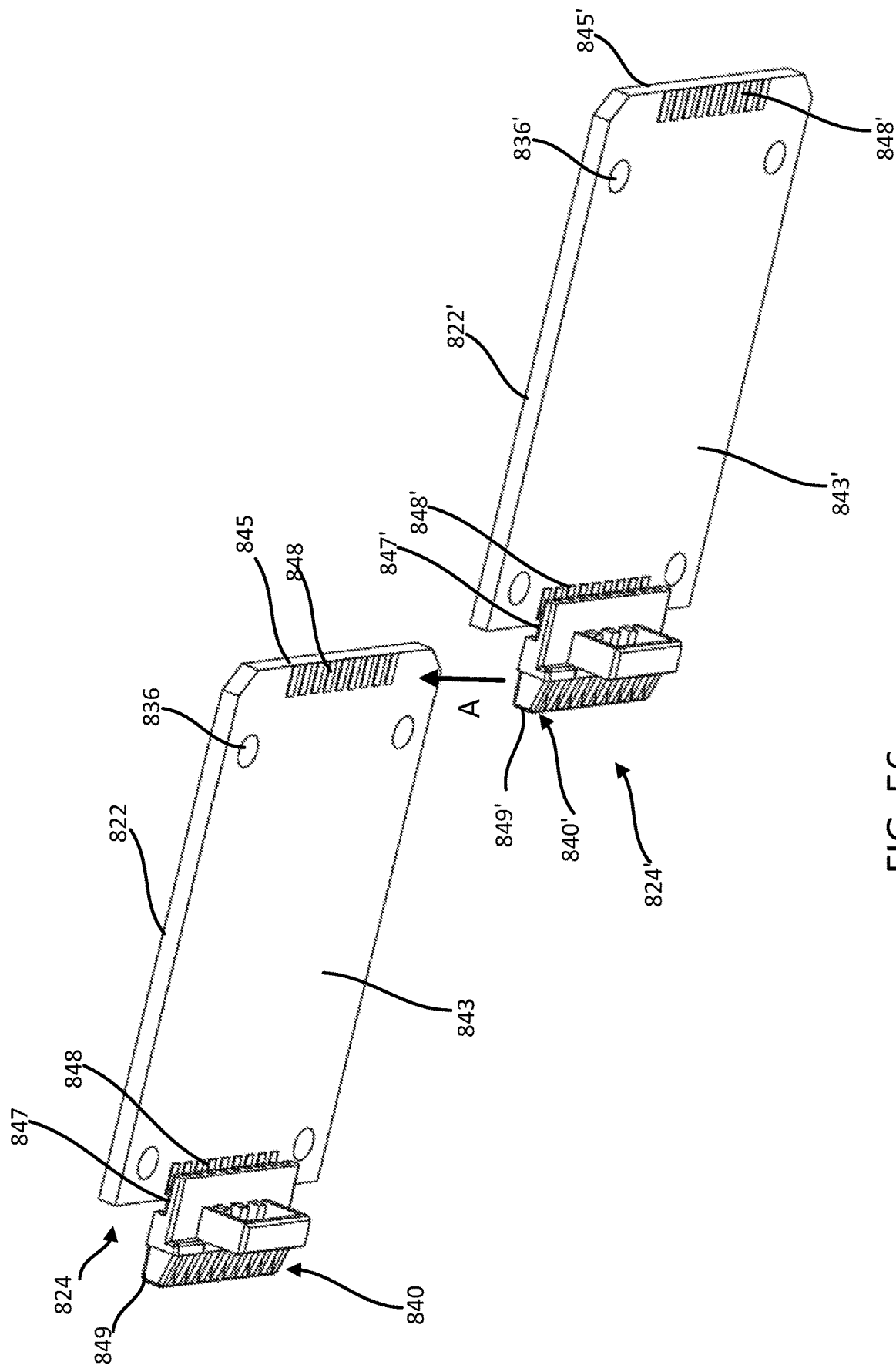
FIG. 56 is a bottom perspective view of the circuit boards and contact assemblies of the two modules of the electronic building block system of FIG. 55.
Figure 57:
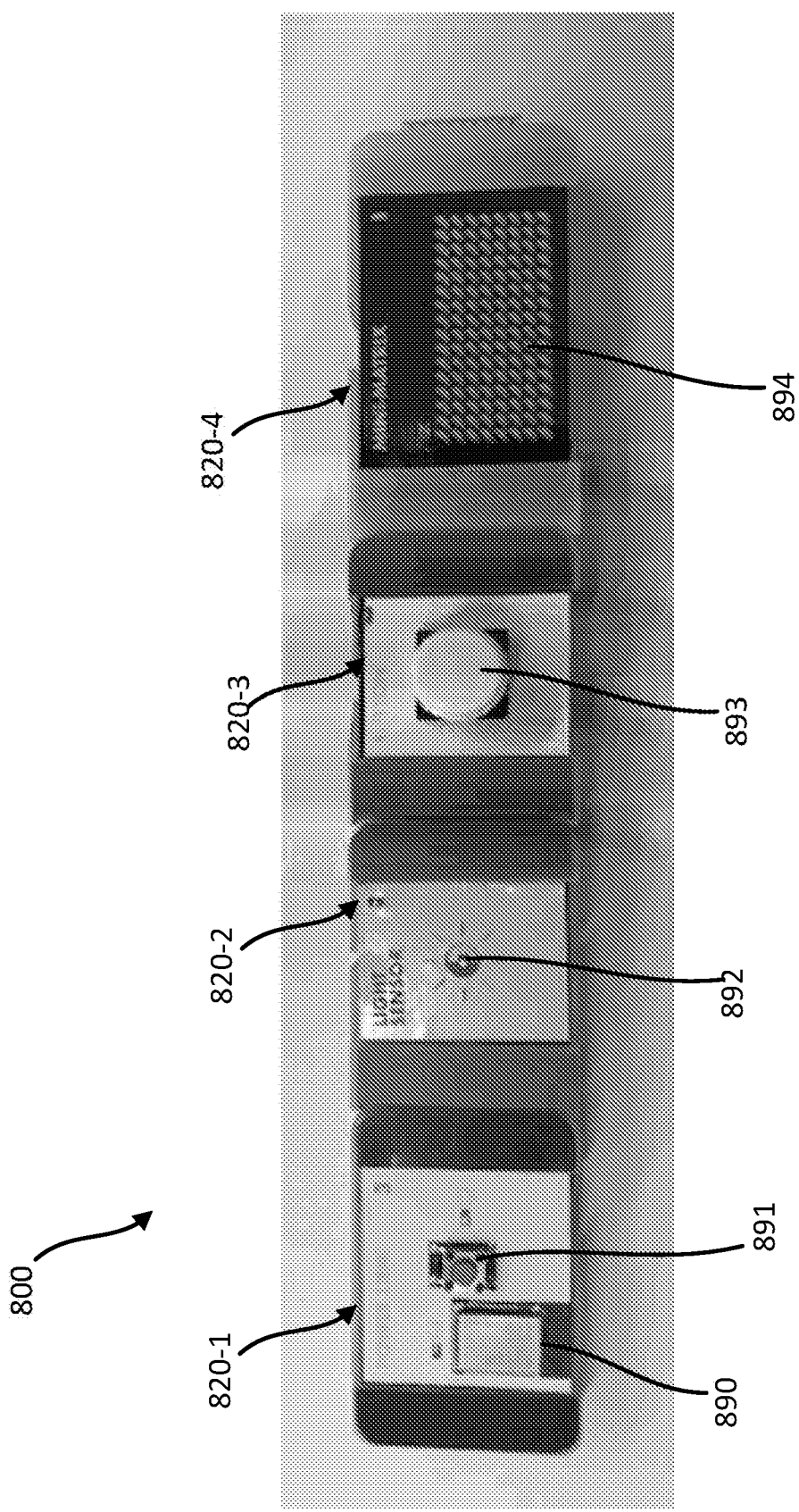
FIG. 57 is a top view illustrating four modules of the electronic building block system of FIGS. 45-56 shown coupled together.

FIGS. 45-56 illustrate components of yet another embodiment of a modular electronic building block system that is similar to, for example, the systems 500 and 600. A modular electronic building block system 800 (also referred to herein as "system", "block system" or "electronic building block system" or "electronic building system") can include one or more electronic modules 820 (also referred to herein as "modules," "blocks," or "electronic blocks") that can each be removably coupled to at least one other module 820 in a similar manner as described above for previous embodiments. FIG. 55 illustrates two modules 820 just prior to being coupled together and FIG. 57 illustrates four modules 820 coupled together.

The modules 820 can include the same or similar features and can provide the same or similar function(s) as described above for modules 520 and 620 and can be coupled to another module 820 in the same or similar manner. Thus, some details of the module 820 are not described herein. Further, although not shown in FIGS. 45-55, the modules 820 of the system 800 can each include one or more electrical components (e.g., electrical components 135) as described above for system 100 that can each provide a module 820 with a particular functionality, and include various categories and types of modules as described above. For example, the system 800 can include a power module 820 and when the power module 820 is removably coupled to another module 820 having an electrical component, such as for example a light or audio component, the power module 820 can provide power to that other module 820.

In this embodiment, the module 820 includes a printed circuit board 822 (also referred to as "PCB" or "circuit board") coupled to a housing structure 808. The housing structure 808 includes housing portions 828 and 818 of a first connector or connector portion 824 and a second connector or connector portion 826, respectively, and a base portion 817 between the housing portions 828 and 818. In this embodiment, the module 820 includes a single contact assembly 840 on one end of the module 820 and a receiving pocket 842 on an opposite end of the module 820 as described in more detail below. The module 820 also includes caps 864 and 866.

The housing portion 828 includes convex corner portions 862 and front surfaces 837, and the housing portion 818 includes concave corner portions 881 and front surfaces 880. Each of the housing portions 828 and 818 also defines two receptacles 856 (see FIGS. 52 and 53) that can each receive therein a magnet 850 (see FIGS. 54A and 54B) that can be used to removably couple each of the connectors 824 and 826 to a connector of a different module 820 of the system 800. The magnets 850 can be the same as or similar to and function the same as or similar to the magnets 250 described above for modules 120, 220 and 520 and provide similar coupling capabilities. The receptacles 856 have a first end open at the top surface of the housing portions 828 and 818 and a second end opposite the first end of the receptacles 856 that is closed. When the circuit board 822 is coupled to the housing portions 818, 828, the circuit board 822 covers the first end of the receptacles 856, preventing the magnets 850 from being removed from the receptacles 856.

The housing portions 828 and 818 and the base portion 817 are monolithically formed as a single component. The base portion 817 of the housing 808 includes two side walls 816 each having a side surface 833, and a bottom floor 815 that collectively with the housing portions 818 and 828 define an interior region 819 (see, e.g., FIGS. 52-54A). As described above for previous modules, the interior region 819 can contain various components of the module 820, such as circuitry and other electrical hardware (not shown in FIGS. 45-56). In some embodiments, although not shown, the floor 815 can optionally define openings as with floor 515 described above, to provide viewing access to the interior region 819. In some embodiments, alternatively or in addition to openings, the floor 815 can be formed with a clear or translucent material such that a user can view the interior components through the floor 815.

The floor 815 also includes mounting portions 830 disposed on an exterior side (as shown, for example, in FIGS. 47, 48, 49A-B and 50) that can be used to removably couple the module 820 to a component of a different building block system, such as, for example, a LEGO® block. In this embodiment, the mounting portions 830 are substantially circular shaped and define a recessed area. The recessed area of the mounting portions 830 can matingly couple to, for example, a protrusion or post of a LEGO® block to removably couple the module 820 to the LEGO® block as described above, for example, for module 520. In addition, in this embodiment, the floor 815 includes two additional mounting portions 813, which can provide further coupling to a component of a different building block system.

The shape and contour of the housing portions 828 and 818 are such that when one module 820 is coupled to another module 820, the housing portion 828 of one module 820 complimentarily fits to the housing portion 818 of the other module 820, as shown for example for modules 620 in FIG. 31. Similarly, the shape and contour of the caps 864 and 866 are such that when one module 820 is coupled to another module 820, the cap 864 of one module 820 complimentarily fits to the cap 866 of the other module 820.

The circuit board 822 can have the same or similar structure and function as the circuit boards described above. Each module 820 can also include one or more electrical or electronic components (not shown), such as components 135 described above, that can be coupled to the circuit board 822 and perform a particular function. In this embodiment, the circuit board 822 includes contacts 848 disposed on a bottom surface 843 of the circuit board 822 at each end of the circuit board 822 as shown in FIG. 56. The contacts 848 provide an electrical connection between modules when coupled together as described in more detail below.

Figure 33:
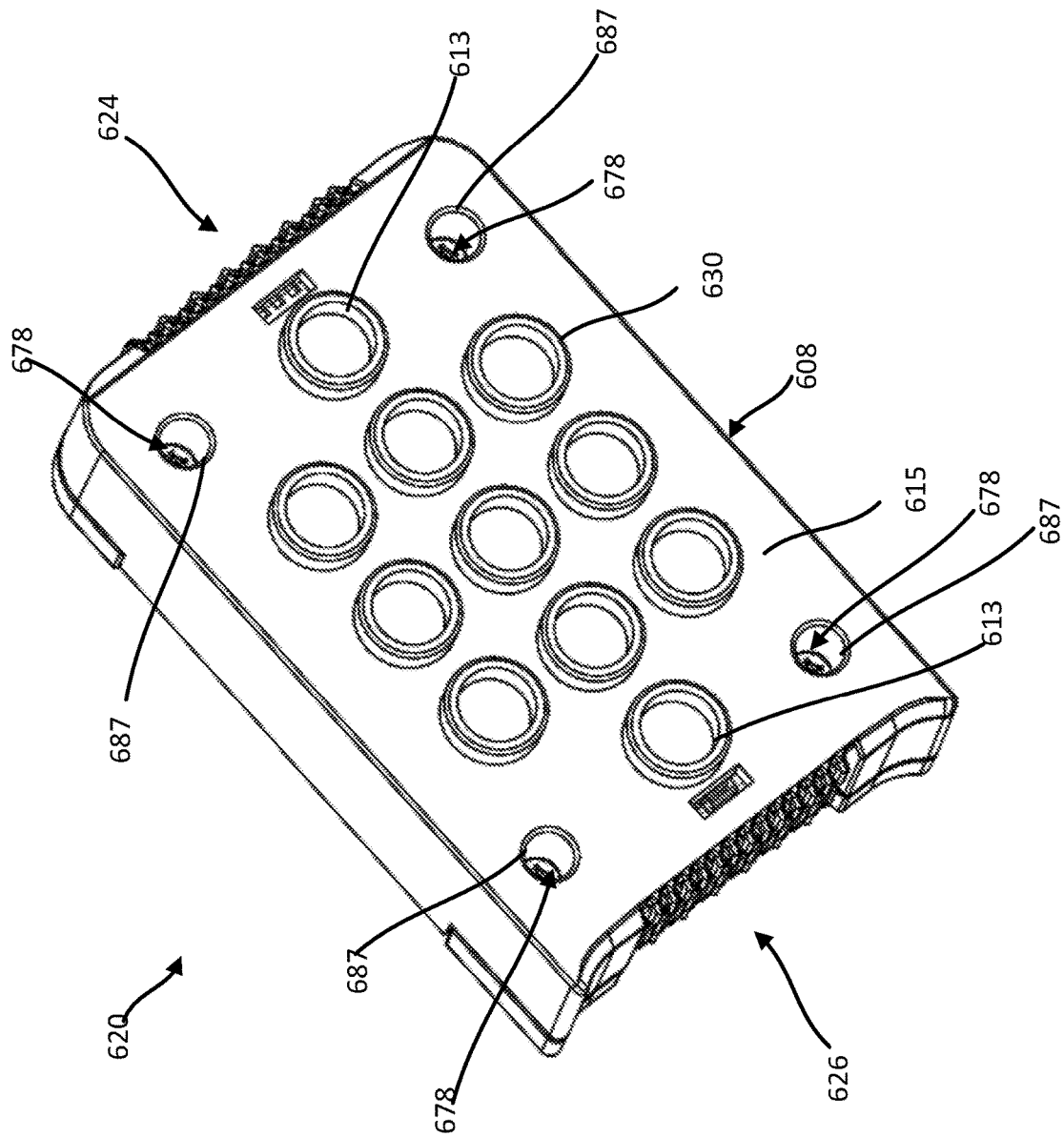
FIG. 33 is a bottom perspective view of the module of the electronic building block system of FIG. 30A.
Figure 35:
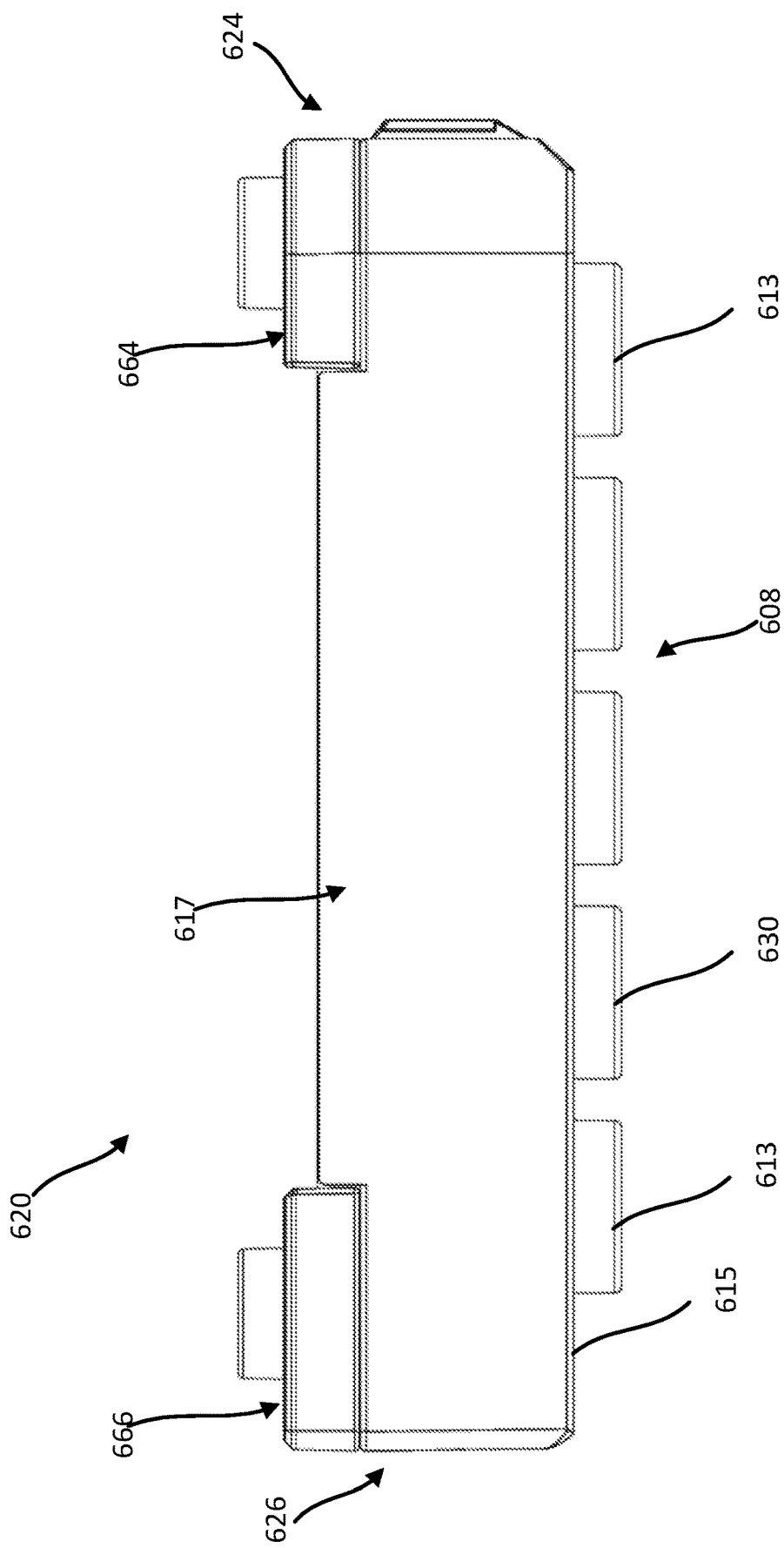
FIG. 35 is a side perspective view of the module of the electronic building block system of FIG. 30A.
Figure 36B:
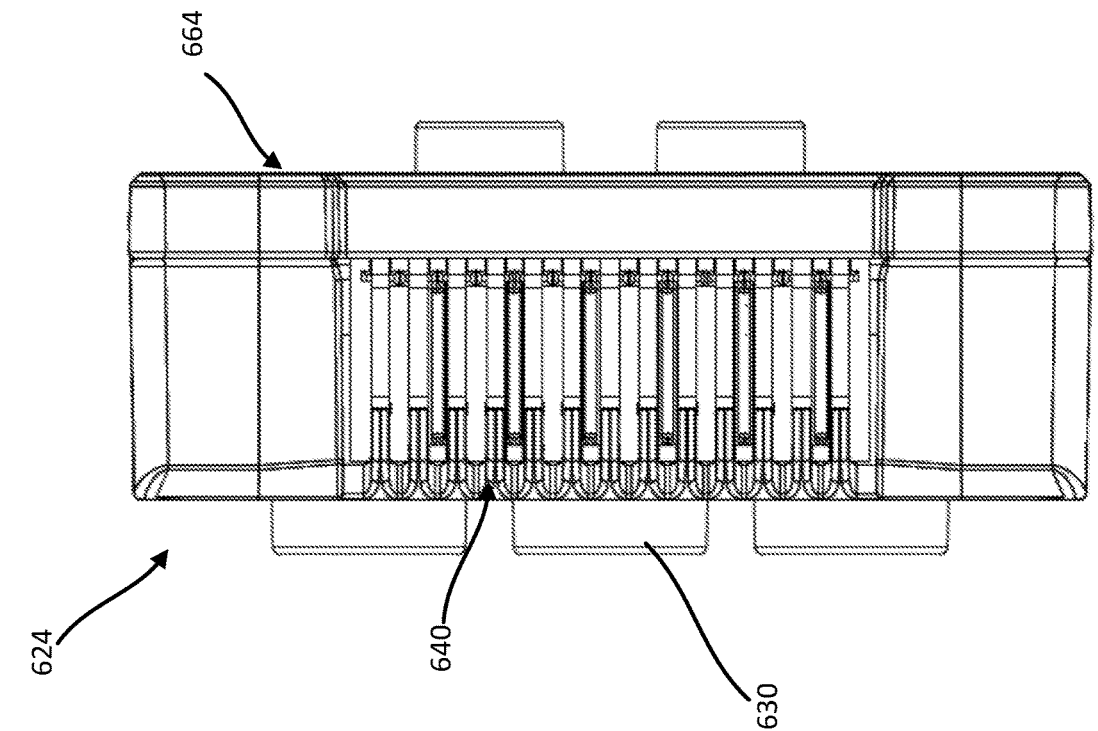
FIG. 36B is a second end view opposite the first end view of FIG. 36A of the electronic building block system of FIG. 30A.
Figure 36A:
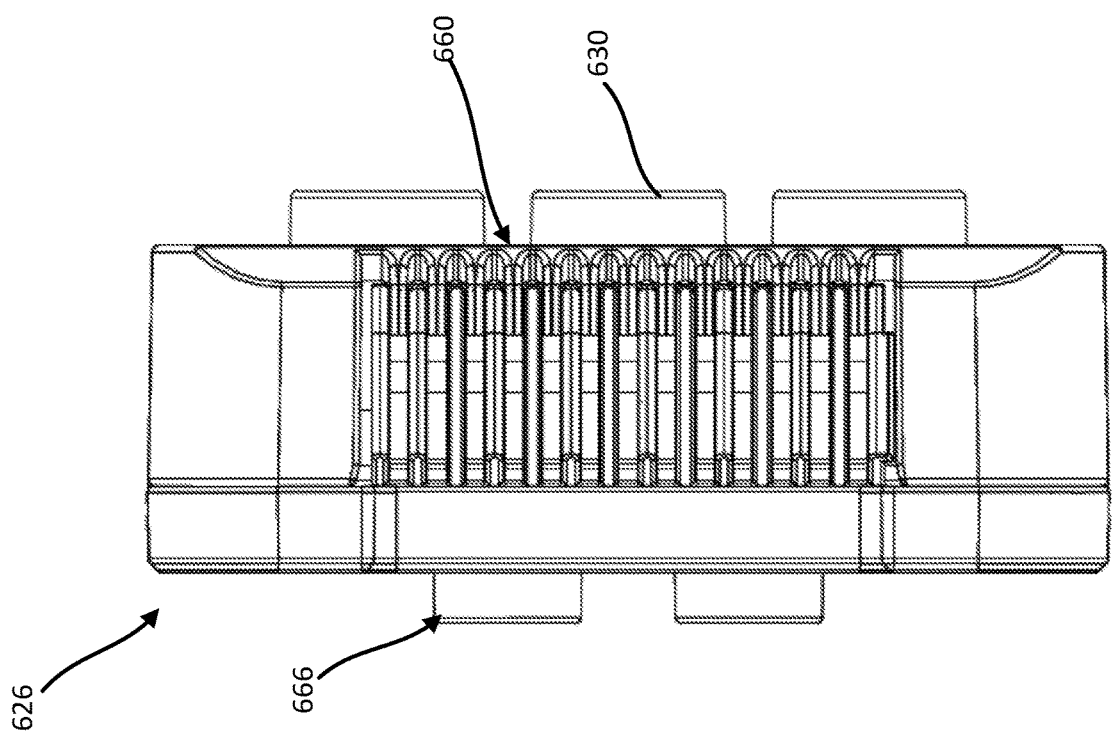
FIG. 36A is a first end view of the module of the electronic building block system of FIG. 30A.
Figure 37:
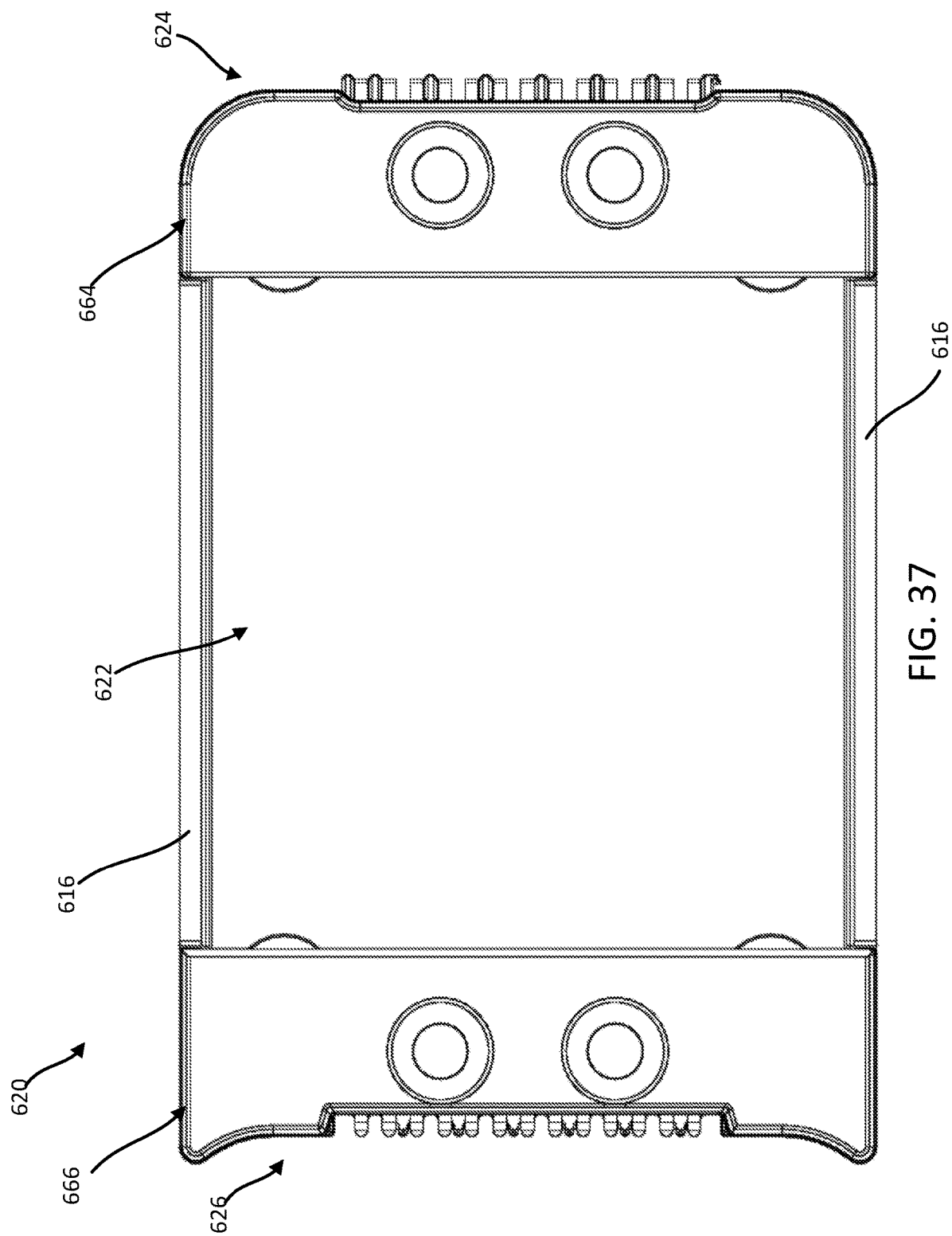
FIG. 37 is a top view of the module of the electronic building block system of FIG. 30A.
Figure 49A:
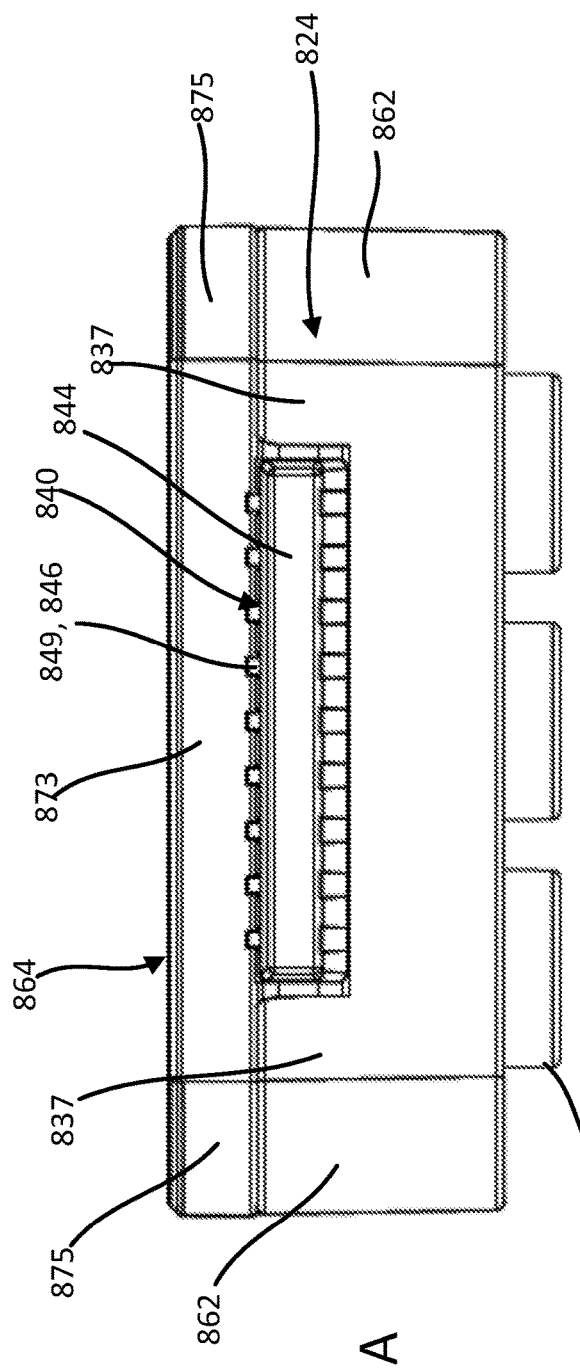
FIG. 49A is a first end view of the module for an electronic building block system of FIG. 45.
Figure 49B:
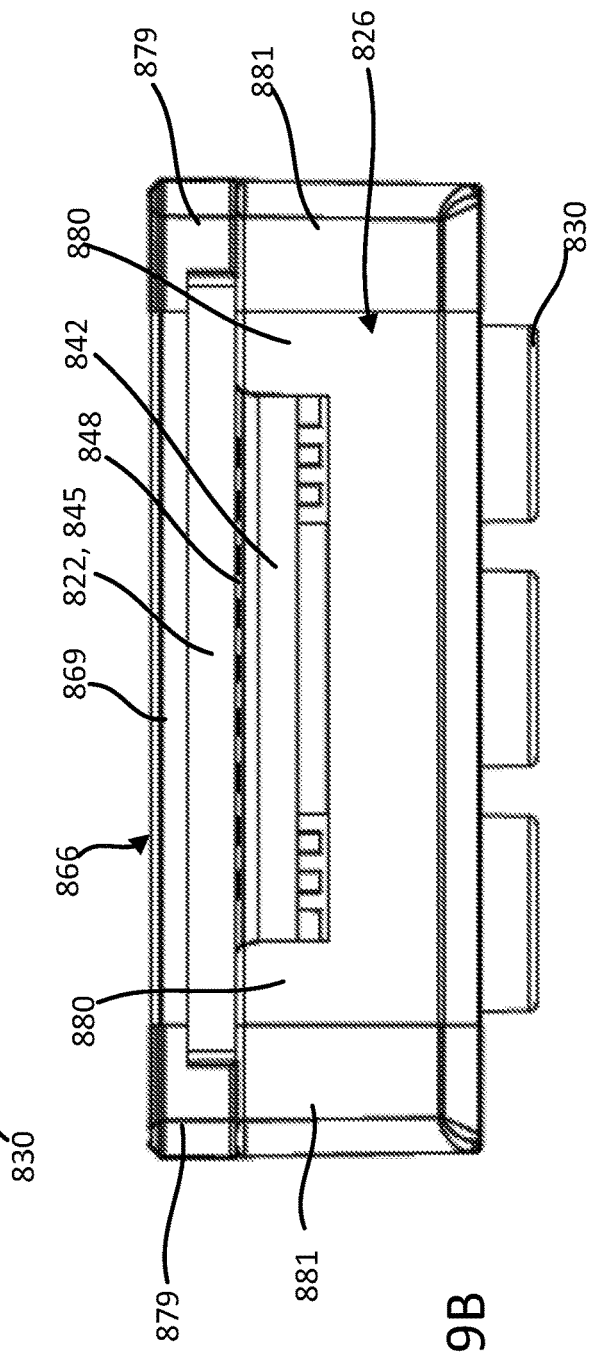
FIG. 49B is a second end view opposite the first end view of FIG. 49A of the module for an electronic building block system of FIG. 45.
Figure 50A:
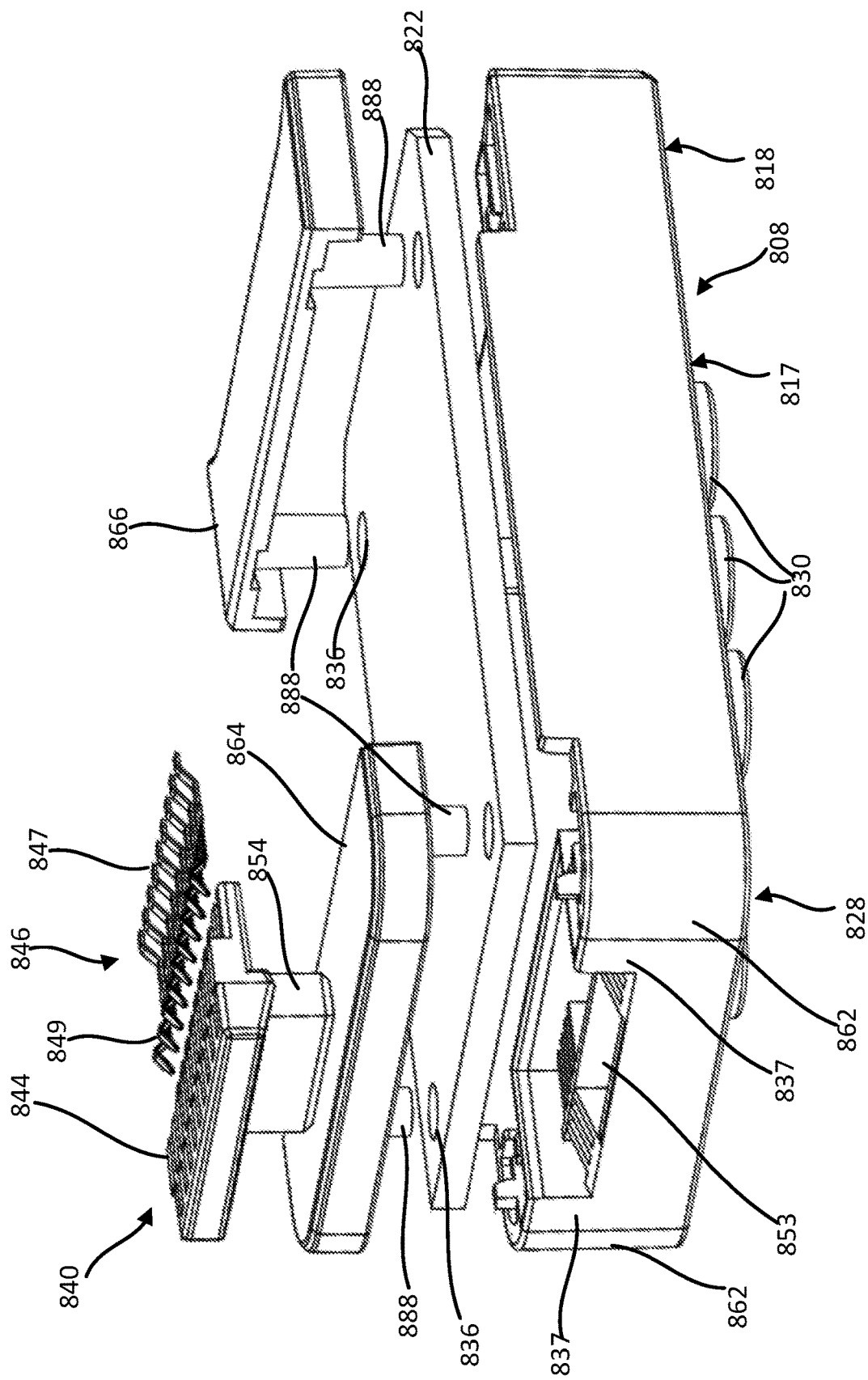
FIG. 50A is an exploded side perspective view of the module for an electronic building block system of FIG. 45.
Figure 50B:
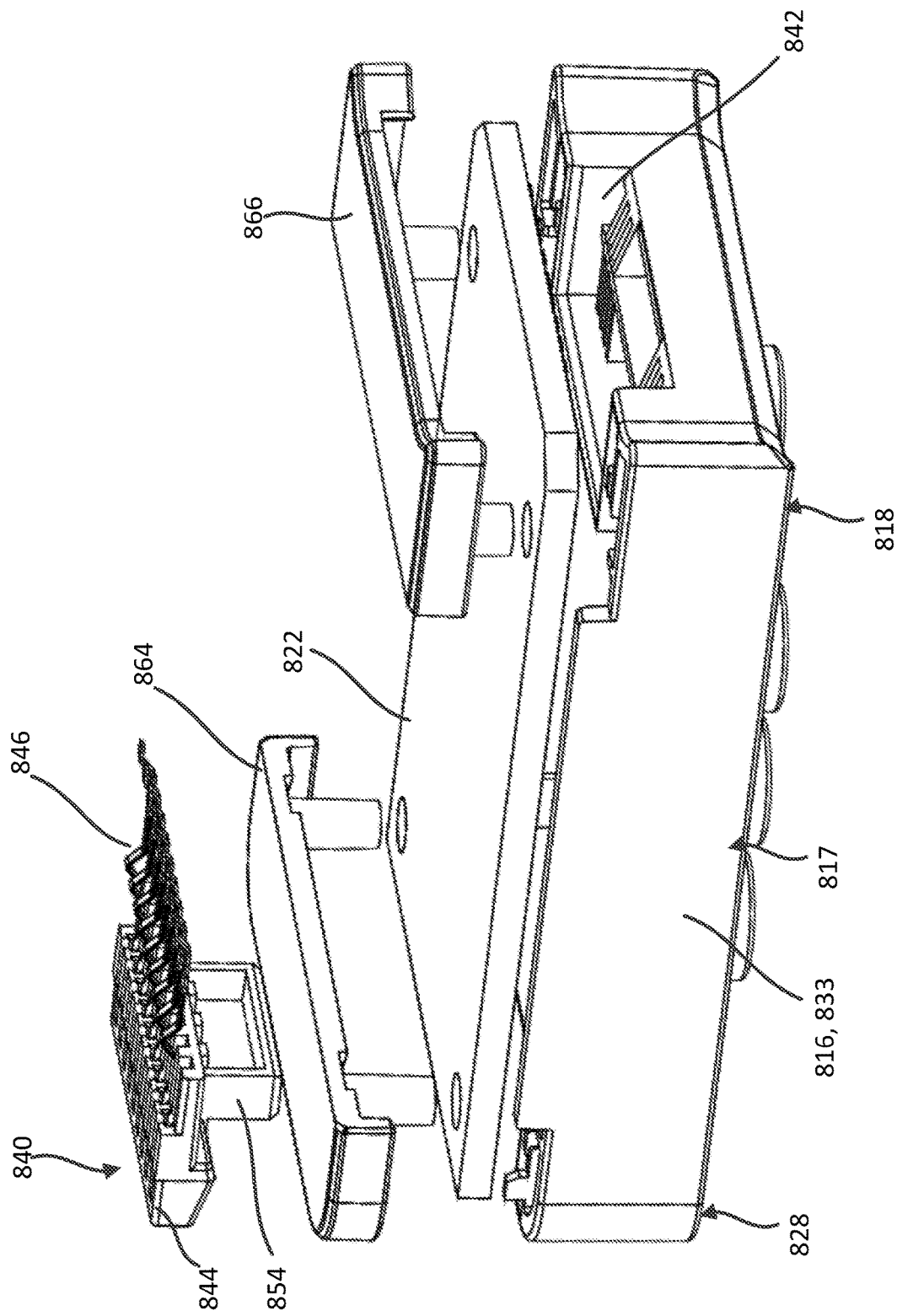
FIG. 50B is an exploded side perspective view opposite the side perspective view of FIG. 50A of the module for an electronic building block system of FIG. 45.
Figure 51:
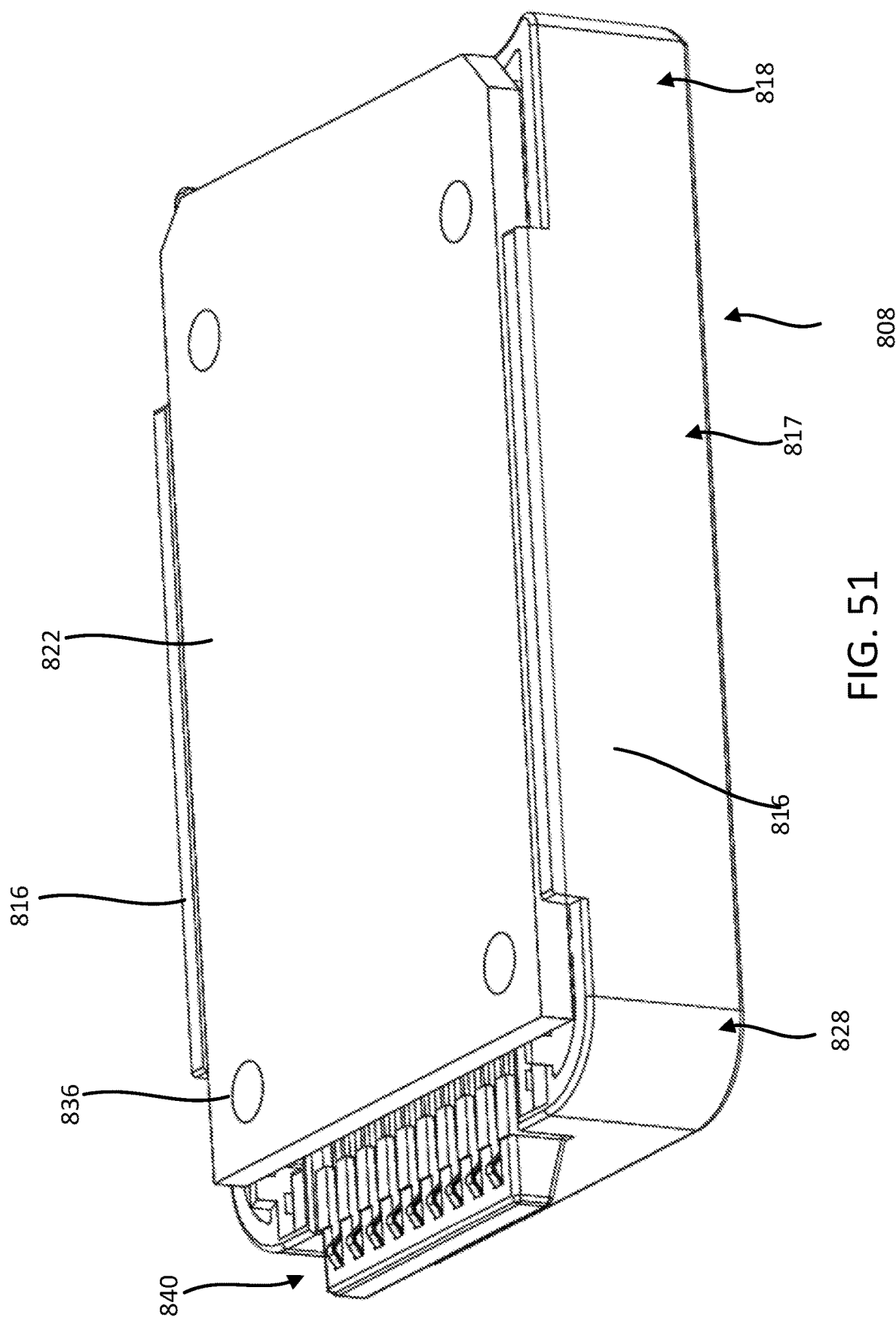
FIG. 51 is a side perspective view of the module for an electronic building block system of FIG. 45 with the caps removed for illustration purposes.
Figure 52:
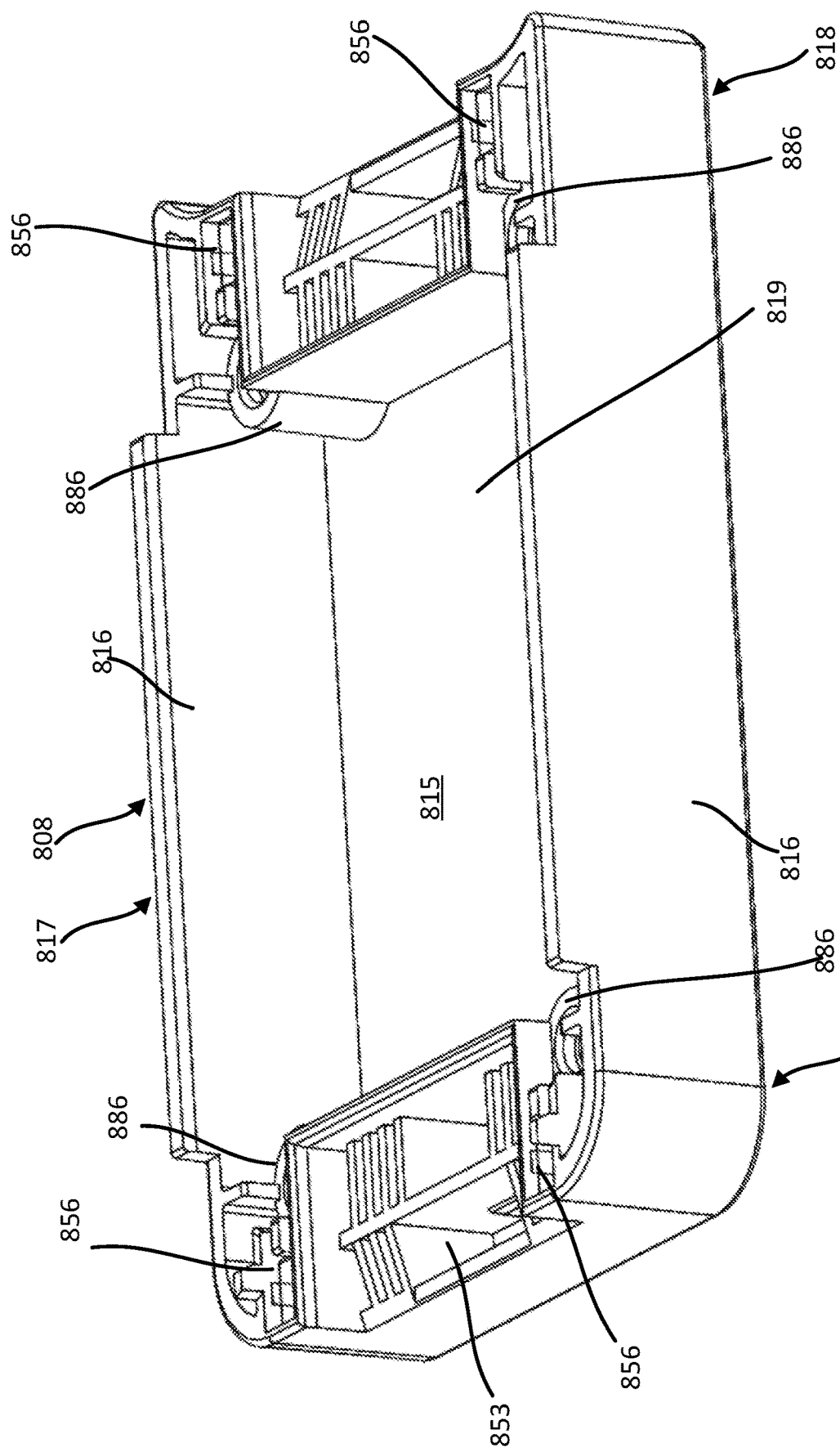
FIG. 52 is a side perspective view of the housing structure of the module for an electronic building block system of FIG. 45.
Figure 53:
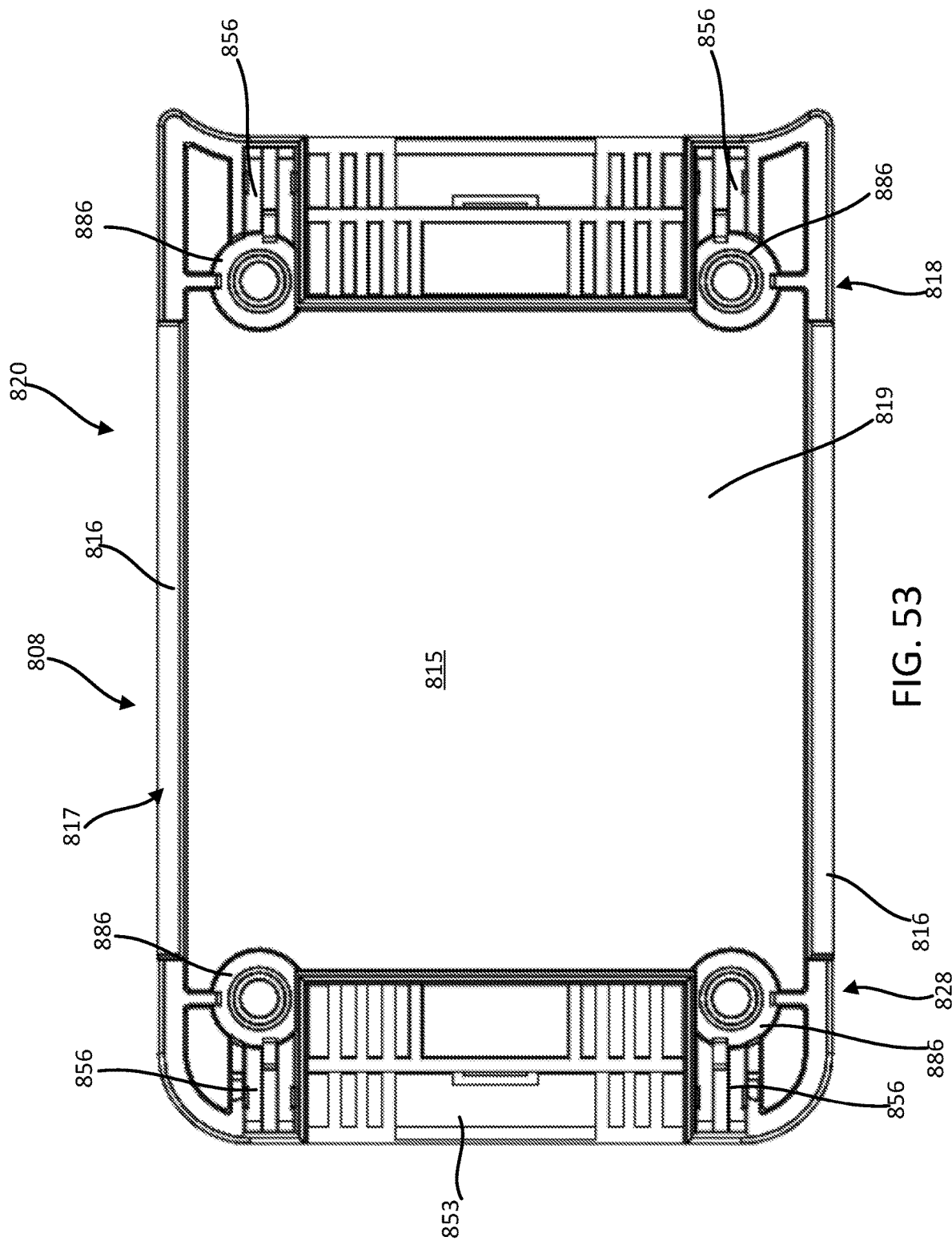
FIG. 53 is a top view of the housing structure of the module for an electronic building block system of FIG. 45.
Figure 54:
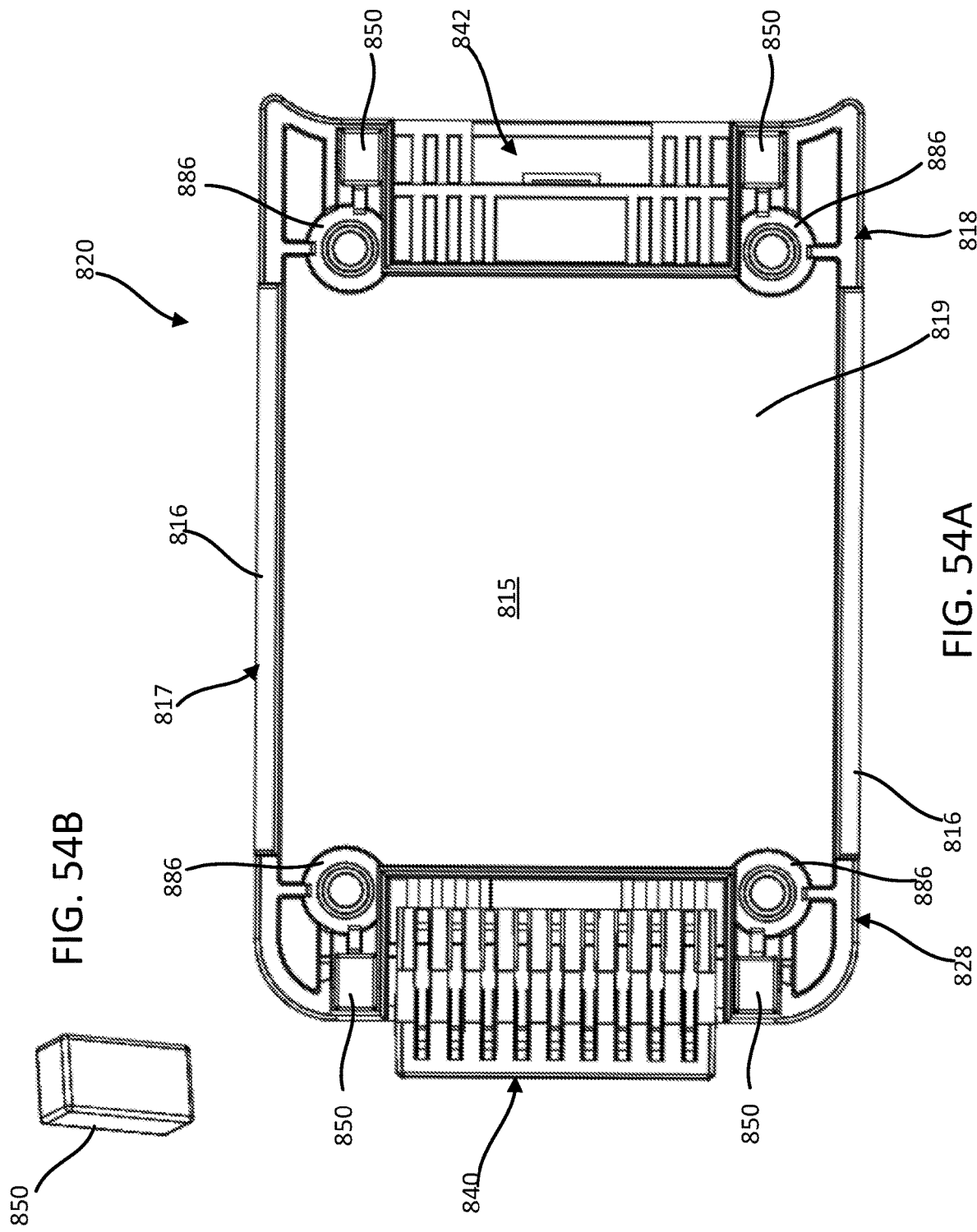
FIG. 54A is a top view of the module for an electronic building block system of FIG. 45 with the circuit board and caps removed for illustration purposes.
FIG. 54B is a side perspective view of a magnet of the module for an electronic building block system of FIG. 45.

The housing portion 828 of connector 824 and the housing portion 818 of the connector 826 can be fixedly or permanently coupled to the circuit board 822 with, for example, fasteners (not shown in FIGS. 45-56) such as fasteners 678 shown in FIGS. 32, 33 and 38 for module 620. The circuit board 822 is coupled to the housing structure 808 (e.g., housing portions 828 and 818) such that a portion of the outer side edges of the circuit board 822 are bounded on the sides by a top portion of the walls 816. A portion of the outer side edges near the ends of the circuit board 822 are hidden by flanges of the caps 864 and 866. An end surface of the portion of the circuit board 822 disposed under cap 864 is unexposed, as shown in FIG. 49A, and an opposite end surface of the circuit board 822 is disposed under the cap 866, but visible at that end of the module 820, as shown for example, in FIG. 49B. As with previous embodiments, the circuit board 822 is coupled to the connectors 824 and 826 (also referred to herein as connector portions) such that a portion of a bottom surface 843 of the circuit board 822 contacts a portion of a top surface (see, e.g., FIG. 51) of each of the housing portions 828 and 818.

The cap 864 includes convex corner portions 875 that substantially correspond in shape to the convex corner portions 881 of the housing portion 828 and a front or end surface 873 that is flush or aligned with the front surfaces 837 of housing portion 828. The cap 866 includes corner concave portions 879 that substantially correspond in shape to the convex corner portions 881 of the housing portion 818 and a front or end surface 869 that is flush or aligned with the front surfaces 837 of housing portion 828. Thus, the shape and contour of the end faces of the caps 864 and 866 substantially correspond to the shape and contour of the housing portions 828 and 816, respectively. Although not shown, in alternative embodiments, the caps 864 and 866 can each include mounting portions, such as mounting portions 570, 670, 770 or 771, on a top side of the caps 864, 866 that can be used to couple or interconnect the module 820 to a component or block of a different interlocking building system, such as for example, a component or block of a LEGO® block system, as described above for previous embodiments.

The caps 864 and 866 each includes tubular posts 888 with threaded interior walls that can be used to couple the caps 864 and 866 and the circuit board 822 to the housing structure 808 with fasteners (not shown in FIGS. 45-56) (such as fasteners 678) inserted through a bottom portion of the module 820. More specifically, as shown in FIGS. 52, 53, 54A and 54B, the housing 808 includes four channels 886 with threaded interior walls (not shown). The circuit board 822 defines four openings 836 and can be placed on a top surface of the housing structure 808 such that the openings 836 are aligned with the four channels 886. The caps 864 and 866 can be positioned over the circuit board 822 with the posts 888 inserted through the openings 836 of the circuit board 822 and aligned with the channels 886. Fasteners (not shown in FIGS. 45-56) such as fasteners 678 described above, can be inserted through bottom openings 887 in communication with the channels 886 and threadably secured with the threaded interior walls of the channels 886 and the posts 888. Thus, when the fasteners are secured, end portions of the circuit board 822 are sandwiched between the caps 864 and 866 and the housing portions 828 and 818.

The contact assembly 840 is coupled to or included within the connector portion 824. The contact assembly 840 includes a base 844 and multiple contacts or conductors 846 coupled to the base 844. The base 844 includes a coupling block 854 that can be received within a cavity 853 (see FIGS. 50A, 52 and 53). In this embodiment, nine contacts 846 are included, but in alternative embodiments a different number of contacts 846 can be used. The contacts 846 each includes a first engagement portion 849 and a second engagement portion 847. When coupled to the housing portion 828 of connector 824, and to circuit board 822, the first engagement portion 849 extends outwardly from an end surface of the housing structure 808, and the second engagement portion 847 is disposed within the module 820 and is in electrical engagement with contacts 848 on the bottom surface of the circuit board 822 to which the contact assembly 840 is attached.

In this embodiment, the connector portion 826 includes a receiving pocket 842 that can receive therein a portion of a contact assembly 840 of another module 820. The receiving pocket 842 can be defined collectively by the housing portion 818 and the circuit board 822 as shown, for example, in FIGS. 49B and 50B. Contacts 848 disposed on the bottom surface of the circuit board 822 are accessible within the receiving pocket 842. More specifically, when a contact assembly 840 of a first module 820 is inserted into the receiving pocket 842 of a second module 820, the first engagement portion 849 of the first module 820 can electrically engage with the contacts 848 disposed within the receiving pocket 842 of the second module 820. The contact assembly 840 can be inserted into the receiving pocket 842 in a horizontal direction or a direction slightly transverse to the horizontal direction.

FIG. 55 illustrates two modules 820, 820' just prior to being coupled together, and FIG. 56 illustrates two circuit boards 822, 822' and two contact assemblies 840, 840' of corresponding modules 820 and 820', showing the contacts 848, 848' on the circuit boards 822, 822' that engage with the first engagement portions 849, 849' and the second engagement portions 847, 847' of the contacts 846, 846' of the contact assemblies 840, 840'. More specifically, the second engagement portions 847 of contacts 846 of contact assembly 840 engage with contacts 848 on circuit board 822, and the second engagement portions 847' of contacts 846' of contact assembly 840' engage with contacts 848' on circuit board 822'. As also shown in FIG. 56, when the module 820 is coupled to the module 820', the first engagement portion 849' of contacts 846' of contact assembly 840' is moved into engagement with the contacts 848 disposed on circuit board 822, as illustrated by the arrow A.

The connectors 824 and 826 of the module 820 can be releasably coupled to another module 820 with the magnets 850. As described above, the magnets 850 are disposed within receptacles 856 defined within an interior of the respective housing portions 818 and 828, behind the front or end surfaces 880 and 862, of connectors 826 and 824, respectively. When a first module 820 is coupled to a second module 820, the front or end surfaces 880 and 862 are brought together and the magnetic force of the magnets 850 holds the first module 820 to the second module 820. Further, the insertion of the contact assembly 840 of a first module within a receiving pocket 842 of a second module can inhibit the two modules 820 from sliding laterally or side-to-side with respect to each other when removably coupled together. When the first module 820 is removably coupled to the second module 820, the front surfaces 837 of the connector 824 of the first module 820 contact and abut the front surfaces 880 of the connector 826 of the second module 820, as described above for previous embodiments. Further, when the first module 820 is removably coupled to the second module 820, the side surfaces 833 of the housing structure 808 (and of the housing portions 828 and 818) of the first module 820 are each aligned or substantially aligned with a side surfaces 816 of the housing 808 of the second module 820. As described above, the shape and contour of the connector 824 of the first module 820 complimentarily fits with the shape and contour of the connector 826 of the second module, which can further help maintain the connectors of the different modules coupled together.

Figure 58B:
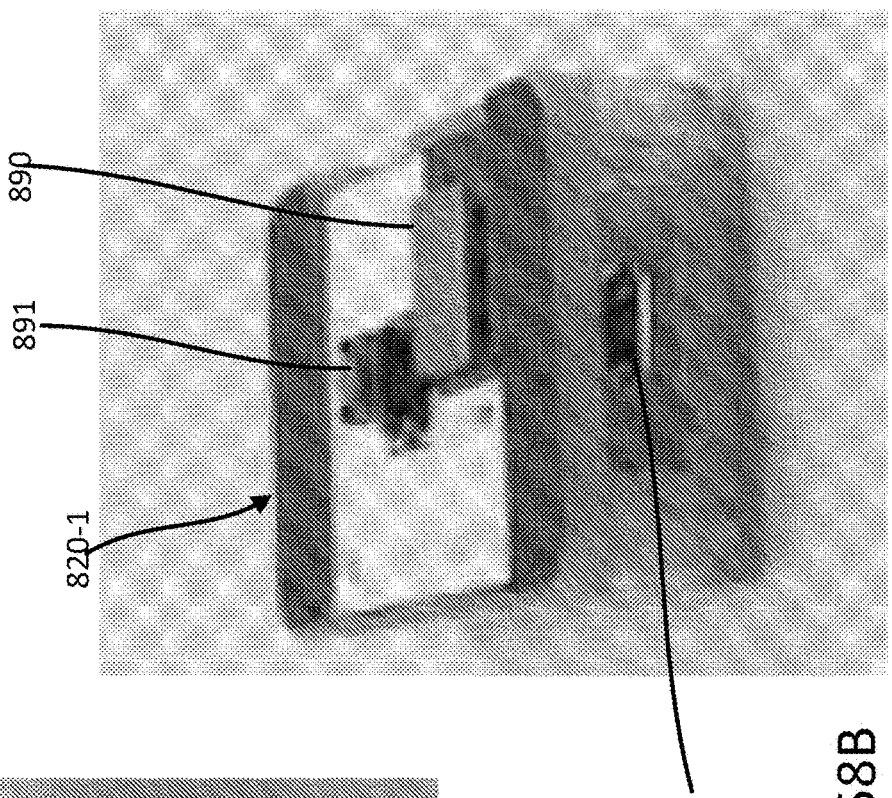
FIG. 58B is an end perspective view of the power module of FIG. 58A.
Figure 58A:
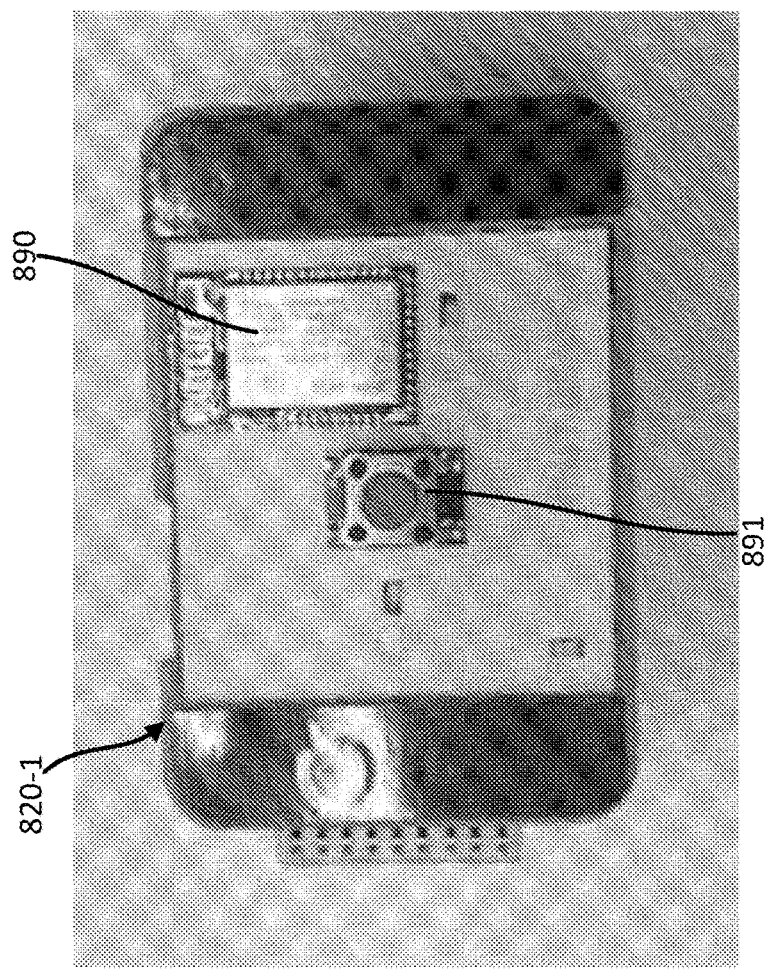
FIG. 58A is a top view of the power module of FIG. 57.

FIG. 57 illustrates a portion of the modular electronic building block system 800 including a power module 820-1, a light sensor module 820-2, a button module 820-3 and a mini-matrix module 820-4, and FIGS. 58A and 58B are a top view and an end perspective view of the power module 820-1. The power module 820-1 includes a Bluetooth component 890, an on/off button 891 and a USB port 895 (shown in FIG. 58B). The light sensor module 820-2 includes a light sensor 892, the button module 820-3 includes a button 893 and the mini-matrix module 820-4 includes mini light components 894 (e.g., LEDs).

Although embodiments of modules 520, 620, 720, and 820 are shown and described as having a connector (e.g., connectors 524 and 526) disposed at one end or two opposite ends of a circuit board (e.g., circuit boards 522) and housing structure (e.g., housing structure 508), in other embodiments, a module can include connectors disposed at more than two ends of the module or less than two ends of the module. For example, in some embodiments, a module can include a single connector disposed on one end portion of the housing structure. In some embodiments, a module can include two connectors disposed along a single end or side portion of the housing structure. In some embodiments, a module can include, for example, three or four connectors each disposed at three or four different edges or end portions of the housing structure.

In some embodiments, the modules described herein can include contact assemblies (e.g., 540, 560, 640, 740) disposed at opposite end portions of the module that have the same structure or the contact assemblies can have different structures. For example, in some embodiments, a system can include modules that each include a first contact assembly disposed at a first end portion of the module that has a different structure than a second contact assembly disposed at a second end portion of the module. In such an embodiment, the first contact assembly may be configured to electrically couple only to a second contact assembly of another module of the system. In some embodiments, a system can include modules with contact assemblies on each end portion of the modules that have the same structure and can electrically couple to any contact assembly of any module of the system. In some embodiments, a module as described herein can include a contact assembly disposed on only one end (e.g., 840) or side portion of the module. For example, a module can include a connector portion on opposite end portions of the module to allow the module to connect to another module, but with only one of the connector portions having a contact assembly. The opposite end portion of the module can include contacts that can electrically engage the contacts from the contact assembly of another module.

As described above, any module, such as the modules 520, 620, 720 and 820, can have a floor component (e.g., 515, 615, 715, 815) that can be transparent and/or include openings to provide viewing into the interior region of the module. In some embodiments, the modules 520, 620, 720, 820 can be constructed without a floor component or with a partial floor component.

Although not shown, for any of the electronic building block systems described herein an adapter(s) or foot member can be included to adjust the height of a connector (e.g., 124, 126, 224, 226, etc.). For example, an adapter can be coupled to a bottom portion of a connector to increase a length or height of the connector. Such adapters can be, for example, adhesively coupled to a bottom portion of the connector. In some embodiments, the adapter can include a mounting member or portion similar to the mounting portions (e.g., 130, 230, etc.) described above, such that the adapter can engage complementarily shaped components of a different building block system such as a LEGO R block.

As described herein, modules of an electronic building block system are adapted to have a variety of different types of functionality and to include the appropriate connectors, circuit boards, and associated electrical components coupled to the circuit boards to perform the desired functionality. The modules shown in the illustrated embodiments are for exemplary and demonstrative purposes, and are not intended to be limiting.

It should be understood that the structures, features, functionality, and other characteristics of the various example embodiments of the systems disclosed herein and illustrated in FIGS. 1A-56 may be combined with each other in any manner and in any combination or sub-combination and all such manners and combinations are intended to be within the spirit and scope of the present invention.

As described above in the many examples of modules and systems, numerous modules may be coupled together to achieve various functionalities of the systems. Modules may be coupled in a cascading manner in which the inclusion of one module in the system may affect the functionality of downstream modules in a first manner and inclusion of a different module in the system may affect the function of downstream modules in another manner different than the first manner. That is, modules coupled together in a system may have dependencies upon one another to affect functionality thereof and of the entire system. A simple example to demonstrate this concept, but is not intended to be limiting, includes a system having three modules, for example, a power module, a button module, and an LED module. The button module and the LED module are dependent on the power module, and the LED module is dependent on the button module. To demonstrate the dependency of the button module and the LED module on the power module, if the power module is not providing any power, then neither the button module nor the LED module can operate in their intended manner. Similarly, to demonstrate the dependency of the LED module on the button module, if the button is not depressed or otherwise activated to close the circuit, the LED module will not be illuminated, and if the button is depressed, the LED module will be illuminated. In other words, cascading modules in a system affect operation and functionality of downstream modules. In some embodiments, if the button is not disposed between the LED and power module, the LED will illuminate and the button will have no function.

The foregoing description has been presented for purposes of illustration and description, and is not intended to be exhaustive or to limit the invention to the precise form disclosed. The descriptions were selected to explain the principles of the invention and their practical application to enable others skilled in the art to utilize the invention in various embodiments and various modifications as are suited to the particular use contemplated.

While various embodiments have been described above, it should be understood that they have been presented by way of example only, and not limitation. Where schematics and/or embodiments described above indicate certain components arranged in certain orientations or positions, the arrangement of components may be modified. While the embodiments have been particularly shown and described, it will be understood that various changes in form and details may be made. Any portion of the apparatus and/or methods described herein may be combined in any combination, except mutually exclusive combinations. The embodiments described herein can include various combinations and/or sub-combinations of the functions, components, and/or features of the different embodiments described.

Where methods described above indicate certain events occurring in certain order, the ordering of certain events may be modified. Additionally, certain of the events may be performed concurrently in a parallel process when possible, as well as performed sequentially as described above.

In addition to the previously described exemplary connectors, many modifications to the connectors are possible, including, but not limited to, the housing of a connector, the type of conductors or contacts used, the number of conductors or contacts, as well as the number of magnets, the shape of the magnets, the polarity of the magnets, the manner in which the connectors are couple to the circuit board of the module, etc.

For example, in alternative embodiments, the protrusions (e.g., 232, 332) and recesses (e.g., 234, 334) can complimentarily fit such that the protrusions and recesses are interlocked such as with a dove-tail shape or configuration, or other interlocking shape and configuration. In such embodiments, the protrusions can be slidably received within the recesses in a vertical direction and interlock such that the coupling of the protrusions and recesses can removably couple a first module to a second module. The dovetail configuration would prevent movement between the two modules in a horizontal direction. To uncouple the first module from the second module, the module with the dovetail protrusions could be uncoupled from the module with the dovetail recesses by sliding the module with the protrusions vertically out of the recesses. Thus, in such an embodiment, magnets (e.g., magnets 250) may not be included and used to couple a first module to a second module. In some embodiments, the modules may not include a protrusion(s) and mating recess(es) and instead rely solely on the magnets (e.g., 150, 250) to maintain the position of a first module relative to a second module when coupled together with the magnets.

In another example, in an alternative embodiment, the housings (e.g., 228) for both connectors (e.g., 224, 226) can be monolithically or integrally formed and the circuit board (e.g., 222) can be encased within the housing. Alternatively, in some embodiments, the housings (e.g., 228) for both connectors (e.g., 224, 226) can be monolithically or integrally formed and the circuit board (e.g., 222) can be coupled to the housing. For example, the circuit board can be coupled to a top portion or a bottom portion of the integrally formed housing. In some embodiments, the housings (e.g., 228) for both connectors (e.g., 224, 226) can be monolithically or integrally formed and can define a slot or pocket in which the circuit board (e.g., 222) can be disposed.

Although in some embodiments, the mounting portions (e.g., 130, 230, 330) were shown and described as being disposed on a bottom side of the connectors (e.g., 124, 126, 224, 226, 324, 326), in alternative embodiments, the mounting portions can be disposed on a top side of the connectors or a top side of the circuit board of a module. If the mounting portions are disposed on a top side of the connectors, the circuit board could be coupled to a bottom side of the connectors. In some embodiments, adapters (e.g., adapters 364 and 366) can be disposed on a bottom portion of the connectors and the mounting portions (e.g., 330) can be disposed on a top portion of the connectors, such as shown and described for modules 520, 620, and 720. In some embodiments, a module can have an adapter (e.g., adapter 364, 366) disposed on one or both side surfaces (i.e., a surface orthogonal to a top and bottom surface, and orthogonal to an end surface) of the circuit board to allow for coupling a component of a different interlocking building block system to the side of the module.

In some embodiments, the mounting portions (e.g., 130, 230, 330, 530, 630, 730, 830) can include a post or a partial post (e.g., half-post or quarter-post) that can be received within an opening or space of a component or block of a different interlocking building block system. In some embodiments, the mounting portions can be configured to be coupled to a mounting component, such as a mounting board or other intermediary component that can then be coupled to a component or block of a different interlocking building block system. In some embodiment, the adapters (e.g., 164, 166, 364, 366, 564, 566, 664, 666, 764, 766) or caps 864, 866 can be configured to be coupled to a mounting component that can then be coupled to a component or block of a different interlocking building block system.

What is claimed is:

1. An apparatus, comprising:
a first connector portion comprising a first housing portion having a top surface and a bottom surface opposite the top surface of the first connector portion, the first connector portion further comprising at least a front surface and a first mounting portion extending from a top portion of the first connector portion and at least a second mounting portion extending from a bottom portion of the first connector portion;
a second connector portion comprising a second housing portion having a top surface and a bottom surface opposite the top surface of the second connector portion, the second connector portion further comprising at least a front surface and a third mounting portion extending from a top portion surface of the second housing portion and at least a fourth mounting portion extending from a bottom portion of the second housing portion;

a circuit board permanently coupled to the first housing portion of the first connector portion and permanently coupled to the second housing portion of the second connector portion;

a first contact assembly coupled to the first housing portion of the first connector portion, the first contact assembly including a plurality of protrusions; and a second contact assembly coupled to the second housing portion of the second connector portion, the second contact assembly defining a plurality of recesses, each protrusion from the plurality of protrusions of the first contact assembly configured to be slidably received within a different recess from a plurality of recesses of a third contact assembly coupled to a third connector portion of a second apparatus distinct from the apparatus when the first connector portion is removably coupled to the third connector portion, each recess from the plurality of recesses of the second contact assembly configured to slidably receive a different protrusion from a plurality of protrusions of a fourth contact assembly coupled to a fourth connector portion of a third apparatus distinct from the apparatus and distinct from the second apparatus when the second connector portion is removably coupled to the fourth connector portion.

2. The apparatus of claim 1, wherein:

each protrusion from the plurality of protrusions of the first contact assembly is configured to be slidably received in a vertical direction within a different recess from the plurality of recesses of the third contact assembly coupled to a third connector portion when the first connector portion is removably coupled to the third connector portion, each recess from the plurality of recesses of the second contact assembly configured to slidably receive in a vertical direction a different protrusion from the plurality of protrusions of the fourth contact assembly coupled to the fourth connector portion when the second connector portion is removably coupled to the fourth connector portion.

3. The apparatus of claim 1, wherein:

the circuit board is a first circuit board, the first housing portion of the first connector portion and the first contact assembly collectively define a first guide and a second guide, the first guide and the second guide each configured to guide the position of a first portion and a second portion, respectively, associated with the third connector portion and a second circuit board coupled to the third connector portion when the first connector is slidably coupled in a vertical direction to the third connector portion, the second housing portion of the second connector portion and the first circuit board collectively define a first portion and a second portion, the first portion and the second portion of the first circuit board and the second housing portion of the second connector portion configured to engage in a vertical direction a third guide and a fourth guide, respectively, defined collectively by the fourth connector portion and the fourth contact assembly when the second connector portion is removably and slidably coupled in a vertical direction to the fourth connector portion.

4. The apparatus of claim 1, wherein the first housing portion of the first connector portion defines a receptacle between the top surface of the first housing portion and the bottom surface of the first housing portion, the receptacle having a first end open at the top surface of the first housing portion of the first connector portion and a second end opposite the first end of the receptacle, the second end of the receptacle being closed, the apparatus further comprising:

a magnet disposed within the receptacle, the circuit board being coupled to the portion such that the circuit board covers the first end of the receptacle preventing the magnet from being removed from the receptacle, when the first connector portion is coupled to the third connector portion, at least a portion of the front surface of the first connector portion engages at least a portion of a front surface of the third connector portion and the magnet disposed within the receptacle magnetically couples to a magnet of the third connector portion.

5. The apparatus of claim 4, wherein the receptacle is a first receptacle and the magnet is a first magnet, the second housing portion of the second connector portion defines a second receptacle between the top surface of the second housing portion and the bottom surface of the second housing portion, the second receptacle having a first end open at the top surface of the second housing portion of the second connector portion and a second end opposite the first end of the second receptacle, the second end of the second receptacle being closed, the apparatus further comprising:

a second magnet disposed within the second receptacle, the circuit board being coupled to the second connector portion such that the circuit board covers the first end of the second receptacle preventing the magnet from being removed from the second receptacle, when the second connector portion is coupled to the fourth connector portion, at least a portion of the front surface of the second connector portion engages at least a portion of a front surface of the fourth connector portion and the second magnet disposed within the second receptacle magnetically couples to a magnet of the fourth connector portion.

6. The apparatus of claim 1, wherein:

at least one contact of the first contact assembly is configured to slidably engage in a vertical direction at least one contact of the third contact assembly coupled to the third connector portion when the first connector portion is removably coupled to the third connector portion, at least one contact of the second contact assembly is configured to slidably engage in a vertical direction at least one contact of the fourth contact assembly coupled to the fourth connector portion when the second connector portion is removably coupled to the fourth connector portion.

7. The apparatus of claim 1, wherein:

the first contact assembly includes at least one contact that extends outwardly from a front surface of the first housing portion of the first connector portion, the second contact assembly includes at least one contact that extends outwardly from a front surface of the second housing portion of the second connector portion.

8. The apparatus of claim 1, further comprising:

a first adapter coupled to the circuit board and disposed above the first connector portion; and a second adapter coupled to the circuit board and disposed above the second connector portion, the first adapter configured to couple the module to a component of a different building block system, the second adapter configured to couple the module to a component of a different building block system.

9. The apparatus of claim 1, wherein the first housing portion is a separate component from the second housing portion and is spaced at a non-zero distance from the second housing portion when coupled to the circuit board.

10. The apparatus of claim 1, further comprising:
a housing, the housing including the first housing portion and the second housing portion and a base portion disposed between the first housing portion and the second housing portion.

11. An apparatus, comprising:
a first connector portion comprising a first housing portion having a top surface, a bottom surface opposite the top surface, and a front surface facing in a direction substantially traverse to the bottom surface and the top surface of the first housing portion, the first connector portion further comprising at least a front surface and a first mounting portion extending from a top portion of the first connector portion and at least a second mounting portion extending from a bottom portion of the first connector portion;
a second connector portion comprising a second housing portion having a top surface, a bottom surface opposite the top surface, and a front surface facing in a direction substantially traverse to the bottom surface and the top surface of the second housing portion, the second connector portion further comprising at least a front surface and a third mounting portion extending from a top portion surface of the second housing portion and at least a fourth mounting portion extending from a bottom portion of the second housing portion;
a contact assembly coupled to the first housing portion of the first connector portion and having at least one contact;
the second connector portion including a pocket configured to receive a contact assembly of a third connector portion of a second apparatus distinct from the apparatus; and
a circuit board having a top surface and a bottom surface opposite the top surface of the circuit board, the circuit board permanently coupled to the first connector portion such that at least a portion of the contact assembly electrically engages a portion of the circuit board, the circuit board permanently coupled to the second connector.

12. The apparatus of claim 11, wherein the circuit board is permanently coupled to the first connector portion and to the second connector portion such that a first portion of the bottom surface of the circuit board contacts at least a portion of the of the top surface of the first housing portion of the first connector portion and a second portion of the bottom surface of the circuit board contacts at least a portion of the of the top surface of the second housing portion of the second connector portion.

13. The apparatus of claim 11, wherein the first connector portion is configured to couple to a fourth connector portion of a third apparatus distinct from the apparatus and distinct from the second apparatus such that a portion of the front surface of the housing portion of the first connector portion engages a portion of a front surface of a housing portion of the fourth connector portion and at least a portion of the contact assembly of the first connector portion is received within a receiving pocket of the fourth connector portion and electrically engages a circuit board of the third apparatus.

14. The apparatus of claim 11, wherein the first housing portion of the first connector portion defines a receptacle between the top surface of the first housing portion and the bottom surface of the first housing portion, the receptacle having a first end open at the top surface of the first housing portion of the first connector portion and a second end opposite the first end of the receptacle, the second end of the receptacle being closed, the apparatus further comprising:
a magnet disposed within the receptacle, the circuit board being coupled to the first connector portion such that the circuit board covers the first end of the receptacle preventing the magnet from being removed from the receptacle, the first connector portion configured to couple to a fourth connector portion of a third apparatus distinct from the apparatus and distinct from the second apparatus such that the magnet disposed within the receptacle magnetically couples to a magnet of the fourth connector portion.

15. The apparatus of claim 14, wherein the receptacle is a first receptacle and the magnet is a first magnet, the second housing portion of the second connector portion defines a second receptacle between the top surface of the second housing portion and the bottom surface of the second housing portion, the second receptacle having a first end open at the top surface of the second housing portion of the second connector portion and a second end opposite the first end of the second receptacle, the second end of the second receptacle being closed, the apparatus further comprising:
a second magnet disposed within the second receptacle, the circuit board being coupled to the second connector portion such that the circuit board covers the first end of the second receptacle preventing the magnet from being removed from the second receptacle, when the second connector portion is coupled to the third connector portion of the second apparatus, at least a portion of the front surface of the second connector portion engages at least a portion of a front surface of the third connector portion and the second magnet disposed within the second receptacle magnetically couples to a magnet of the third connector portion.

16. The apparatus of claim 11, wherein the at least one contact of the contact assembly includes a portion that extends outwardly from the front surface of the housing portion of connector portion.

17. The apparatus of claim 11, wherein the at least one contact of the contact assembly includes a first portion and a second portion, the first portion configured to engage a contact disposed on a circuit board of a third apparatus distinct from the apparatus and distinct from the second apparatus, the second portion configured to engage a contact disposed on the first circuit board.

18. The apparatus of claim 11, wherein the circuit board includes contacts disposed on a bottom surface of the circuit board and accessible within the receiving pocket such that when the contact assembly of the second apparatus is received within the receiving pocket, the contact assembly of the second apparatus electrically engages the contacts disposed on the bottom surface of the circuit board.

* * * * *